United States Patent
Yamazaki

(10) Patent No.: US 10,243,064 B2
(45) Date of Patent: Mar. 26, 2019

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/856,829

(22) Filed: Sep. 17, 2015

(65) Prior Publication Data

US 2016/0013298 A1 Jan. 14, 2016

Related U.S. Application Data

(63) Continuation of application No. 13/746,800, filed on Jan. 22, 2013, now Pat. No. 9,171,957.

(30) Foreign Application Priority Data

Jan. 26, 2012 (JP) ................................ 2012-014594
Jan. 26, 2012 (JP) ................................ 2012-014609

(51) Int. Cl.
*H01L 29/786* (2006.01)
*H01L 21/02* (2006.01)
(Continued)

(52) U.S. Cl.
CPC .. *H01L 29/66969* (2013.01); *H01L 21/02565* (2013.01); *H01L 21/477* (2013.01);
(Continued)

(58) Field of Classification Search
CPC ........... H01L 29/66969; H01L 29/7869; H01L 29/78693; H01L 29/78696; H01L 21/02565
See application file for complete search history.

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Joseph Galvin, III
(74) *Attorney, Agent, or Firm* — Robinson Intellectual Property Law Office; Eric J. Robinson

(57) ABSTRACT

To provide a highly reliable semiconductor device by giving stable electrical characteristics to a transistor including an oxide semiconductor film. A gate electrode layer is formed over a substrate, a gate insulating film is formed over the gate electrode layer, an oxide semiconductor film is formed over the gate insulating film, a conductive film is formed over the oxide semiconductor film, so that a region in vicinity of an interface with the oxide semiconductor film in contact with the conductive film is made amorphous, heat treatment is performed, the conductive film is then processed to form a source electrode layer and a drain electrode layer, and a part of the amorphous region in the oxide semiconductor film which is exposed by formation of the source electrode layer and the drain electrode layer is removed.

25 Claims, 22 Drawing Sheets

(51) Int. Cl.
  *H01L 29/66* (2006.01)
  *H01L 29/04* (2006.01)
  *H01L 27/146* (2006.01)
  *H01L 21/4763* (2006.01)
  *H01L 21/477* (2006.01)
  *H01L 29/24* (2006.01)

(52) U.S. Cl.
  CPC .. *H01L 21/47635* (2013.01); *H01L 27/14632* (2013.01); *H01L 27/14687* (2013.01); *H01L 29/04* (2013.01); *H01L 29/24* (2013.01); *H01L 29/7869* (2013.01); *H01L 29/78696* (2013.01)

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,910,490 B2 | 3/2011 | Akimoto et al. |
| 7,932,521 B2 | 4/2011 | Akimoto et al. |
| 8,003,981 B2 | 8/2011 | Iwasaki et al. |
| 8,237,166 B2 | 8/2012 | Kumomi et al. |
| 8,274,077 B2 | 9/2012 | Akimoto et al. |
| 8,319,218 B2 | 11/2012 | Yamazaki et al. |
| 8,338,827 B2 | 12/2012 | Yamazaki et al. |
| 8,440,510 B2 | 5/2013 | Yamazaki |
| 8,461,594 B2 | 6/2013 | Morosawa et al. |
| 8,624,237 B2 | 1/2014 | Yamazaki et al. |
| 8,629,438 B2 | 1/2014 | Yamazaki |
| 8,742,418 B2 | 6/2014 | Morosawa et al. |
| 8,748,879 B2 | 6/2014 | Yano et al. |
| 8,748,881 B2 | 6/2014 | Yamazaki |
| 8,779,420 B2 | 7/2014 | Yamazaki |
| 9,142,648 B2 | 9/2015 | Yamazaki |
| 9,214,520 B2 | 12/2015 | Yamazaki |
| 9,306,072 B2 | 4/2016 | Yamazaki et al. |
| 9,496,406 B2 | 11/2016 | Yamazaki et al. |
| 9,601,602 B2 | 3/2017 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0278490 A1 | 12/2007 | Hirao et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2009/0305461 A1 | 12/2009 | Akimoto et al. |
| 2010/0051949 A1* | 3/2010 | Yamazaki ........... H01L 29/4908 257/57 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0301329 A1* | 12/2010 | Asano ............... H01L 29/78696 257/43 |
| 2011/0053322 A1* | 3/2011 | Sasaki ................ H01L 29/7869 438/149 |
| 2011/0095288 A1 | 4/2011 | Morosawa et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0127521 A1 | 6/2011 | Yamazaki |
| 2011/0127523 A1* | 6/2011 | Yamazaki ......... H01L 21/02554 257/43 |
| 2011/0136301 A1 | 6/2011 | Yamazaki et al. |

(56) References Cited

U.S. PATENT DOCUMENTS

| | | |
|---|---|---|
| 2011/0163311 A1 | 7/2011 | Akimoto et al. |
| 2011/0182110 A1 | 7/2011 | Yamazaki et al. |
| 2011/0256684 A1 | 10/2011 | Iwasaki et al. |
| 2012/0161122 A1 | 6/2012 | Yamazaki |
| 2012/0175610 A1 | 7/2012 | Yamazaki |
| 2012/0187395 A1 | 7/2012 | Koezuka |
| 2012/0235137 A1 | 9/2012 | Koezuka et al. |
| 2012/0241737 A1 | 9/2012 | Imoto et al. |
| 2012/0241738 A1 | 9/2012 | Imoto et al. |
| 2013/0009209 A1 | 1/2013 | Yamazaki |
| 2013/0009219 A1 | 1/2013 | Yamazaki et al. |
| 2013/0009220 A1 | 1/2013 | Yamazaki et al. |
| 2013/0099233 A1* | 4/2013 | Tochibayashi .... H01L 21/02071 257/43 |
| 2013/0161608 A1 | 6/2013 | Yamazaki |
| 2013/0193431 A1 | 8/2013 | Yamazaki |
| 2013/0222955 A1 | 8/2013 | Yamazaki et al. |
| 2016/0163871 A1 | 6/2016 | Yamazaki |
| 2016/0380111 A1 | 12/2016 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-096055 A | 4/2007 |
| JP | 2007-123861 A | 5/2007 |
| JP | 2007-250983 A | 9/2007 |
| JP | 2010-040552 A | 2/2010 |
| JP | 2010-056542 A | 3/2010 |
| JP | 2010-073881 A | 4/2010 |
| JP | 2010-114413 A | 5/2010 |
| JP | 2011-100979 A | 5/2011 |
| JP | 2011-135063 A | 7/2011 |
| JP | 2011-135066 A | 7/2011 |
| JP | 2011-243745 A | 12/2011 |
| JP | 2011-258939 A | 12/2011 |
| JP | 2012-009843 A | 1/2012 |
| WO | WO-2004/114391 | 12/2004 |
| WO | WO-2008/136505 | 11/2008 |
| WO | WO-2009/034953 | 3/2009 |
| WO | WO-2011/043176 | 4/2011 |
| WO | WO-2011/065243 | 6/2011 |
| WO | WO-2011/142467 | 11/2011 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08: SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09: SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)$ 5 films", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08: SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Matter. (Advanced Materials), 2006, vol. 18, No. 3, pp. 339-342.

Tsuda.K et al., "Ultra Low Power Consumption Technologies for Mobile TFT-LCDs", IDW '02: Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID

(56) References Cited

OTHER PUBLICATIONS

Digest '08: SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-plane", SID Digest '09: SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09: SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09: SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTS", IDW '09: Proceedings of the 16th International Display Workshops, 2009, pp. 689-692.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09: SID International Symposium Digest of Technical Papers, May 31, 2009, pp. 1110-1112.

Ohara.H et al., "21.3:4.0 In. QVGA AMOLED Display Using In—Ga—Zn-Oxide TFTS With a Novel Passivation Layer", SID Digest '09: SID International Symposium Digest of Technical Papers, May 31, 2009, pp. 284-287.

Miyasaka.M, "SUFTLA Flexible Microelectronics on Their Way to Business", SID Digest '07: SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.

Lee.H et al., "Current Status of, Challenges to, and Perspective View of AM-OLED", IDW '06: Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3—A2O3—BO Systems [A; Fe, Ga, Or Al; B: Mg, Mn, Fe, Ni, Cu, or Zn] at Temperatures over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Janotti.A et al., "OxygenVacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08: Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

(56) References Cited

OTHER PUBLICATIONS

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Ono.M et al., "Novel High Performance IGZO-TFT with High Mobility over 40 cm2/Vs and High Photostability Incorporated Oxygen Diffusion", IDW '11: Proceedings of the 18th International Display Workshops, Dec. 7, 2011, pp. 1689-1690.

\* cited by examiner

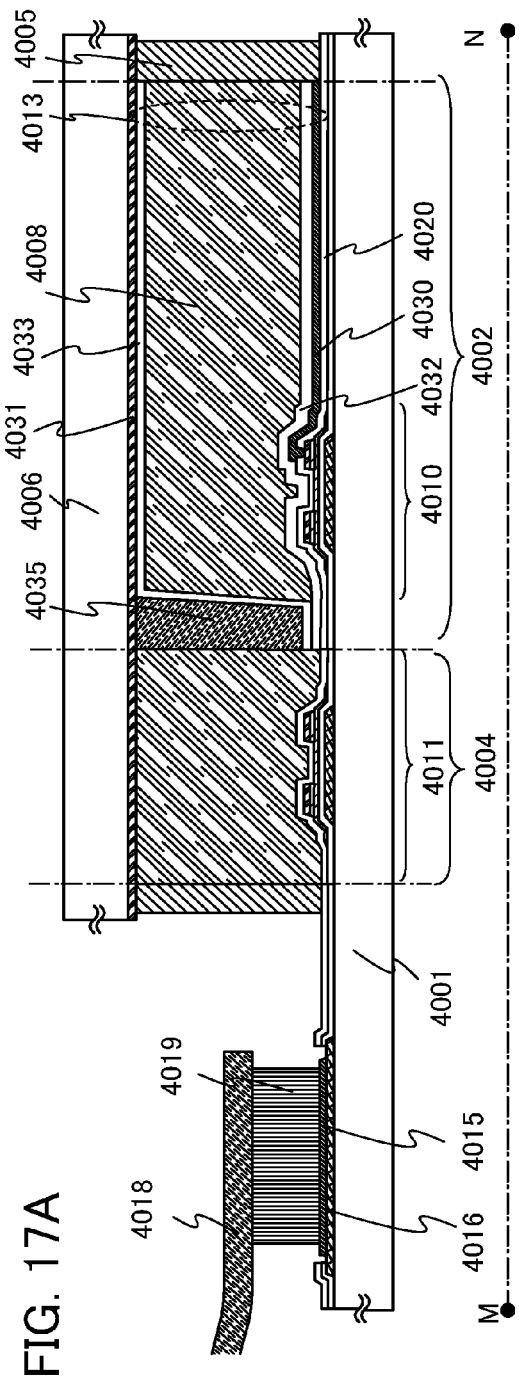
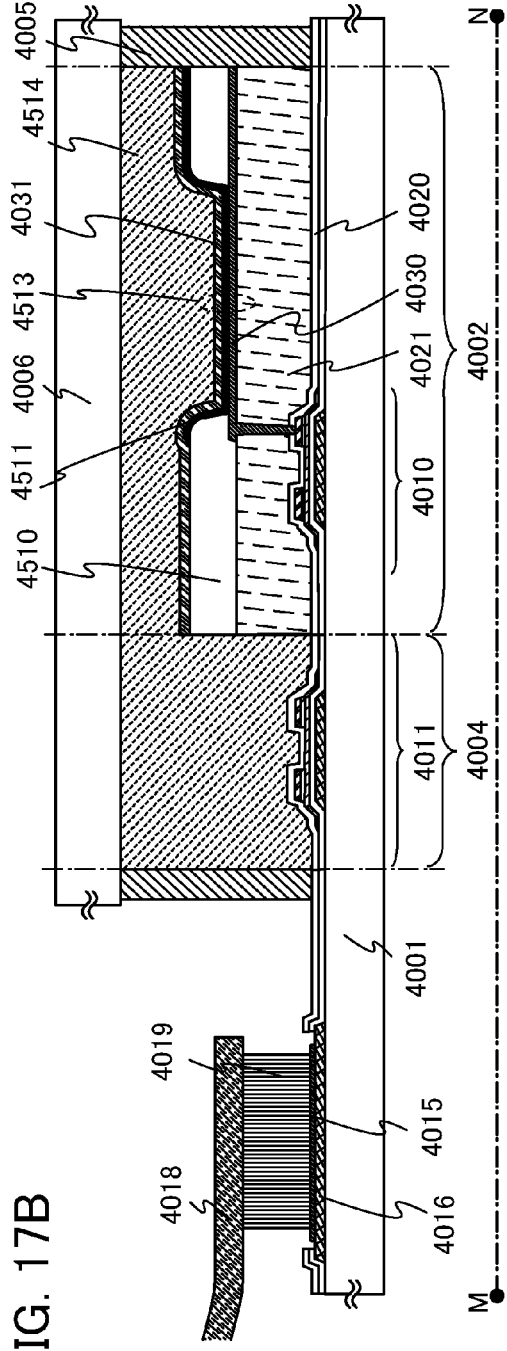
FIG. 17A
FIG. 17B

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the semiconductor device.

In this specification, a "semiconductor device" refers to a device that can function by utilizing semiconductor characteristics; a transistor, an electro-optical device, a semiconductor circuit, and an electronic device are all included in the category of the semiconductor device.

2. Description of the Related Art

In recent years, a technique by which a transistor is formed using a thin semiconductor film formed over a substrate having an insulating surface has been attracting attention. The transistor is applied to a wide range of electronic devices such as integrated circuits (ICs) or image display devices (display devices). A silicon-based semiconductor material is widely known as a material for a thin semiconductor film applicable to a transistor. As another material, an oxide semiconductor has been attracting attention.

For example, a transistor including an amorphous oxide semiconductor film containing indium (In), gallium (Ga), and zinc (Zn) as an active layer of a transistor is disclosed (see Patent Document 1).

Further, a transistor including an oxide semiconductor film in which a portion being in contact with a gate insulating film is in an amorphous state and a portion being in contact with a source electrode or a drain electrode is in a crystal state is disclosed (see Patent Documents 2 and 3).

Furthermore, a transistor including a stack of oxide semiconductor films with different compositions which are used for a channel formation region in order to improve field-effect mobility and decrease off-state current is disclosed (see Non-patent Document 1).

PATENT DOCUMENTS

[Patent Document 1] Japanese Published Patent Application No. 2006-165528
[Patent Document 2] Japanese Published Patent Application No. 2011-135066
[Patent Document 3] International Publication WO 2009/034953 Pamphlet

NON-PATENT DOCUMENT

[Non-Patent Document 1]

Masashi Ono et al., "Novel High Performance IGZO-TFT with High Mobility over 40 $cm^2/Vs$ and High Photostability Incorporated Oxygen Diffusion", IDW'11 Late-News Paper, pp. 1689-1690

SUMMARY OF THE INVENTION

In an oxide semiconductor, oxygen vacancies and hydrogen partly serve as a donor to generate electrons that are carriers. When the carrier density in an oxide semiconductor film becomes high, a channel is formed in a transistor without voltage application to a gate, leading to a shift of threshold voltage in the negative direction.

Further, in forming an oxide semiconductor film, impurities such as water and hydrogen are easily mixed into a top surface and a side edge portion of the oxide semiconductor film, and oxygen is easily released from the top surface and the side edge portion of the oxide semiconductor film. For example, in the case where oxygen vacancies and hydrogen are included in a side edge portion of an oxide semiconductor film in a region overlapping with a gate electrode layer, carriers are stored in such the side edge portion of the oxide semiconductor film. Thus, a parasitic channel is formed, leading to a shift of threshold voltage in the negative direction.

In view of any of the above-described problems, an object is to provide a highly reliable semiconductor device by giving stable electrical characteristics to a transistor including an oxide semiconductor film.

In order to achieve the object, in accordance with one embodiment of the present invention, parts of a top surface and a side edge portion of an oxide semiconductor film in which carriers are stored are removed. This makes it possible to prevent formation of a parasitic channel and to inhibit generation of leakage current and variation in threshold voltage.

Further, a stack of oxide semiconductor films is used, and an oxide semiconductor film on the back channel side in the stack contains many stabilizers of gallium (Ga) or the like. In the oxide semiconductor film containing many stabilizers of Ga or the like, energy for forming oxygen vacancies is high and thus oxygen vacancies are not easily generated. Therefore, a transistor including the oxide semiconductor film has few carriers derived from oxygen vacancies, and accordingly, a transistor with small off-state current can be manufactured. Further, a highly reliable transistor with less variation in electrical characteristics can be manufactured.

In one embodiment of the present invention, a region of an oxide semiconductor film on the channel side contains much indium (In). In an oxide semiconductor, the s orbitals of heavy metal mainly contribute to carrier transfer, and when the percentage of In content in the oxide semiconductor is increased, overlaps of the s orbitals are likely to be increased. Therefore, high carrier mobility can be provided. Thus, field-effect mobility of a transistor including the oxide semiconductor film can be improved.

As described above, an oxide semiconductor containing many stabilizers of Ga or the like is provided on the back channel side, and an oxide semiconductor containing much In is provided on the channel side. Thus, the field-effect mobility of a highly reliable transistor with small off-state current can be further improved.

One embodiment of the present invention is a semiconductor device including a gate electrode layer over a substrate, a gate insulating film over the gate electrode layer, an oxide semiconductor film over the gate insulating film, and a source electrode layer and a drain electrode layer over the oxide semiconductor film. In the semiconductor device, the oxide semiconductor film is non-single-crystal and includes a crystal part and an amorphous part, and in the oxide semiconductor film, a proportion of the crystal part to the amorphous part in a first region in vicinity of an interface with the source electrode layer and the drain electrode layer is lower than a proportion of the crystal part to the amorphous part in a second region that is a remaining region of the oxide semiconductor film except the first region.

Another embodiment of the present invention is a semiconductor device including a gate electrode layer over a substrate, a gate insulating film over the gate electrode layer, an oxide semiconductor film over the gate insulating film, and a source electrode layer and a drain electrode layer over the oxide semiconductor film. In the semiconductor device, the oxide semiconductor film is non-single-crystal and includes a crystal part and an amorphous part, and, in the oxide semiconductor film, a first region in vicinity of an interface with the source electrode layer and the drain electrode layer is a region in which a proportion of an amorphous part to a crystal part is higher than a proportion of an amorphous part to a crystal part in a second region that is a remaining region of the oxide semiconductor film except the first region, or a region entirely occupied by an amorphous part.

Further, hydrogen concentration of the first region that is measured by secondary ion mass spectrometry is preferably greater than or equal to $5 \times 10^{18}/cm^3$, and hydrogen concentration of the second region that is measured by secondary ion mass spectrometry is preferably less than $5 \times 10^{18}/cm^3$.

Further, in the oxide semiconductor film, a region overlapping with the source electrode layer or the drain electrode layer can have a larger thickness than a region overlapping with neither the source electrode layer nor the drain electrode layer.

Further, the oxide semiconductor film can be an oxide semiconductor film including the crystal part in which a c-axis is aligned in a direction parallel to a normal vector of a surface where the oxide semiconductor film is formed or a normal vector of a surface of the oxide semiconductor film.

Further, the oxide semiconductor film can contain at least indium.

Further, the semiconductor device of any of the above structures can include, over the oxide semiconductor film, the source electrode layer, and the drain electrode layer, an oxide insulating film having an oxygen-excess region, and an aluminum oxide film over the oxide insulating film.

Another embodiment of the present invention is a method for manufacturing a semiconductor device including the steps of forming a gate electrode layer over a substrate, forming a gate insulating film over the gate electrode layer, forming an oxide semiconductor film over the gate insulating film, forming a conductive film over the oxide semiconductor film, so that a region in the oxide semiconductor film in vicinity of an interface with the conductive film is made amorphous, performing heat treatment, then processing the conductive film to form a source electrode layer and a drain electrode layer, and removing a part of the amorphous region in the oxide semiconductor film which is exposed by formation of the source electrode layer and the drain electrode layer.

Another embodiment of the present invention is a method for manufacturing a semiconductor device including the steps of forming a gate electrode layer over an insulating surface, forming a gate insulating film over the gate electrode layer, forming an oxide semiconductor film over the gate insulating film, performing plasma treatment on the oxide semiconductor film, so that a surface of the oxide semiconductor film is made amorphous, forming a conductive film over the oxide semiconductor film which is partly amorphous, performing heat treatment, then processing the conductive film to form a source electrode layer and a drain electrode layer which are in contact with the conductive film, and removing a part of the amorphous region in the oxide semiconductor film which is exposed by formation of the source electrode layer and the drain electrode layer.

Further, the oxide semiconductor film can be an oxide semiconductor film including a crystal part and an amorphous part, and, in the crystal part, a c-axis is aligned in a direction parallel to a normal vector of a surface where the oxide semiconductor film is formed or a normal vector of a surface of the oxide semiconductor film.

Further, the part of the amorphous region in the oxide semiconductor film can be removed by wet etching.

Another embodiment of the present invention is a method for manufacturing a semiconductor device including the steps of forming a gate electrode layer over an insulating surface, forming a gate insulating film over the gate electrode layer, stacking a CAAC-OS film and an amorphous oxide semiconductor film over the gate insulating film, forming a conductive film over the amorphous oxide semiconductor film, processing the conductive film to form a source electrode layer and a drain electrode layer, and, after performing heat treatment, removing a part of the amorphous oxide semiconductor film which is exposed by formation of the source electrode layer and the drain electrode layer.

Further, the part of the amorphous oxide semiconductor film can be removed by wet etching.

Another embodiment of the present invention is a semiconductor device including a gate electrode layer over a substrate, a gate insulating film over the gate electrode layer, an oxide semiconductor film over the gate insulating film, and a source electrode layer and a drain electrode layer over the oxide semiconductor film. In the semiconductor device, the oxide semiconductor film is non-single-crystal and includes a crystal part and an amorphous part, and in the oxide semiconductor film, a proportion of a crystal part to an amorphous part in a first region in vicinity of an interface with the source electrode layer and the drain electrode layer is lower than a proportion of a crystal part to an amorphous part in a second region that is a remaining region of the oxide semiconductor film except the first region. In addition, the oxide semiconductor film contains at least indium, gallium, and zinc and includes a first layer on a gate electrode layer side and a second layer on any of a source electrode layer side and a drain electrode layer side, and the second layer has an atomic ratio where an atomic percent of gallium is greater than or equal to an atomic percent of indium.

Another embodiment of the present invention is a semiconductor device including a gate electrode layer over a substrate, a gate insulating film over the gate electrode layer, an oxide semiconductor film over the gate insulating film, and a source electrode layer and a drain electrode layer over the oxide semiconductor film. In the semiconductor device, the oxide semiconductor film is non-single-crystal and includes a crystal part and an amorphous part, and in the oxide semiconductor film, a proportion of a crystal part to an amorphous part in a first region in vicinity of an interface with the source electrode layer and the drain electrode layer is lower than a proportion of a crystal part to an amorphous part in a second region that is a remaining region of the oxide semiconductor film except the first region. In addition, the oxide semiconductor film contains at least indium, gallium, and zinc and includes a first layer on a gate electrode layer side and a second layer on any of a source electrode layer side and a drain electrode layer side, and the first layer has an atomic ratio where an atomic percent of indium is greater than an atomic percent of gallium Another embodiment of the present invention is a semiconductor device including a gate electrode layer over a substrate, a gate insulating film over the gate electrode layer, an oxide semiconductor film over the gate insulating film, and a source electrode layer and a drain electrode layer over the oxide semiconductor film. In the semiconductor device, the oxide semiconductor film is non-single-crystal and includes a crystal part and an amorphous part, and in the oxide semiconductor film, a proportion of a crystal part to an amorphous part in a first region in vicinity of an interface with the source electrode layer and the drain electrode layer is lower than a proportion of a crystal part to an amorphous part in a second region that is a remaining region of the oxide semiconductor film except the first region. In addition, the oxide semiconductor film contains at least indium, gallium, and zinc and includes a first layer on a gate electrode layer side and a second layer on any of a source electrode layer side and a drain electrode layer side. The first layer has an atomic ratio of In:Ga:Zn=3:1:2 or in the neighborhood thereof, and the second layer has an atomic ratio of In:Ga:Zn=1:1:1 or in the neighborhood thereof.

Further, hydrogen concentration of the first region that is measured by secondary ion mass spectrometry is preferably less than $5 \times 10^{18}/cm^3$.

Further, hydrogen concentration of the second region that is measured by secondary ion mass spectrometry is preferably greater than or equal to $5 \times 10^{18}/cm^3$.

Further, the oxide semiconductor film can be an oxide semiconductor film including a crystal part and an amorphous part, and, in the crystal part, a c-axis is aligned in a direction parallel to a normal vector of a surface where the oxide semiconductor film is formed or a normal vector of a surface of the oxide semiconductor film.

Further, the semiconductor device of any of the above structures preferably includes, over the oxide semiconductor film, the source electrode layer, and the drain electrode layer, an oxide insulating film having an oxygen-excess region, and an aluminum oxide film over the oxide insulating film.

Further, in the oxide semiconductor film, a region overlapping with the source electrode layer or the drain electrode layer preferably has a larger thickness than a region overlapping with neither the source electrode layer nor the drain electrode layer.

Another embodiment of the present invention is a method for manufacturing a semiconductor device including the steps of forming a gate electrode layer over an insulating surface, forming a gate insulating film over the gate electrode layer, forming, over the gate insulating film, an oxide semiconductor film which is non-single-crystal, includes a crystal part and an amorphous part, and includes a first layer on a gate electrode layer side and a second layer formed on the first layer, forming a conductive film over the oxide semiconductor film, so that a region in the oxide semiconductor film in vicinity of an interface with the conductive film is made amorphous, performing heat treatment, then processing the conductive film to form the source electrode layer and the drain electrode layer, and removing a part of the amorphous region in the oxide semiconductor film which is exposed by formation of the source electrode layer and the drain electrode layer. The first layer has an atomic ratio where an atomic percent of indium is greater than an atomic percent of gallium, and the second layer has an atomic ratio where an atomic percent of gallium is greater than an atomic percent of indium.

Another embodiment of the present invention is a method for manufacturing a semiconductor device including the steps of forming a gate electrode layer over an insulating surface, forming a gate insulating film over the gate electrode layer, forming, over the gate insulating film, an oxide semiconductor film which is non-single-crystal, includes a crystal part and an amorphous part, and includes a first layer on a gate electrode layer side and a second layer formed on the first layer, performing plasma treatment on the oxide semiconductor film, so that a region in vicinity of a surface of the oxide semiconductor film is made amorphous, forming a conductive film over the oxide semiconductor film, forming the source electrode layer and the drain electrode layer after performing heat treatment, and removing a part of the amorphous region in the oxide semiconductor film which is exposed by formation of the source electrode layer and the drain electrode layer. The first layer has an atomic ratio where an atomic percent of indium is greater than an atomic percent of gallium, and the second layer has an atomic ratio where an atomic percent of gallium is greater than an atomic percent of indium.

Further, the oxide semiconductor film can be an oxide semiconductor film including a crystal part and an amorphous part, and, in the crystal part, a c-axis is aligned in a direction parallel to a normal vector of a surface where the oxide semiconductor film is formed or a normal vector of a surface of the oxide semiconductor film.

Further, the part of the amorphous region in the oxide semiconductor film can be removed by wet etching.

In accordance with one embodiment of the present invention, it is possible to provide a highly reliable semiconductor device by giving stable electrical characteristics to a transistor including an oxide semiconductor film.

BRIEF DESCRIPTION OF THE DRAWINGS

FIGS. 17A and 17B are cross-sectional views which illustrate one embodiment of a semiconductor device.

DETAILED DESCRIPTION OF THE INVENTION

Hereinafter, embodiments of the invention disclosed in this specification will be described with reference to the accompanying drawings. Note that the invention disclosed in this specification is not limited to the following description, and it is easily understood by those skilled in the art that modes and details can be variously changed without departing from the spirit and the scope of the invention. Therefore, the invention disclosed in this specification is not construed as being limited to the description of the following embodiments. Note that the ordinal numbers such as "first" and "second" in this specification are used for convenience and do not denote the order of steps or the stacking order of layers. In addition, the ordinal numbers in this specification do not denote particular names which specify the present invention.

(Embodiment 1)

In this embodiment, one embodiment of a semiconductor device will be described with reference to FIGS. 1A to 1C and FIG. 21. In this embodiment, a transistor including an oxide semiconductor film is described as an example of the semiconductor device.

The transistor may have a single-gate structure in which one channel formation region is formed, a double-gate structure in which two channel formation regions are formed, or a triple-gate structure in which three channel formation regions are formed. Further, a transistor may have a dual-gate structure including two gate electrode layers positioned above and below a channel formation region with gate insulating films interposed therebetween.

Figure 1A:
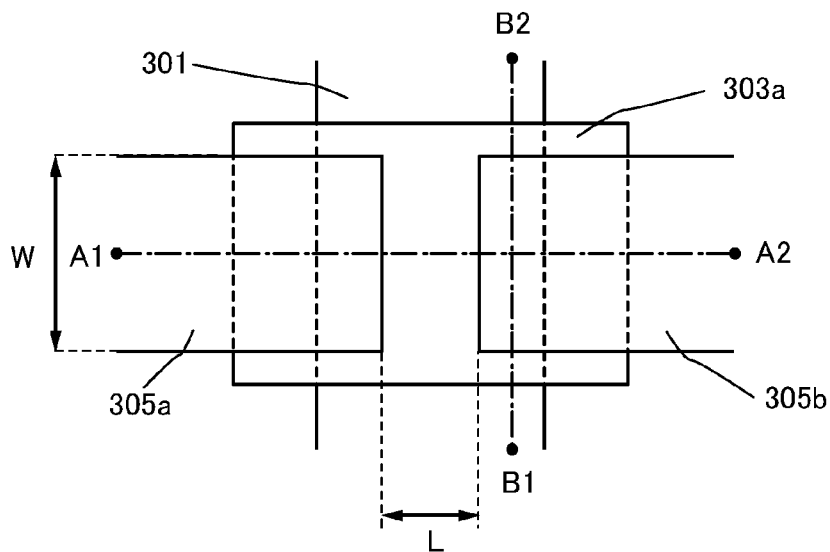
FIGS. 1A to 1C are a plan view and cross-sectional views which illustrate one embodiment of a semiconductor device.
Figure 1B:
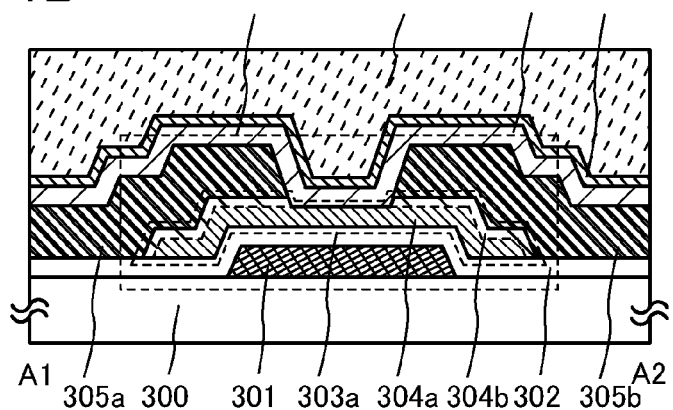
Figure 1C:
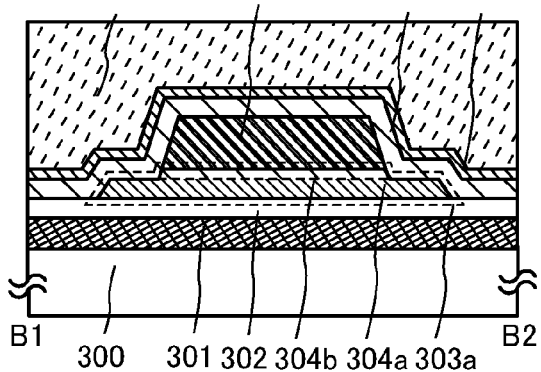

A transistor 310 shown in FIGS. 1A to 1C is an example of a bottom-gate transistor (also referred to as an inverted-staggered transistor). FIG. 1A is a plan view of the transistor 310. FIG. 1B is a cross-sectional view along line A1-A2 in FIG. 1A (cross-sectional view in the channel length L direction). FIG. 1C is a cross-sectional view along line B1-B2 in FIG. 1A (cross-sectional view in the channel width W direction). Further, in FIG. 1A, some components of the transistor 310 (e.g., a gate insulating film 302) are not illustrated to avoid complexity.

The transistor 310 shown in FIGS. 1A to 1C includes a gate electrode layer 301 over a substrate 300 having an insulating surface, the gate insulating film 302 over the gate electrode layer 301, an oxide semiconductor film 303a provided over the gate insulating film 302 in a region overlapping with the gate electrode layer 301, and a source electrode layer 305a and a drain electrode layer 305b which are in contact with the oxide semiconductor film 303a. Further, an insulating film 306, an insulating film 307, and a planarization insulating film 308 are provided to cover the transistor 310.

The oxide semiconductor film 303a contains at least indium. In particular, indium and zinc are preferably contained.

The oxide semiconductor film 303a is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts and amorphous parts are included. Note that in most cases, the crystal part fits inside a cube whose one side is less than 100 nm. From an observation image obtained with a transmission electron microscope (TEM), what is called a crystal grain boundary (also referred to as a grain boundary) cannot be observed clearly in a crystal part included in the CAAC-OS film, and the boundary between an amorphous part and a crystal part in the CAAC-OS film is not clear. Further, also in the case where a crystal part and another crystal part are close to each other, the boundary is not clear. Furthermore, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With the use of the CAAC-OS film in a transistor, change in electrical characteristics of the transistor due to irradiation with visible light or ultraviolet light is small. Thus, the transistor has high reliability.

In this embodiment, description is given on the assumption that the oxide semiconductor film 303a is the CAAC-OS film; however, the oxide semiconductor film 303a may be in a single crystal state or a polycrystalline (also referred to as polycrystal) state.

The oxide semiconductor film 303a includes a region 304b in the vicinity of the interface with the source electrode layer 305a and the drain electrode layer 305b, and a region 304a that is a remaining region of the oxide semiconductor film 303a except the region 304b. For example, the region 304b in the vicinity of the interface with the source electrode layer 305a and the drain electrode layer 305b can be referred to as a first region. Further, the region 304a that is a remaining region of the oxide semiconductor film 303a except the first region can be referred to as a second region.

In the case where the oxide semiconductor film 303a is the CAAC-OS film, the proportion of a crystal part to an amorphous part in the region 304a of the oxide semiconductor film 303a is higher than the proportion of a crystal part to an amorphous part in the region 304b. Further, the proportion of a crystal part in the region 304a is preferably higher than the proportion of an amorphous part in the region 304a, and the proportion of a crystal part in the region 304b is preferably lower than the proportion of an amorphous part in the region 304b. Note that the region 304b may be amorphous.

A channel is formed in a portion of the region 304a in the oxide semiconductor film 303a which overlaps with the gate electrode layer 301. Therefore, the region 304a in the oxide semiconductor film 303a is preferably a region which is purified by reduction of impurities such as water or hydrogen and by reduction of oxygen vacancies. A purified oxide semiconductor (purified OS) is an intrinsic (i-type) semiconductor or a substantially i-type semiconductor. Thus, a transistor including the oxide semiconductor in a portion where a channel is formed has characteristics of very small off-state current. Further, with the use of the oxide semiconductor for the portion where a channel is formed, a shift in the negative direction of the threshold voltage of the transistor can be inhibited.

Specifically, the hydrogen concentration of the purified oxide semiconductor that is measured by secondary ion mass spectrometry (SIMS) is less than $5 \times 10^{18}/cm^3$, preferably less than or equal to $5 \times 10^{17}/cm^3$, more preferably less than or equal to $1 \times 10^{16}/cm^3$. In addition, the carrier density of the oxide semiconductor film that can be measured by Hall effect measurement is lower than $1 \times 10^{14}/cm^3$, preferably lower than $1 \times 10^{12}/cm^3$, more preferably lower than $1 \times 10^{11}/cm^3$. Furthermore, the band gap of the oxide semiconductor is 2 eV or more, preferably 2.5 eV or more, more preferably 3 eV or more. A transistor including the oxide semiconductor which is purified by sufficient reduction of the concentration of impurities such as water or hydrogen and by reduction of oxygen vacancies has characteristics of very small off-state current. Further, with the use of the oxide semiconductor for the portion where a channel is formed, a shift in the negative direction of the threshold voltage can be inhibited.

Further, in the region 304b in the vicinity of the interface at which the oxide semiconductor film 303a is in contact with the source electrode layer 305a or the drain electrode layer 305b, the hydrogen concentration that is measured by secondary ion mass spectrometry (SIMS) is greater than or equal to $5 \times 10^{18}/cm^3$.

Further, the region 304b in the vicinity of the interface at which the oxide semiconductor film 303a is in contact with the source electrode layer 305a or the drain electrode layer 305b may include, in addition to hydrogen, one or more of elements of Group 15 in the periodic table (e.g., nitrogen, phosphorus, and arsenic), elements of Group 13 in the periodic table (e.g., boron, aluminum, gallium, and indium), tungsten, molybdenum, and rare gas elements (e.g., helium, neon, argon, and xenon), for example.

The region 304b in the oxide semiconductor film 303a including any of the above-described elements can have higher conductivity than the region 304a. Therefore, the region 304b in the oxide semiconductor film 303a can serve as a low-resistance region.

Note that the oxide semiconductor film 303a is divided into two regions, i.e., the region 304a and the region 304b, which means that the oxide semiconductor film is functionally divided into two regions in terms of electrical characteristics. That is, the oxide semiconductor film 303a formed of one layer is acceptable as long as the layer includes functionally divided two regions, and the boundary between the two regions is not necessarily clear. Further, the oxide semiconductor film 303a may have a stacked-layer structure including two or more layers.

In the region 304a of the oxide semiconductor film 303a, oxygen vacancies and hydrogen are reduced in the portion of which overlaps with the gate electrode layer 301, whereby generation of carriers can be inhibited. Thus, formation of a parasitic channel can be inhibited, and therefore, a shift in the negative direction of the threshold voltage can be inhibited.

The insulating film 306 provided in contact with the oxide semiconductor film 303a is preferably an oxide insulating film of silicon oxide, gallium oxide, aluminum oxide, silicon oxynitride, aluminum oxynitride, or the like. Since the insulating film 306 is in contact with the oxide semiconductor film 303a, the insulating film 306 preferably includes an oxygen-excess region.

The insulating film 307 provided in contact with the insulating film 306 is preferably a film having a low oxygen-transmitting property. For example, the insulating film 307 is preferably formed using aluminum oxide, silicon nitride, or the like. With the use of the film having a low oxygen-transmitting property for the insulating film 307, release of oxygen contained in the insulating film 306 to the outside can be inhibited. Further, the insulating film 307 is preferably a film having a low hydrogen-transmitting property. With the use of the film having a low hydrogen-transmitting property for the insulating film 307, even if hydrogen is mixed from the outside, hydrogen can be prevented from diffusing into the oxide semiconductor film 303a.

In the case where an aluminum oxide film is used for the insulating film 307, the resistivity of the aluminum oxide film is preferably greater than or equal to $1 \times 10^{10}$ Ωm and less than or equal to $1 \times 10^{19}$ Ωm (more preferably greater than or equal to $1 \times 10^{10}$ Ωm and less than or equal to $1 \times 10^{18}$ Ωm, much more preferably greater than or equal to $1 \times 10^{11}$ Ωm and less than or equal to $1 \times 10^{15}$ Ωm). Further, a titanium oxide film or a magnesium oxide film is stacked over an aluminum oxide film, in which case the resistivity of the titanium oxide film or the magnesium oxide film is preferably greater than or equal to $1 \times 10^{10}$ Ωm and less than or equal to $1 \times 10^{19}$ Ωm (more preferably greater than or equal to $1 \times 10^{10}$ Ωm and less than or equal to $1 \times 10^{18}$ Ωm, much more preferably greater than or equal to $1 \times 10^{11}$ Ωm and less than or equal to $1 \times 10^{15}$ Ωm). When a film having resistivity in the above-described range is used for the insulating film 307, electrostatic breakdown of a semiconductor device can be prevented.

Note that the aluminum oxide film preferably has high density (film density higher than or equal to 3.2 g/cm$^3$, more preferably higher than or equal to 3.6 g/cm$^3$), in which case the transistor 310 can have stable electrical characteristics. The film density can be measured by Rutherford backscattering spectrometry (RBS) or X-ray reflection (XRR).

Supposing that the composition of an aluminum oxide film is expressed by $Al_2O_x$, an aluminum oxide film $Al_2O_x$ where x is greater than or equal to 1 and less than or equal to 3.5 is preferably used.

An insulating film serving as an interlayer insulating film (a protective insulating film, a planarization insulating film) may be formed over the insulating film 307. The interlayer insulating film (the protective insulating film, the planarization insulating film) can relieve stress on the insulating film 307 that is a thin film. Accordingly, the insulating film 307 can be prevented from being damaged.

FIGS. 1A to 1C illustrate the case where the planarization insulating film 308 is provided over the insulating film 307. An organic material such as a polyimide resin, an acrylic resin, or a benzocyclobutene resin can be used for the planarization insulating film 308. The planarization insulating film 308 can reduce surface unevenness due to the transistor 310.

In the case where the insulating film 307 is formed using an insulating film having a low hydrogen-transmitting property, hydrogen or water can be prevented from reaching the oxide semiconductor film 303a from the planarization insulating film 308.

Next, a semiconductor device having a structure which is partly different from the semiconductor device shown in FIGS. 1A to 1C will be described with reference to FIG. 21. Note that repetitive description of portions which are the same or portions having functions which are the same as those in portions in FIGS. 1A to 1C is omitted.

Figure 21:
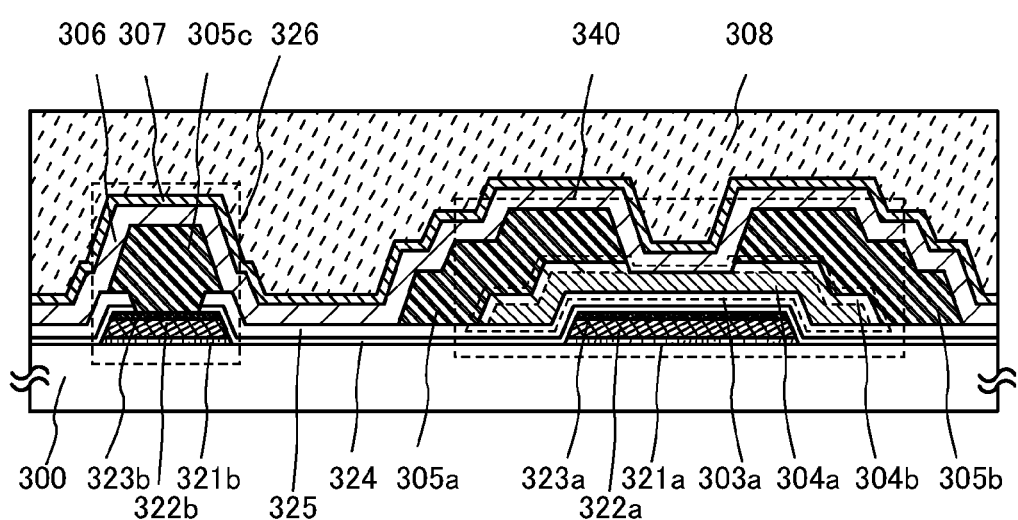
FIG. 21 is a cross-sectional view which illustrates one embodiment of a semiconductor device.

A semiconductor device shown in FIG. 21 includes a transistor 340 and a terminal 326.

The transistor 340 shown in FIG. 21 is a bottom-gate transistor having an oxide semiconductor film which is similar to that of the transistor 310 shown in FIGS. 1A to 1C.

In the transistor 340 shown in FIG. 21, a gate electrode layer has a three-layer structure including a tantalum nitride film 321a, a copper film 322a, and a molybdenum film 323a. Further, a gate wiring in the terminal 326 also has a three-layer structure including a tantalum nitride film 321b, a copper film 322b, and a molybdenum film 323b.

With the use of the copper films 322a and 322b for the gate electrode layer and the gate wiring, wiring resistance can be reduced. Further, the molybdenum films 323a and 323b which are stacked over the copper films 322a and 322b can suppress diffusion of copper into a gate insulating film and/or an oxide semiconductor film 303a. Furthermore, since the work function of the molybdenum film is higher than that of an oxide semiconductor, the molybdenum film is preferably used for the gate electrode layer, in which case the threshold voltage of the transistor 340 can be shifted in the positive direction.

Further, in the transistor 340 shown in FIG. 21, the gate insulating film has a two-layer structure including a silicon nitride film 324 and a silicon oxynitride film 325.

With the use of the silicon nitride film 324 for the gate insulating film, entry of metal, water, or the like from the substrate 300, the gate electrode layer, or the gate wiring into the oxide semiconductor film 303a can be inhibited.

In the terminal 326 shown in FIG. 21, an opening is provided in the gate insulating film. Through the opening, the gate wiring is connected to an electrode layer 305c.

As in the semiconductor device shown in FIGS. 1A to 1C, the semiconductor device shown in FIG. 21 includes an insulating film 306, an insulating film 307, and a planarization insulating film 308 which are provided to cover the transistor 340 and the terminal 326. The insulating film 306 is preferably formed using, for example, a silicon oxynitride film including an oxygen-excess region. The insulating film 307 is preferably formed using, for example, an aluminum oxide film. The planarization insulating film 308 is preferably formed using, for example, an acrylic resin.

The structures, methods, and the like described in this embodiment can be combined as appropriate with any of the other structures, methods, and the like described in the other embodiments.

(Embodiment 2)

In this embodiment, an example of a method for manufacturing a semiconductor device including the transistor 310 shown in FIGS. 1A to 1C will be described with reference to FIGS. 2A to 2D and FIGS. 3A to 3D.

First, the substrate 300 having an insulating surface is prepared.

There is no particular limitation on a substrate that can be used as the substrate 300 as long as it has heat resistance to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 300. Alternatively, any of these substrates provided with a semiconductor element may be used as the substrate 300.

The semiconductor device may be manufactured using a flexible substrate as the substrate 300. To manufacture a flexible semiconductor device, the transistor 310 including the oxide semiconductor film 303a may be directly formed over a flexible substrate; or alternatively, the transistor 310 including the oxide semiconductor film 303a may be formed over a manufacturing substrate, and then may be separated from the manufacturing substrate and transferred to a flexible substrate. Note that in order to separate the transistor from the manufacturing substrate and transfer it to the flexible substrate, a separation layer (e.g., tungsten) may be provided between the manufacturing substrate and the transistor 310 including the oxide semiconductor film 303a.

Next, an insulating film functioning as a base film may be formed over the substrate 300. The insulating film can be formed by a plasma chemical vapor deposition (CVD) method or a sputtering method with a single-layer structure or a stacked-layer structure using an oxide insulating material such as silicon oxide, silicon oxynitride, aluminum oxide, aluminum oxynitride, hafnium oxide, or gallium oxide; a nitride insulating material such as silicon nitride, silicon nitride oxide, aluminum nitride, or aluminum nitride oxide; or a mixed material of any of the above materials.

The insulating film preferably has a stacked-layer structure including a silicon nitride film and a silicon oxynitride film, for example. The use of a silicon nitride film can inhibit the entry of metal, hydrogen, or the like from the substrate to the oxide semiconductor film formed later. Further, the use of a silicon oxynitride film can inhibit the entry of a component of the substrate 300 to the oxide semiconductor film formed later, which is caused by removal of a part of the substrate 300 due to etching when the gate electrode layer is formed later.

Next, a conductive film which is to be the gate electrode layer (including a wiring formed using the same layer as the gate electrode layer) is formed over the substrate 300.

The conductive film can be formed by a sputtering method or a plasma CVD method. The conductive film can be formed by using a metal material such as molybdenum, titanium, tantalum, tungsten, aluminum, copper, chromium, neodymium, or scandium, or an alloy material containing any of these materials as a main component. The conductive film can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. In addition, the conductive film is formed with a single-layer structure or a stacked-layer structure using any of the above conductive materials.

In the case of forming the conductive film with a single-layer structure, a 100 nm thick tungsten film can be formed, for example. In the case of forming the conductive film with a stacked-layer structure, a 30 nm thick tungsten nitride film, a 200 nm thick copper film, and a 30 nm thick tungsten film may be formed, for example. Further, a 30 nm thick molybdenum film may be formed instead of the 30 nm thick tungsten film. The use of the copper film can reduce wiring resistance. Further, the tungsten film or the molybdenum film that is stacked over the copper film can prevent diffusion of copper. Furthermore, the work function of the tungsten film or the molybdenum film is higher than that of an oxide semiconductor; therefore, the tungsten film or the molybdenum film is preferably used for the gate electrode layer, because the threshold voltage of the transistor can be shifted in the positive direction. Note that the tungsten film and the molybdenum film are not necessarily formed when the gate insulating film which is formed later can prevent diffusion of copper.

Next, in a photolithography process, a resist mask is formed over the conductive film and selective etching is performed, whereby the gate electrode layer 301 is formed. After the gate electrode layer 301 is formed, the resist mask is removed. Note that the conductive film may be etched using either dry etching or wet etching, or using both dry etching and wet etching.

Here, treatment for removing a contaminant generated when the resist mask is removed (this treatment is also referred to as impurity removal treatment) may be performed. For the impurity removal treatment, plasma treatment using oxygen, dinitrogen monoxide, or a rare gas (typically argon); solution treatment using dilute hydrofluoric acid, water, a developer, or a TMAH solution; or the like can be favorably employed.

Next, heat treatment may be performed on the substrate 300 and the gate electrode layer 301. For example, the heat treatment may be performed with an electric furnace at a temperature higher than or equal to 350° C. and lower than or equal to 500° C. for 30 minutes to 1 hour. By performing the heat treatment, hydrogen, water, and the like contained in the substrate 300 or the gate electrode layer 301 can be removed.

Further, a heat treatment apparatus used is not limited to an electric furnace, and an apparatus for heating an object to be processed by heat conduction or heat radiation from a heating element such as a resistance heating element may be alternatively used. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used. For example, in the case of performing the heat treatment using a GRTA apparatus, the heat treatment may be performed at a temperature of 650° C. for 1 minute to 5 minutes.

Figure 2A:
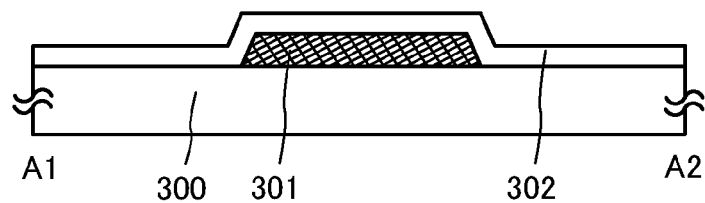
FIGS. 2A to 2D are cross-sectional views which illustrate one embodiment of a method for manufacturing a semiconductor device.

Next, the gate insulating film 302 is formed over the gate electrode layer 301 (see FIG. 2A).

To improve the coverage by the gate insulating film 302, planarization treatment may be performed on a surface of the gate electrode layer 301. It is preferable that the flatness of the surface of the gate electrode layer 301 be good particularly when the thickness of the gate insulating film 302 is small.

The gate insulating film 302 has a thickness greater than or equal to 1 nm and less than or equal to 300 nm and can be formed by a sputtering method, a molecular beam epitaxy (MBE) method, a chemical vapor deposition (CVD) method, a plasma-enhanced chemical vapor deposition (PECVD) method, a pulsed laser deposition method, an atomic layer deposition (ALD) method, or the like as appropriate.

The gate insulating film 302 can be formed using silicon oxide, gallium oxide, aluminum oxide, silicon nitride, silicon oxynitride, aluminum oxynitride, or silicon nitride oxide. When the gate insulating film 302 is formed using a high-k material such as hafnium oxide, yttrium oxide, hafnium silicate ($HfSi_xO_y$ (x>0, y>0)), hafnium silicate to which nitrogen is added ($HfSiO_xN_y$ (x>0, y>0)), hafnium aluminate ($HfAl_xO_y$ (x>0, y>0)), or lanthanum oxide, gate leakage current can be reduced. The gate insulating film 302 can be formed with a single-layer structure or a stacked-layer structure using any of the above materials.

In the case of forming the gate insulating film 302 with a single-layer structure, a 200 nm thick silicon oxynitride film may be formed. In the case of forming the gate insulating film 302 with a stacked-layer structure, a 50 nm thick silicon nitride film and a 200 nm thick silicon oxynitride film may be formed. The use of a silicon nitride film can inhibit the entry of metal, water, or the like from the substrate or the gate electrode layer 301 to the oxide semiconductor film which is formed later.

Next, heat treatment may be performed on the substrate 300, the gate electrode layer 301, and the gate insulating film 302. For example, the heat treatment can be performed with a GRTA apparatus at 650° C. for 1 minute to 5 minutes. Alternatively, the heat treatment can be performed with an electric furnace at a temperature higher than or equal to 350° C. and lower than or equal to 500° C. for 30 minutes to 1 hour. By performing the heat treatment, hydrogen, water, and the like contained in the gate insulating film 302 can be removed.

Next, treatment for introducing oxygen (also referred to as oxygen doping treatment or oxygen implantation treatment) may be performed on the gate insulating film 302. By performing the treatment for introducing oxygen, the gate insulating film 302 including an oxygen-excess region is formed.

The oxygen contains at least any of an oxygen radical, ozone, an oxygen atom, and an oxygen ion (including an oxygen molecular ion, an oxygen cluster ion). By performing the oxygen doping treatment on the dehydrated or dehydrogenated gate insulating film 302, the oxygen can be contained in the gate insulating film 302 to compensate for oxygen which has been potentially released by the above heat treatment, and the oxygen-excess region can be formed.

Introducing the oxygen into the gate insulating film 302 can be performed by, for example, an ion implantation method, an ion doping method, a plasma immersion ion implantation method, plasma treatment, or the like. Note that for the ion implantation method, a gas cluster ion beam may be used. The oxygen may be introduced to the entire area of the gate insulating film 302 at a time. For example, a linear ion beam may be used for introducing the oxygen. In the case of using the linear ion beam, the substrate or the ion beam is relatively moved (scanned), whereby the oxygen can be introduced into the entire area of the gate insulating film 302. Further, ashing treatment may be employed as the plasma treatment.

As a gas for supplying the oxygen, a gas containing oxygen (O) may be used. For example, an $O_2$ gas, an $N_2O$ gas, a $CO_2$ gas, a CO gas, a $NO_2$ gas, or the like can be used. Note that a rare gas (e.g., Ar) may be contained in a gas for supplying the oxygen.

Further, in the case where an ion implantation method is used for introducing the oxygen, the dose of the oxygen is preferably greater than or equal to $1 \times 10^{13}$ ions/cm$^2$ and less than or equal to $5 \times 10^{16}$ ions/cm$^2$. The oxygen content in the gate insulating film 302 after the oxygen doping treatment preferably exceeds that of the stoichiometric composition of the gate insulating film 302. Note that such a region containing oxygen in excess of the stoichiometric composition may exist in at least a part of the gate insulating film 302. The depth at which the oxygen is implanted may be adjusted as appropriate by implantation conditions.

The gate insulating film 302 containing excess oxygen, which serves as an oxygen supply source, is provided to be in contact with the oxide semiconductor film 303 which is formed later, and further, heat treatment is performed later. Thus, oxygen can be released from the gate insulating film 302 and oxygen can be supplied to the oxide semiconductor film 303, whereby oxygen vacancies in the oxide semiconductor film 303 can be reduced.

Note that the treatment for introducing oxygen to the gate insulating film 302 may be performed before the heat treatment of the gate insulating film 302 or may be performed before and after the heat treatment of the gate insulating film 302.

Figure 2B:
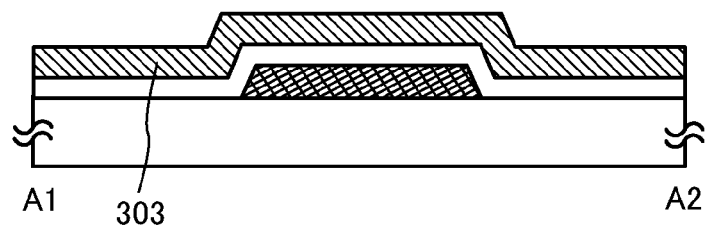

Next, the oxide semiconductor film 303 is formed over the gate insulating film 302 (see FIG. 2B).

An oxide semiconductor used for the oxide semiconductor film 303 preferably contains at least indium (In). In particular, indium and zinc (Zn) are preferably contained. In addition, as a stabilizer for reducing the variation in electrical characteristics of a transistor using the oxide semiconductor, the oxide semiconductor preferably contains gallium (Ga) in addition to indium and zinc. It is preferable that one or more elements selected from tin (Sn), hafnium (Hf), aluminum (Al), and zirconium (Zr) be contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used:
indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

For example, an In—Ga—Zn-based oxide means an oxide containing In, Ga, and Zn as main components, and there is no limitation on the ratio of In:Ga:Zn. The In—Ga—Zn-based oxide may contain a metal element other than In, Ga, and Zn.

Alternatively, a material represented by $InMO_3(ZnO)_m$ (m>0, m is not an integer) may be used as an oxide semiconductor. Note that M represents one or more metal elements selected from Ga, Fe, Mn, and Co. Alternatively, as the oxide semiconductor, a material represented by $In_2SnO_5(ZnO)_n$ (n>0, n is an integer) may be used.

For example, an In—Ga—Zn-based oxide with an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, an oxide semiconductor containing indium that is included in a transistor is not limited to the materials given above; a material with an appropriate composition may be used for a transistor including an oxide semiconductor containing indium depending on needed electrical characteristics (e.g., field-effect mobility, threshold voltage, and variation). In order to obtain the needed electrical characteristics, the carrier concentration, the impurity concentration, the defect density, the atomic ratio between a metal element and oxygen, the interatomic distance, the density, and the like are preferably set to appropriate values.

For example, high field-effect mobility can be obtained relatively easily in a transistor including an In—Sn—Zn-based oxide. Also in the case of a transistor including an In—Ga—Zn-based oxide, the field-effect mobility can be increased by reducing the defect density in a bulk.

For example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \leq r^2$. For example, r may be 0.05. The same applies to other oxides.

Further, the oxide semiconductor film 303 is preferably a CAAC-OS (c-axis aligned crystalline oxide semiconductor) film. The oxide semiconductor film 303 may be in a single crystal state or a polycrystalline (also referred to as polycrystal) state.

In an oxide semiconductor film having a crystal part as the CAAC-OS film, defects in the bulk can be further reduced and when a surface flatness is improved, mobility higher than that of an oxide semiconductor in an amorphous state can be obtained. In order to improve the surface flatness, the oxide semiconductor film 303 is preferably formed on a flat surface. Specifically, the oxide semiconductor film is preferably formed on a surface with an average surface roughness (Ra) of less than or equal to 1 nm, preferably less than or equal to 0.3 nm, more preferably less than or equal to 0.1 nm.

Note that, Ra is obtained by expanding, into three dimensions, arithmetic mean surface roughness that is defined by JIS B 0601: 2001 (ISO4287:1997) so as to be able to apply it to a curved surface. The Ra can be expressed as an "average value of the absolute values of deviations from a reference surface to a designated surface" and is defined by the formula below.

$$Ra = \frac{1}{S_0} \int_{y_1}^{y_2} \int_{x_1}^{x_2} |f(x, y) - Z_0| dx dy$$

Here, the designated surface is a surface which is a target of roughness measurement, and is a quadrilateral region which is specified by four points represented by the coordinates $(x_1, y_1, f(x_1, y_1))$, $(X_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the designated surface on the xy plane, and $Z_0$ represents the height of the reference surface (the average height of the designated surface). Ra can be measured using an atomic force microscope (AFM).

In order to improve the planarity of the surface of the oxide semiconductor film 303, planarization treatment is preferably performed on a region which is in the gate insulating film 302 and which is in contact with the oxide semiconductor film 303. The planarization treatment may be, but not particularly limited to, polishing treatment (such as chemical mechanical polishing (CMP)), dry etching treatment, or plasma treatment.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the gate insulating film 302.

As the planarization treatment, polishing treatment, dry etching treatment, or plasma treatment may be performed more than once, or these treatments may be performed in combination. In the case where the treatments are performed in combination, the order of steps is not particularly limited and may be set as appropriate depending on the roughness of the surface of the gate insulating film 302.

The thickness of the oxide semiconductor film 303 is preferably greater than or equal to 1 nm and less than or equal to 200 nm, more preferably greater than or equal to 5 nm and less than or equal to 50 nm. The oxide semiconductor film 303 can be formed by a sputtering method, a molecular beam epitaxy (MBE) method, a CVD method, a pulsed laser deposition method, an atomic layer deposition (ALD) method, or the like as appropriate.

Further, the concentration of hydrogen or water contained in the oxide semiconductor film 303 is preferably as low as possible. This is because if the concentration of hydrogen is high, by a bond of hydrogen and an element contained in an oxide semiconductor, part of hydrogen serves as a donor and generates electrons as carriers.

Therefore, in order that the oxide semiconductor film 303 contain hydrogen or water as little as possible in a step of forming the oxide semiconductor film 303, it is preferable to preheat the substrate provided with the gate insulating film 302 in a preheating chamber of a sputtering apparatus as pretreatment for formation of the oxide semiconductor film 303 so that impurities such as hydrogen or water adsorbed onto the substrate and the gate insulating film 302 are eliminated and removed. Note that as an evacuation unit, a cryopump is preferably provided in the preheating chamber.

Note that it is preferable that the oxide semiconductor film 303 be formed under a condition that much oxygen is contained during film formation (e.g., formed by a sputtering method in a 30% to 100% oxygen atmosphere), so that a film containing much oxygen (preferably including a region where the oxygen content is higher than that in the stoichiometric composition of the oxide semiconductor in a crystalline state) is formed.

A high-purity gas from which impurities such as hydrogen, water, hydroxyl, and hydride are removed is preferably used as a sputtering gas for forming the oxide semiconductor film 303.

The substrate is held in a deposition chamber kept under reduced pressure. Then, a sputtering gas from which hydrogen and water are removed is introduced into the deposition chamber from which remaining moisture is being removed, and the oxide semiconductor film 303 is formed over the gate insulating film 302 at a temperature higher than or equal to 130° C. and lower than or equal to 700° C. with the use of the above target. In order to remove moisture remaining in the deposition chamber, an entrapment vacuum pump such as a cryopump, an ion pump, or a titanium sublimation pump is preferably used. As an evacuation unit, a turbo molecular pump to which a cold trap is added may be used. From the deposition chamber which is evacuated with a cryopump, a hydrogen atom, a compound containing a hydrogen atom, such as water ($H_2O$), (preferably also a compound containing a carbon atom), and the like are removed, whereby the concentration of impurities such as hydrogen, water, hydroxyl, and hydride in the oxide semiconductor film 303 formed in the deposition chamber can be reduced.

In this embodiment, an In—Ga—Zn-based oxide film (also referred to as an IGZO film) having a thickness of 35 nm is formed as the oxide semiconductor film 303 by a sputtering method using a sputtering apparatus including an AC power supply device. In this embodiment, an In—Ga—Zn-based oxide target having an atomic ratio of In:Ga:Zn=3:1:2 is used. The deposition conditions are as follows: the atmosphere is oxygen and argon (the flow rate of oxygen is 50%), the pressure is 0.4 Pa, the electric power is 0.5 kW, and the substrate temperature is 200° C.

It is preferable to form the gate insulating film 302 and the oxide semiconductor film 303 in succession so as not to expose the gate insulating film 302 to the air after the formation of the gate insulating film 302. Forming the gate insulating film 302 and the oxide semiconductor film 303 in succession so as not to expose the gate insulating film 302 to the air can prevent impurities such as hydrogen and moisture from being adsorbed onto the surface of the gate insulating film 302.

Here, heat treatment may be performed on the oxide semiconductor film 303 in order to remove hydrogen (including water and hydroxyl) (to perform dehydration or dehydrogenation treatment). The temperature of the heat treatment is higher than or equal to 300° C. and lower than or equal to 700° C., or lower than the strain point of the substrate. The heat treatment can be performed in reduced pressure, a nitrogen atmosphere, or the like.

In this embodiment, the substrate is introduced into an electric furnace, which is one of heat treatment apparatuses, and the oxide semiconductor film 303 is subjected to heat treatment at 450° C. in a nitrogen atmosphere for 1 hour and further at 450° C. in an atmosphere of nitrogen and oxygen for 1 hour.

Further, a heat treatment apparatus used is not limited to an electric furnace, and a device for heating an object to be processed by heat conduction or heat radiation from a heating element such as a resistance heating element may be alternatively used. For example, an RTA apparatus such as an LRTA apparatus or a GRTA apparatus can be used. For example, as the heat treatment, GRTA may be performed as follows. The substrate is put in an inert gas heated at high temperature of 650° C. to 700° C., is heated for several minutes, and is taken out of the inert gas.

Note that in the heat treatment, it is preferable that water, hydrogen, and the like be not contained in nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (that is, the concentration of impurities is 1 ppm or lower, preferably 0.1 ppm or lower).

In addition, after the oxide semiconductor film 303 is heated by the heat treatment, a high-purity oxygen gas, a high-purity dinitrogen monoxide gas, or ultra dry air (air with a moisture amount is less than or equal to 20 ppm (−55° C. by conversion into a dew point), preferably less than or equal to 1 ppm, or more preferably less than or equal to 10 ppb, in the case where measurement is performed with use of a dew point meter of a cavity ring down laser spectroscopy (CRDS) system) may be introduced into the same furnace. It is preferable that water, hydrogen, or the like be not contained in the oxygen gas or the dinitrogen monoxide gas. Alternatively, the purity of the oxygen gas or the dinitrogen monoxide gas which is introduced into the heat treatment apparatus is preferably 6N or higher, more preferably 7N or higher (i.e., the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main component of the oxide semiconductor and that is reduced by the step of removing impurities for dehydration or dehydrogenation, so that the oxygen vacancies in the oxide semiconductor film 303 can be reduced.

The heat treatment for dehydration or dehydrogenation may be performed before or after the oxide semiconductor film is processed into an island shape. The heat treatment for dehydration or dehydrogenation may be performed more than once, and may also serve as another heat treatment. By performing the heat treatment on the oxide semiconductor film 303, the crystallinity of the oxide semiconductor film 303 can be increased.

When the heat treatment for dehydration or dehydrogenation is performed before the oxide semiconductor film 303 is processed into an island shape, i.e., when the heat treatment for dehydration or dehydrogenation is performed in the state where the gate insulating film 302 is covered with the oxide semiconductor film 303, oxygen contained in the gate insulating film 302 can be prevented from being released to the outside by the heat treatment.

Figure 2C:
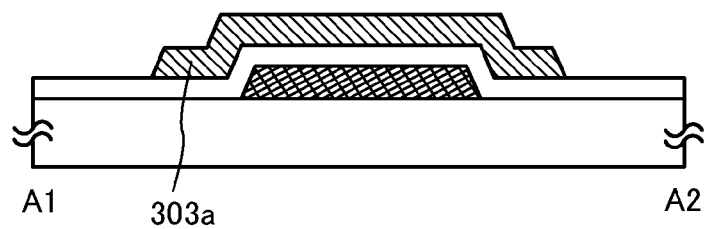

Next, in a photolithography process, a resist mask is formed over the oxide semiconductor film 303 and selective etching is performed on the oxide semiconductor film 303, whereby the island-shaped oxide semiconductor film 303a is formed (see FIG. 2C). After the island-shaped oxide semiconductor film 303a is formed, the resist mask is removed. A resist mask for forming the island-shaped oxide semiconductor film 303a may be formed by an ink-jet method. When a resist mask is formed by an ink-jet method, photo masks are not used, so that the production cost can be reduced.

Note that the oxide semiconductor film 303 may be etched using either dry etching or wet etching, or using both dry etching and wet etching. As an etchant used for wet etching of the oxide semiconductor film 303, a mixed solution of phosphoric acid, acetic acid, and nitric acid, or the like can be used, for example. Alternatively, ITO-07N (produced by KANTO CHEMICAL CO., INC.) may be used. Further alternatively, the oxide semiconductor film may be etched by a dry etching method using an inductively coupled plasma (ICP) etching method.

Figure 2D:
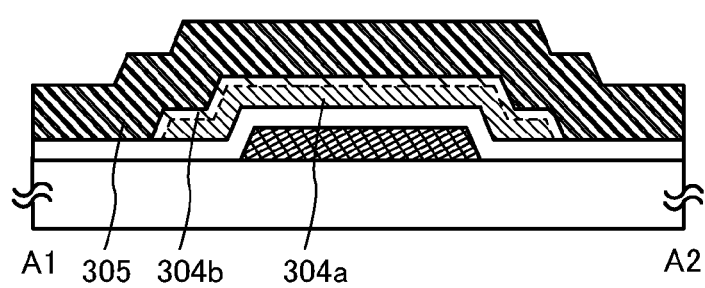

Next, a conductive film 305 which is to be a source electrode layer and a drain electrode layer (including a wiring formed using the same layer as the source electrode layer and the drain electrode layer) is formed over the gate insulating film 302 and the oxide semiconductor film 303a (see FIG. 2D).

The conductive film 305 can be formed by a sputtering method or a plasma CVD method. The conductive film 305 can be formed by using a metal material such as molybdenum, titanium, tantalum, tungsten, aluminum, copper, chromium, neodymium, or scandium, or an alloy material containing any of these materials as a main component. The conductive film 305 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. In addition, the conductive film 305 is formed with a single-layer structure or a stacked-layer structure.

In this embodiment, the conductive film 305 is formed with a three-layer structure including a 50 nm thick tungsten film, a 400 nm thick aluminum film, and a 100 nm thick titanium film.

In the case where the oxide semiconductor film 303a is the CAAC-OS film, a crystal structure of a crystal part in the region 304b in the vicinity of the interface with the conductive film 305 is disordered by the formation of the conductive film 305. Thus, the proportion of a crystal part to an amorphous part in the region 304b is reduced as compared to the proportion of a crystal part to an amorphous part in the region 304a. Alternatively, a crystal part in the region 304b is destroyed and the region 304b becomes amorphous. In the case where the oxide semiconductor film 303a is a film having crystallinity such as a single crystal film or a polycrystalline film, a crystal structure of crystal in the region 304b in the vicinity of the interface with the conductive film 305 is disordered. Thus, crystallinity of the region 304b is lowered, and in some cases, the region 304b becomes amorphous.

In the oxide semiconductor film 303a, the region 304b in which a crystal structure of a crystal part or crystal is disordered is formed in a surface of the oxide semiconductor film 303a to a thickness of several nanometers. The disorder in the crystal structure of a crystal part or crystal in the region 304b leads to increase in dangling bonds, distortions between lattices, voids, and oxygen vacancies.

Therefore, hydrogen is moved to the dangling bonds, distortions between lattices, voids, and oxygen vacancies in the region 304b. By performing heat treatment on the oxide semiconductor film 303a, hydrogen contained in the region 304a of the oxide semiconductor film 303a moves by heat and hydrogen is drawn to the region 304b.

The heat treatment for moving hydrogen to the region 304b in the oxide semiconductor film 303a is performed at a temperature, for example, higher than or equal to 100° C. and lower than or equal to the strain point of the substrate, preferably higher than or equal to 200° C. and lower than or equal to 650° C.

By performing the heat treatment, hydrogen contained in the region 304a of the oxide semiconductor film 303a is drawn to the region 304b, whereby the hydrogen concentration of the region 304a can be reduced. Hydrogen moved to the region 304b of the oxide semiconductor film 303a is made stable; therefore, hydrogen is hardly diffused again into the region 304a. Thus, the hydrogen concentration of the region 304b of the oxide semiconductor film 303a is increased, whereby the region 304b can have higher conductivity than the region 304a. Therefore, the region 304b of the oxide semiconductor film 303a can serve as a low-resistance region.

Note that the heat treatment for moving hydrogen to the region 304b may be performed after formation of the source electrode layer and the drain electrode layer or may be performed before and after formation of the source electrode layer and the drain electrode layer. The heat treatment for moving hydrogen from the region 304a to the region 304b may be performed more than once, and may also serve as another heat treatment.

Figure 3A:
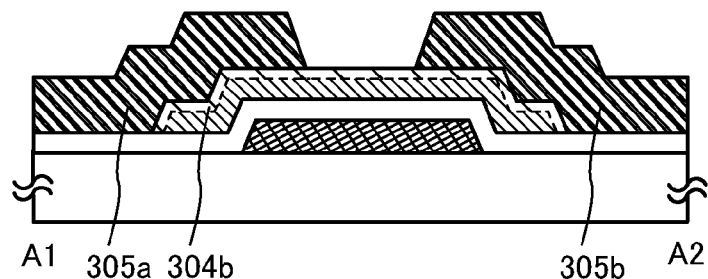
FIGS. 3A to 3D are cross-sectional views which illustrate one embodiment of a method for manufacturing a semiconductor device.

Next, in a photolithography process, a resist mask is formed over the conductive film 305 and selective etching is performed on the conductive film 305, whereby the source electrode layer 305a and the drain electrode layer 305b are formed (see FIG. 3A). At this time, the region 304b of the oxide semiconductor film 303a is exposed. After the source electrode layer 305a and the drain electrode layer 305b are formed, the resist mask is removed. Note that the conductive film 305 may be etched using either dry etching or wet etching, or using both dry etching and wet etching.

A crystal part or crystal in the region 304b of the oxide semiconductor film 303a is destroyed, whereby dangling bonds, distortions between lattices, voids, and oxygen vacancies in the region 304b increase. In addition, hydrogen is drawn to the region 304b, whereby the hydrogen concentration of the region 304b is increased as compared to that of the region 304a. Therefore, if a transistor including the region 304b having high hydrogen concentration is manufactured, the region 304b may adversely affect the transistor in some cases. For example, if the region having high hydrogen concentration is provided in a portion where a back channel is formed or a side edge portion of the oxide semiconductor film 303a, carriers generated by oxygen vacancies or hydrogen are stored, whereby a parasitic channel is formed; thus, leakage current is easily generated and threshold voltage might vary.

Alternatively, plasma treatment using an etching gas containing halogen is favorably employed to etch the conductive film 305 formed over the oxide semiconductor film 303a. However, if the oxide semiconductor film is exposed to the etching gas containing halogen, halogen (e.g., chlorine or fluorine) contained in the etching gas extracts oxygen in the oxide semiconductor film 303a in some cases, which might cause oxygen vacancies to be formed in the vicinity of a surface of the oxide semiconductor film 303a where plasma treatment is employed. Further, if the halogen contained in the etching gas remains on a surface of the oxide semiconductor film 303a and in the vicinity thereof after the etching, oxygen vacancies might be formed in the oxide semiconductor film 303a. Such oxygen vacancies in the oxide semiconductor film 303a might cause a top surface (back channel) side and a side edge portion of the oxide semiconductor film 303a to have lower resistance (n-type conductivity), resulting in formation of a parasitic channel.

Alternatively, in forming the conductive film 305, an element contained in the conductive film 305 is added to the oxide semiconductor film 303a in some cases.

Figure 3B:
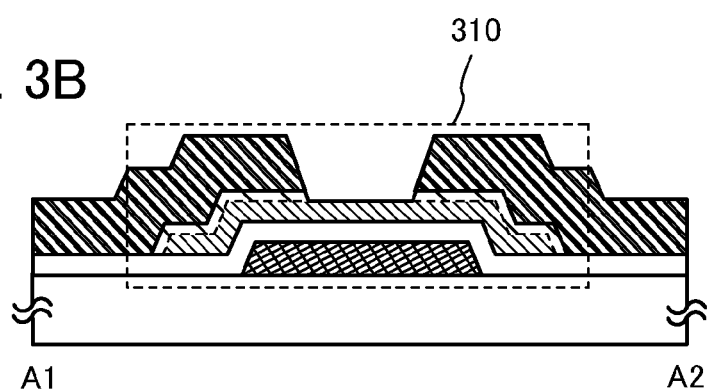

Therefore, to prevent a parasitic channel from being formed by decrease in resistance of the back channel side and the side edge portion of the oxide semiconductor film, a part of the region 304b which is exposed by the formation of the source electrode layer 305a and the drain electrode layer 305b is removed (see FIG. 3B). In a step of removing the part of the region 304b, it is preferable that the etching condition for the oxide semiconductor film 303a be optimized in order to prevent the oxide semiconductor film 303a from being etched to be removed or divided.

For the step of removing the part of the region 304b, plasma treatment using oxygen, dinitrogen monoxide, or a rare gas (typically argon); solution treatment using hydrofluoric acid (also referred to as dilute hydrofluoric acid), water, a developer, or a TMAH solution; or the like can be favorably employed. When an IGZO film is subjected to treatment using dilute hydrofluoric acid, for example, $1/10^3$ dilute hydrofluoric acid (hydrofluoric acid: 0.05%), the thickness decreases by 1 nm to 3 nm per second. When the IGZO film is subjected to treatment using $2/10^5$ dilute hydrofluoric acid (hydrofluoric acid: 0.0025%), the thickness decreases by approximately 0.1 nm per second. In this embodiment, as the step of removing the part of the region 304b with disordered crystal structure, solution treatment using dilute hydrofluoric acid (wet etching) is performed.

The part of the region 304b in which a crystal part or crystal is destroyed and hydrogen concentration is higher than that of the region 304a is removed in the portion where a back channel is formed or the side edge portion of the oxide semiconductor film 303a, whereby the region 304a having low hydrogen concentration can be exposed. Thus, formation of a parasitic channel can be prevented, and generation of leakage current or variation in threshold voltage can be inhibited. Further, the region 304b can serve as a low-resistance region even if hydrogen concentration is high and a halogen remains in the region 304b in the vicinity of the interface between the oxide semiconductor film 303a and the source electrode layer 305a or the drain electrode layer 305b.

The part of the region 304b in the oxide semiconductor film 303a is thus removed, whereby the thickness of a region in the oxide semiconductor film 303a which overlaps with the source electrode layer 305a or the drain electrode layer 305b is larger than that of a region in the oxide semiconductor film 303a which overlaps with neither the source electrode layer 305a nor the drain electrode layer 305b.

The removal of the part of the region 304b with disordered crystal structure in the portion where a back channel is formed or the side edge portion of the oxide semiconductor film 303a can also lead to removal of contaminants generated when the source electrode layer 305a and the drain electrode layer 305b are processed and contaminants generated when the resist mask is removed.

Through the above-described process, the transistor 310 can be manufactured (see FIG. 3B).

Figure 3C:
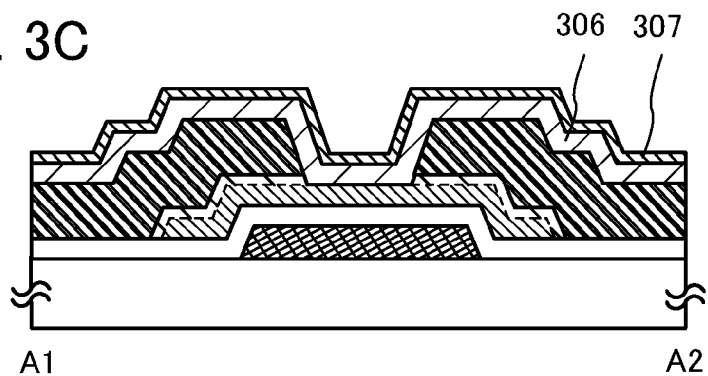

Next, the insulating film 306 is formed over the oxide semiconductor film 303a, the source electrode layer 305a, and the drain electrode layer 305b (see FIG. 3C).

The insulating film 306 can be formed by a plasma CVD method or a sputtering method. The insulating film 306 can be formed using silicon oxide, gallium oxide, aluminum oxide, silicon nitride, silicon oxynitride, aluminum oxynitride, or the like, for example.

Note that as the insulating film 306, an oxide insulating film containing nitrogen (e.g., a silicon oxide film containing nitrogen or an aluminum oxide film containing nitrogen) or the like can be used. The concentration of nitrogen contained in the oxide insulating film may be higher than or equal to 0.01 atomic %, preferably higher than or equal to 0.1 atomic % and lower than or equal to 50 atomic %, more preferably higher than or equal to 0.5 atomic % and lower than or equal to 15 atomic %. Such a silicon oxide film containing nitrogen with the above concentration may be referred to as a silicon oxynitride film.

In this embodiment, as the insulating film 306, a silicon oxynitride film is formed by a plasma CVD method. The conditions for forming the insulating film 306 can be as follows: the gas flow rate of $SiH_4$ and $N_2O$ is 30:4000; the pressure is 200 Pa, the RF power supply (power supply output) is 150 W, and the substrate temperature is 220° C.±15° C. The preferable thickness of the insulating film 306 is greater than or equal to 50 nm and less than or equal to 100 nm.

It is preferable that heat treatment for dehydration or dehydrogenation be performed on the insulating film 306. In this embodiment, a gas containing hydrogen is used for depositing the insulating film 306. However, since the insulating film 306 is subjected to dehydration or dehydrogenation treatment, hydrogen in the insulating film 306 can be removed. Thus, a plasma CVD method can be preferably used. By a plasma CVD method, particles and the like do not easily enter and attach to a film in deposition, and in addition, a thick film can be deposited with relatively high deposition speed; a plasma CVD method is advantageous in productivity.

The temperature of the heat treatment is higher than or equal to 300° C. and lower than or equal to 700° C., or lower than the strain point of the substrate. It is preferable that the temperature of the heat treatment be higher than the deposition temperature of the insulating film 306, because effect of dehydration or dehydrogenation is high. For example, the substrate is introduced into an electric furnace which is one of heat treatment apparatuses, and the heat treatment is performed on the insulating film 306 at 450° C. in a nitrogen atmosphere for 1 hour.

By the heat treatment, the insulating film 306 can be dehydrated or dehydrogenated, and thus an insulating film from which impurities such as hydrogen or water are removed can be used.

By performing the heat treatment for dehydration or dehydrogenation, impurities contained in the insulating film 306, such as water or hydrogen, can be removed from the insulating film 306 and reduced. When the insulating film 306 contains hydrogen as little as possible, the entry of hydrogen into the oxide semiconductor film 303a can be inhibited. Therefore, the transistor 310 can be less varied in electrical characteristics and thus have stable electrical characteristics.

Note that the insulating film 307 formed later preferably has a blocking function of preventing penetration of hydrogen, water, or the like. Thus, the heat treatment for dehydration or dehydrogenation of the insulating film 306 is preferably performed after formation of the insulating film 306 before formation of the insulating film 307.

Next, treatment for introducing oxygen (also referred to as oxygen doping treatment or oxygen implantation treatment) is performed on the insulating film 306. By the treatment, the insulating film 306 including an oxygen-excess region is formed.

The oxygen contains at least any of an oxygen radical, ozone, an oxygen atom, and an oxygen ion (an oxygen molecular ion and/or an oxygen cluster ion). By the oxygen doping treatment performed on the dehydrated or dehydrogenated insulating film 306, oxygen can be contained in the insulating film 306 to compensate for oxygen which has been potentially released by the above heat treatment, and the oxygen-excess region can be formed.

Introducing the oxygen into the insulating film 306 can be performed by, for example, an ion implantation method, an ion doping method, a plasma immersion ion implantation method, plasma treatment, or the like. Note that for the ion implantation method, a gas cluster ion beam may be used. The oxygen may be introduced to the entire area of the insulating film 306 at a time. For example, a linear ion beam is used for introducing the oxygen. In the case of using the linear ion beam, the substrate or the ion beam is relatively moved (scanned), whereby the oxygen can be introduced into the entire area of the insulating film 306.

As a gas for supplying the oxygen, a gas containing oxygen (O) may be used. For example, an $O_2$ gas, an $N_2O$ gas, a $CO_2$ gas, a CO gas, a $NO_2$ gas, or the like can be used. Note that a rare gas (e.g., Ar) may be contained in a gas for supplying the oxygen.

Further, in the case where an ion implantation method is used for introducing the oxygen, the dose of the oxygen is preferably greater than or equal to $1\times10^{13}$ ions/cm$^2$ and less than or equal to $5\times10^{16}$ ions/cm$^2$. The oxygen content in the insulating film 306 after the oxygen doping treatment preferably exceeds that of the stoichiometric composition of the insulating film 306. Note that such a region containing oxygen in excess of the stoichiometric composition may exist in at least a part of the insulating film 306. The depth at which the oxygen is implanted may be adjusted as appropriate by implantation conditions.

Next, in this embodiment, an aluminum film is formed over the insulating film 306.

The aluminum film is preferably formed by a sputtering method, an evaporation method, a CVD method, or the like. In addition, the thickness of the aluminum film is preferably greater than or equal to 3 nm and less than or equal to 20 nm (more preferably greater than or equal to 3 nm and less than or equal to 10 nm, much more preferably greater than or equal to 4 nm and less than or equal to 5 nm).

Note that as the aluminum film, an aluminum film to which titanium or magnesium is added may be used. Alternatively, as the aluminum film, a stacked layer of an aluminum film and any of a titanium film and a magnesium film may be used.

Next, the aluminum film is subjected to oxygen doping treatment. The detailed description of the oxygen doping treatment is omitted because the oxygen doping treatment performed on the insulating film 306 may be referred to. By performing the oxygen doping treatment on the aluminum film, an aluminum oxide film which is an oxide of the aluminum film is formed. The aluminum oxide film is used for the insulating film 307.

Heat treatment may be performed after the oxygen is added to the insulating film 306 and the aluminum film. The temperature of the heat treatment may be higher than or equal to 250° C. and lower than or equal to 600° C., for example, 300° C. By performing the heat treatment, oxygen contained in the insulating film 306 diffuses (solid-phase diffusion) toward the oxide semiconductor film 303a; thus, oxygen can be supplied to the oxide semiconductor film 303a. When oxygen is supplied from the insulating film 306 to the oxide semiconductor film 303a by solid-phase diffusion in this manner, the oxide semiconductor film 303a is less damaged by plasma as compared with the case of performing plasma treatment in which oxygen is directly added to the exposed oxide semiconductor film 303a, or the like.

If the region 304b with disordered crystal structure is formed in a portion where a back channel is formed and a side edge portion of the oxide semiconductor film 303a, hydrogen moves to the region 304b with disordered crystal structure, whereby the resistance of the region 304b is lowered, leading to formation of a parasitic channel. Even when the heat treatment is performed in a state where the region 304b in the oxide semiconductor film 303a is in contact with the insulating film 306, oxygen released from the insulating film 306 is captured by oxygen vacancies and the like in the region 304b, in which case it is difficult to supply oxygen from the insulating film 306 to the region 304a (e.g., a portion where a channel is formed) of the oxide semiconductor film 303a.

Therefore, to prevent a parasitic channel from being formed in the portion where a back channel is formed or the side edge portion of the oxide semiconductor film, it is preferable to remove a part of the region 304b which is formed in the portion where a back channel is formed or the side edge portion of the oxide semiconductor film 303a and to perform heat treatment in a state where the region 304a of the oxide semiconductor film 303a is in contact with the insulating film 306, whereby oxygen is supplied to the region 304a in the oxide semiconductor film 303a.

In the case where the oxide semiconductor film 303a is a CAAC-OS film (In—Ga—Zn-based oxide semiconductor), oxygen vacancies are concentrated in a Ga—Zn—O layer. Further, oxygen is likely to pass through the Ga—Zn—O layer. When the insulating film 306 is in contact with the oxide semiconductor film 303a, oxygen contained in the insulating film 306 is supplied more in a direction parallel to an a-b plane, particularly through the Ga—Zn—O layer, than in a c-axis direction.

In this embodiment, the part of the region 304b having high hydrogen concentration and including oxygen vacancies or the like is removed in the portion where a back channel is formed or the side edge portion of the oxide semiconductor film 303a. Therefore, it is possible to prevent the oxygen vacancies from being filled with oxygen supplied from the insulating film 306 to the side edge portion of the oxide semiconductor film 303a. Therefore, oxygen contained in the insulating film 306 can be efficiently supplied to the region 304a (particularly the region where a channel is formed) of the oxide semiconductor film 303a. Thus, oxygen vacancies contained in the region 304a of the oxide semiconductor film 303a can be reduced.

In the case of a transistor including an oxide semiconductor, supply of oxygen from the insulating film to the oxide semiconductor film can reduce interface state density between the oxide semiconductor film and the insulating film. As a result, carrier trapping at the interface between the oxide semiconductor film and the insulating film due to the operation of a transistor, or the like can be suppressed, and thus, a highly reliable transistor can be obtained.

The insulating film 306 and the insulating film 307 may be subjected to dehydration or dehydrogenation treatment and/or oxygen doping treatment more than once.

Further, for example, aluminum oxide can be used for the insulating film 307 provided over and in contact with the insulating film 306. In the case of using aluminum oxide for the insulating film 307, aluminum oxide may be formed by oxidation of an aluminum film. When an aluminum oxide film is formed by oxidation of an aluminum film, productivity can be increased as compared to the case where an aluminum oxide film is formed by a sputtering method. Further, the oxidation of an aluminum film and the oxygen doping treatment of the insulating film 306 can be performed in the same step; thus, a process can be simplified. Therefore, the production cost of a semiconductor device can be reduced.

In the case of using an oxide insulating film (e.g., silicon oxide, silicon oxynitride) for the insulating film 306, it is difficult to estimate the oxygen concentration of the oxide insulating film accurately with secondary ion mass spectrometry (SIMS) or the like because oxygen is one of main components of the oxide insulating film. That is, it is difficult to judge whether oxygen is intentionally added to the oxide insulating film or not. The same applies to the case where excess oxygen contained in the insulating film 306 is supplied to the oxide semiconductor film 303a in a later step.

It is known that there are isotopes of oxygen, such as $^{17}O$ and $^{18}O$, and that the proportions of $^{17}O$ and $^{18}O$ in all of the oxygen atoms in nature are approximately 0.038% and approximately 0.2%, respectively. That is to say, it is possible to measure the concentrations of these isotopes in the oxide semiconductor film or the insulating film in contact with the oxide semiconductor film by a method such as SIMS; therefore, the oxygen concentration of the oxide semiconductor film or the insulating film in contact with the oxide semiconductor film may be able to be estimated more accurately by measuring the concentrations of these isotopes. Thus, the concentration of the isotope may be measured to determine whether or not oxygen is intentionally added to the insulating film in contact with the oxide semiconductor film.

An insulating film serving as an interlayer insulating film (a protective insulating film, a planarization insulating film) may be formed over the insulating film 307. The interlayer insulating film (the protective insulating film, the planarization insulating film) can relieve stress on the insulating film 307 that is a thin film. Accordingly, the insulating film 307 can be prevented from being damaged.

The interlayer insulating film can be formed using a material and a method similar to those of the insulating film 306. For example, a 400 nm thick silicon oxide film is formed by a sputtering method. Heat treatment may be performed after formation of the protective insulating film. For example, heat treatment is performed at 300° C. in a nitrogen atmosphere for 1 hour.

In this embodiment, the planarization insulating film 308 is formed over the insulating film 307. The planarization insulating film 308 can reduce surface roughness due to the transistor 310. An organic material such as a polyimide resin, an acrylic resin, or a benzocyclobutene resin can be used for the planarization insulating film 308. Other than such organic materials, it is also possible to use a low-dielectric constant material (a low-k material) or the like. Note that the planarization insulating film 308 may be formed by stacking a plurality of insulating films formed from these materials.

For example, a 1500 nm thick acrylic resin film may be formed as the planarization insulating film 308. The acrylic resin film can be formed in such a manner that an acrylic resin is applied by a coating method and then baked (e.g., at 250° C. in a nitrogen atmosphere for 1 hour).

Heat treatment may be performed after formation of the planarization insulating film 308. For example, heat treatment is performed at 250° C. in a nitrogen atmosphere for 1 hour.

As described above, heat treatment may be performed after formation of the transistor 310. The heat treatment may be performed more than once.

Through the above-described process, a semiconductor device including the transistor 310 can be manufactured.

Next, a method for manufacturing a semiconductor device, which is different from the method for manufacturing a semiconductor device in FIGS. 2A to 2D and FIGS. 3A to 3D, will be described with reference to FIGS. 4A to 4D.

First, in accordance with FIG. 2A, the gate electrode layer 301 is formed over the substrate 300; then, the gate insulating film 302 is formed over the gate electrode layer 301. Next, in accordance with the step of FIG. 2B, the oxide semiconductor film 303 is formed over the gate insulating film 302. Then, in accordance with the step of FIG. 2C, in a photolithography process, a resist mask is formed over the oxide semiconductor film 303 and selective etching is performed on the oxide semiconductor film 303, whereby the island-shaped oxide semiconductor film 303a is formed.

Figure 4A:
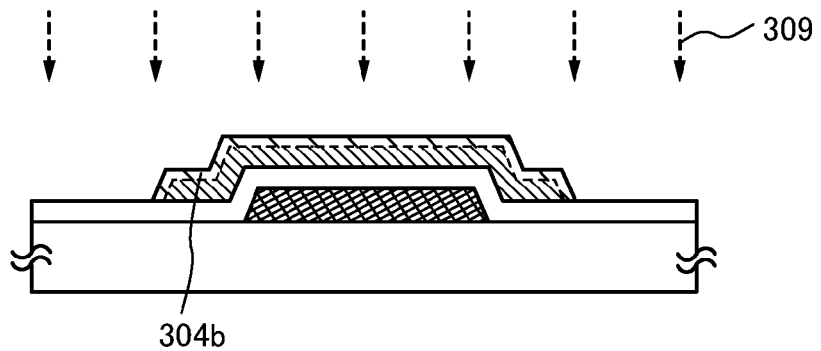
FIGS. 4A to 4D are cross-sectional views which illustrate one embodiment of a method for manufacturing a semiconductor device.
Figure 4B:
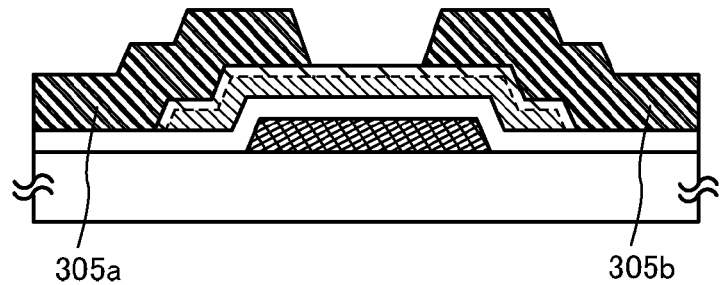

Next, as indicated by arrows 309, one or more of elements of Group 15 in the periodic table (e.g., nitrogen, phosphorus, and arsenic), elements of Group 13 in the periodic table (e.g., boron, aluminum, gallium, and indium), and rare gas elements (e.g., helium, neon, argon, and xenon) is/are added to a surface of the island-shaped oxide semiconductor film 303a by an ion implantation method, an ion doping method, or plasma treatment (see FIG. 4A).

The above-described element is preferably added to the surface of the oxide semiconductor film 303a in the range of several nanometers. By the addition of the above-described element to the oxide semiconductor film 303a, the region 304b in which the crystal structure of a crystal part or crystal is disordered is formed in the surface of the oxide semiconductor film 303a. The disorder in the crystal structure of a crystal part or crystal in the region 304b leads to increase in dangling bonds, distortions between lattices, voids, and oxygen vacancies.

Therefore, hydrogen is moved to the dangling bonds, distortions between lattices, voids, and oxygen vacancies in the region 304b. By performing heat treatment on the oxide semiconductor film 303a, hydrogen contained in the region 304a in the oxide semiconductor film 303a is drawn to the region 304b.

The heat treatment for moving hydrogen to the region 304b in the oxide semiconductor film 303a is performed at a temperature, for example, higher than or equal to 100° C. and lower than or equal to the strain point of the substrate, preferably higher than or equal to 200° C. and lower than or equal to 400° C.

By performing the heat treatment, hydrogen contained in the region 304a of the oxide semiconductor film 303a is drawn to the region 304b, whereby the hydrogen concentration of the region 304a can be reduced. Further, movement of hydrogen to the region 304b of the oxide semiconductor film 303a increases the hydrogen concentration of the region 304b.

Note that the heat treatment for moving hydrogen to the region 304b may be performed after formation of the source electrode layer and the drain electrode layer or may be performed before and after formation of the source electrode layer and the drain electrode layer. The heat treatment for moving hydrogen from the region 304a to the region 304b may be performed more than once, and may also serve as another heat treatment.

Next, a conductive film is formed over the gate insulating film 302 and the oxide semiconductor film 303a; then, in accordance with the step of FIG. 3A, in a photolithography process, a resist mask is formed over the conductive film and selective etching is performed on the conductive film, whereby the source electrode layer 305a and the drain electrode layer 305b are formed. At this time, the region 304b of the oxide semiconductor film 303a is exposed (see FIG. 4B).

Figure 4C:
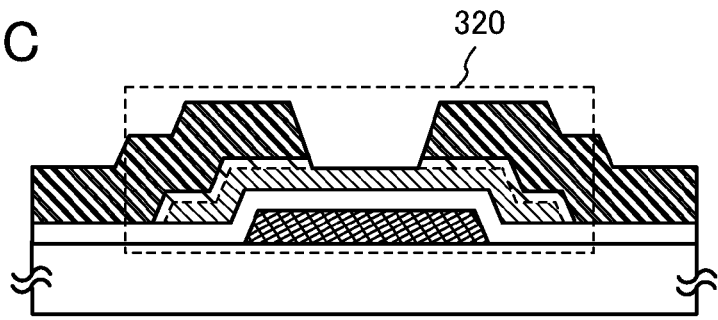
Figure 4D:
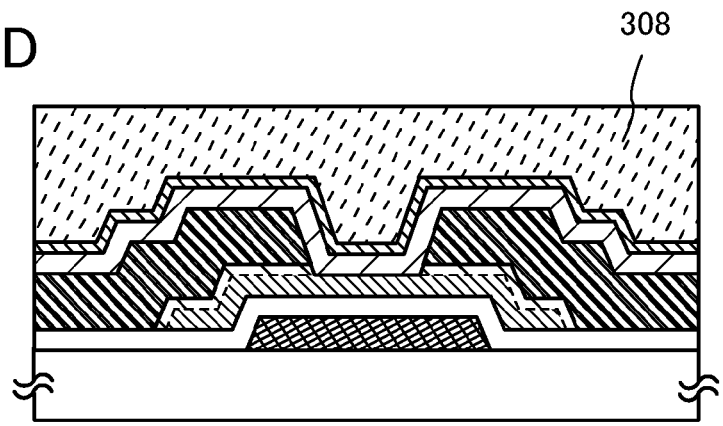

Next, in accordance with the step of FIG. 3B, the part of the region 304b of the oxide semiconductor film 303a which is exposed by formation of the source electrode layer 305a and the drain electrode layer 305b is removed (see FIG. 4C).

Through the above-described process, a transistor 320 can be manufactured (see FIG. 4C).

Next, in accordance with the step of FIG. 3C, the insulating film 306 is formed, and the insulating film 307 is formed over the insulating film 306. In accordance with the step of FIG. 3D, the planarization insulating film 308 is formed. Thus, a semiconductor device including the transistor 320 can be manufactured (see FIG. 4D).

In the method for manufacturing a semiconductor device according to one embodiment of the present invention, the region 304b in the vicinity of the surface of the oxide semiconductor film 303a (or in the vicinity of the interface with the conductive film) is made amorphous in forming the conductive film 305 which is to be the source electrode layer 305a and the drain electrode layer 305b. Alternatively, plasma treatment is performed on the surface of the oxide semiconductor film 303a, whereby the region 304b in the surface of the oxide semiconductor film is made amorphous.

By heat treatment performed later, hydrogen in the region 304a (particularly in a region overlapping with the gate electrode layer 301) of the oxide semiconductor film 303a is moved to the region 304b with disordered crystal structure, whereby the concentration of hydrogen contained in the region 304a of the oxide semiconductor film 303a can be reduced. Note that the region 304b having increased hydrogen concentration due to movement of hydrogen can serve as a low-resistance region.

Further, the oxide semiconductor film 303a is provided in contact with the oxide insulating film (at least the insulating film 306) including an oxygen-excess region. By heat treatment, oxygen can be released from the oxide insulating film, and oxygen which is released can be supplied to the oxide semiconductor film 303a. Thus, oxygen vacancies in the region 304a of the oxide semiconductor film 303a can be reduced.

Reduction of hydrogen concentration or oxygen vacancies in the region 304a of the oxide semiconductor film 303a can inhibit generation of carriers, whereby formation of a parasitic channel can be inhibited; thus, a shift in the negative direction of the threshold voltage can be inhibited.

In accordance with one embodiment of the present invention, it is possible to provide a highly reliable semiconductor device by giving stable electrical characteristics to the transistor 310 and the transistor 320 each including an oxide semiconductor film.

The structures, methods, and the like described in this embodiment can be combined as appropriate with any of the other structures, methods, and the like described in the other embodiments.

(Embodiment 3)

In this embodiment, another embodiment of a semiconductor device will be described with reference to FIGS. 5A to 5C. Description of the same portion as or a portion having a function similar to that in any of the above embodiments, and a manufacturing step similar to that in any of the above embodiments is not repeated.

Figure 5A:
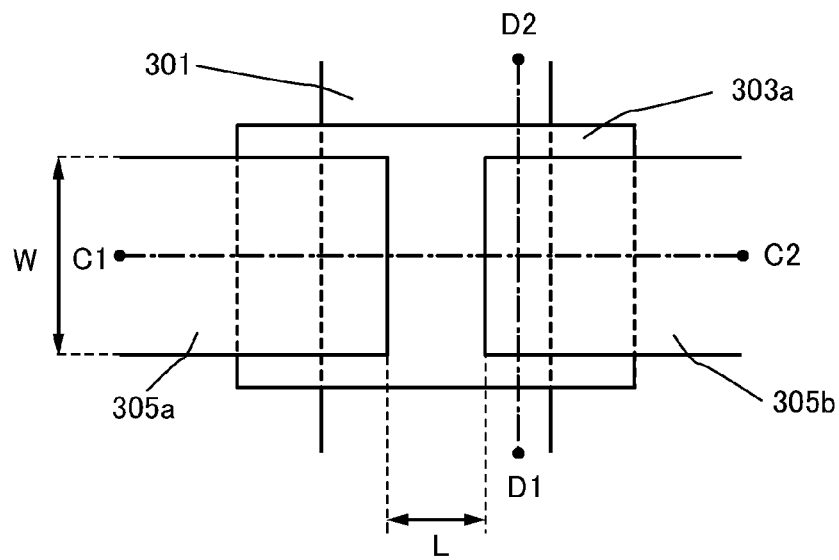
FIGS. 5A to 5C are a plan view and cross-sectional views which illustrate one embodiment of a semiconductor device.
Figure 5B:
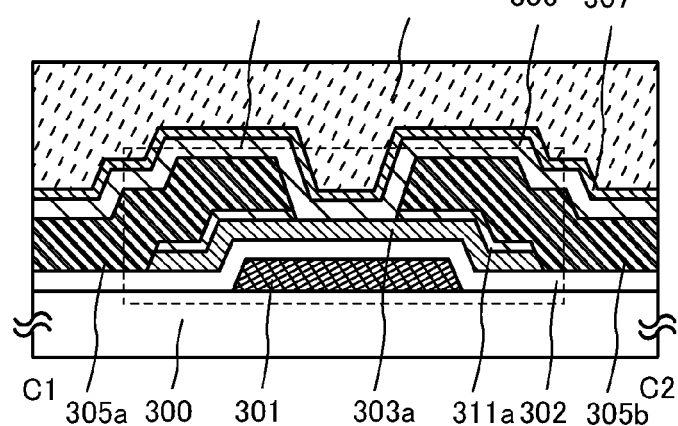
Figure 5C:
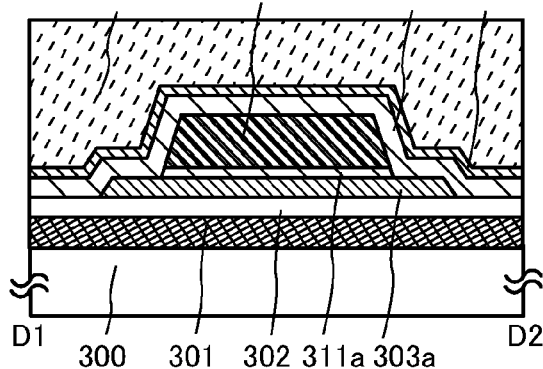

A transistor 330 shown in FIGS. 5A to 5C is an example of a bottom-gate transistor. FIG. 5A is a plan view of the transistor 330. FIG. 5B is a cross-sectional view along line C1-C2 in FIG. 5A (cross-sectional view in the channel length L direction). FIG. 5C is a cross-sectional view along line D1-D2 in FIG. 5A (cross-sectional view in the channel width W direction). Further, in FIG. 5A, some components of the transistor 330 (e.g., a gate insulating film 302) are not illustrated to avoid complexity.

The transistor 330 shown in FIGS. 5A to 5C includes a gate electrode layer 301 over a substrate 300 having an insulating surface, the gate insulating film 302 over the gate electrode layer 301, an oxide semiconductor film provided over the gate insulating film 302 in a region overlapping with the gate electrode layer 301, and a source electrode layer 305a and a drain electrode layer 305b which are in contact with the oxide semiconductor film. Further, an insulating film 306, an insulating film 307, and a planarization insulating film 308 are provided to cover the transistor 330.

In the transistor 330 shown in FIGS. 5A to 5C, in this embodiment, the oxide semiconductor film is formed with a two-layer structure including an oxide semiconductor film 303a and an oxide semiconductor film 311a.

The oxide semiconductor film 303a and the oxide semiconductor film 311a contain at least indium. In particular, indium and zinc are preferably contained.

In this embodiment, description is given on the assumption that the oxide semiconductor film 303a is a CAAC-OS film and the oxide semiconductor film 311a is an amorphous film; however, the oxide semiconductor film 303a may be a single crystal film, a polycrystalline film, or an amorphous film.

A channel is formed in a portion of the oxide semiconductor film 303a which overlaps with the gate electrode layer 301. Therefore, the oxide semiconductor film 303a in any of the above crystal states is preferably purified by reduction of impurities such as water or hydrogen and by reduction of oxygen vacancies. A purified oxide semiconductor is an intrinsic (i-type) semiconductor or a substantially i-type semiconductor. Thus, a transistor including the oxide semiconductor in a portion where a channel is formed has characteristics of very small off-state current. Further, with the use of the oxide semiconductor for the portion where a channel is formed, a shift in the negative direction of the threshold voltage of the transistor can be inhibited.

Specifically, the hydrogen concentration of the purified oxide semiconductor that is measured by secondary ion mass spectrometry (SIMS) is less than $5\times10^{18}/cm^3$, preferably less than or equal to $5\times10^{17}/cm^3$, more preferably less than or equal to $1\times10^{16}/cm^3$. In addition, the carrier density of the oxide semiconductor film that can be measured by Hall effect measurement is less than $1\times10^{14}/cm^3$, preferably less than $1\times10^{12}/cm^3$, more preferably less than $1\times10^{11}/cm^3$. Furthermore, the band gap of the oxide semiconductor is 2 eV or more, preferably 2.5 eV or more, more preferably 3 eV or more. A transistor including the oxide semiconductor which is purified by sufficient reduction of the concentration of impurities such as water or hydrogen and by reduction of oxygen vacancies has characteristics of very small off-state current. Further, with the use of the oxide semiconductor for the portion where a channel is formed, a shift in the negative direction of the threshold voltage of the transistor can be inhibited.

Further, the hydrogen concentration of the oxide semiconductor film 311a that is measured by secondary ion mass spectrometry (SIMS) is greater than or equal to $5\times10^{18}/cm^3$.

Further, the oxide semiconductor film 311a may include, in addition to hydrogen, one or more of elements of Group 15 in the periodic table (e.g., nitrogen, phosphorus, and arsenic), elements of Group 13 in the periodic table (e.g., boron, aluminum, gallium, and indium), tungsten, molybdenum, and rare gas elements (e.g., helium, neon, argon, and xenon), for example.

When the oxide semiconductor film 311a includes any of the above-described elements, the oxide semiconductor film 311a can have higher conductivity than the oxide semiconductor film 303a. Therefore, the oxide semiconductor film 311a can serve as a low-resistance region.

Oxygen vacancies and hydrogen are reduced in the oxide semiconductor film 303a, whereby generation of carriers can be inhibited. Thus, formation of a parasitic channel can be inhibited, and therefore, a shift in the negative direction of the threshold voltage can be inhibited.

The structures, methods, and the like described in this embodiment can be combined as appropriate with any of the other structures, methods, and the like described in the other embodiments.

(Embodiment 4)

In this embodiment, an example of a method for manufacturing a semiconductor device including the transistor 330 shown in FIGS. 5A to 5C will be described with reference to FIGS. 6A to 6D and FIGS. 7A to 7D. Description of the same portion as or a portion having a function similar to that in any of the above embodiments, and a manufacturing step similar to that in any of the above embodiments is not repeated.

First, in a manner similar to the step of FIG. 2A, a conductive film which is to be the gate electrode layer (including a wiring formed using the same layer as the gate electrode layer) is formed over the substrate 300. Next, in a photolithography process, a resist mask is formed over the conductive film and selective etching is performed on the conductive film, whereby the gate electrode layer 301 is formed. Then, the gate insulating film 302 is formed over the gate electrode layer 301 (see FIG. 6A).

Next, in a manner similar to the step of FIG. 2B, an oxide semiconductor film 303 is formed over the gate insulating film 302. Then, an oxide semiconductor film 311 is formed over the oxide semiconductor film 303 (see FIG. 6B).

In this embodiment, the oxide semiconductor film 303 is a CAAC-OS film, and the oxide semiconductor film 311 is an amorphous film. The thickness of the oxide semiconductor film 311 is preferably greater than or equal to 1 nm and less than 10 nm.

The heat treatment for dehydration or dehydrogenation may be performed after the oxide semiconductor film 303 is formed, after the oxide semiconductor film 311 is formed, or after the oxide semiconductor film 303 and the oxide semiconductor film 311 are processed into an island shape. The heat treatment for dehydration or dehydrogenation may be performed more than once, and may also serve as another heat treatment.

When the heat treatment is performed with the gate insulating film 302 covered with at least the oxide semiconductor film 303 before the oxide semiconductor film 303 and the oxide semiconductor film 311 are processed into an island shape, oxygen contained in the gate insulating film 302 can be prevented from being released to the outside by the heat treatment.

Figure 6A:
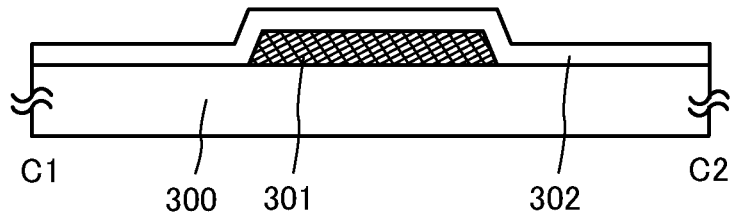
FIGS. 6A to 6D are cross-sectional views which illustrate one embodiment of a method for manufacturing a semiconductor device.
Figure 6B:
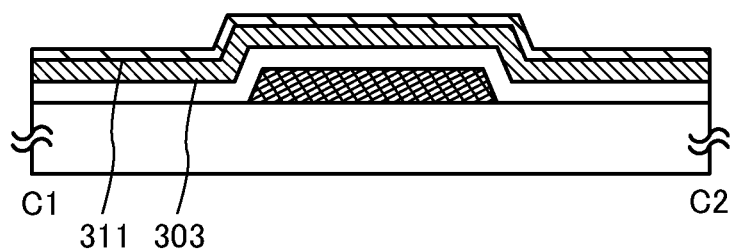
Figure 6C:
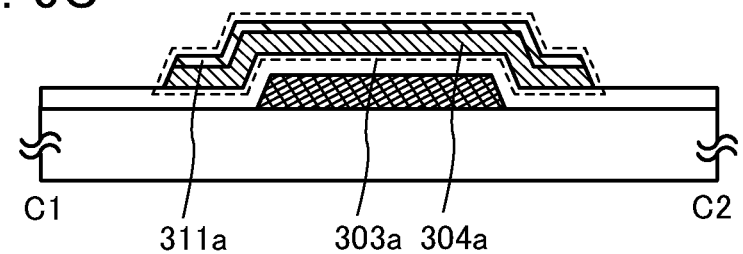

Next, in a manner similar to the step of FIG. 2C, in a photolithography process, a resist mask is formed over the oxide semiconductor film 311 and selective etching is performed, whereby the island-shaped oxide semiconductor films 311a and 303a are formed (see FIG. 6C).

Figure 6D:
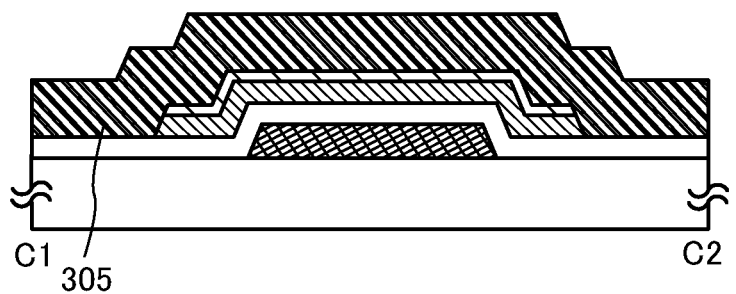

Next, in a manner similar to the step of FIG. 2D, a conductive film 305 which is to be the source electrode layer and the drain electrode layer (including a wiring formed using the same layer as the source electrode layer and the drain electrode layer) is formed over the gate electrode layer 301, the gate insulating film 302, and the oxide semiconductor film 311a (see FIG. 6D).

In the case where the oxide semiconductor film 303a is a CAAC-OS film, in forming the conductive film 305, a crystal structure of a crystal part in a portion in the vicinity of the interface with the conductive film 305 might be disordered. Thus, the proportion of a crystal part to an amorphous part in the portion in the vicinity of the interface with the conductive film 305 might be reduced as compared to the proportion of a crystal part to an amorphous part in a remaining portion of the oxide semiconductor film 303a except the portion in the vicinity of the interface with the conductive film 305. In the case where the oxide semiconductor film 303a is a film having crystallinity such as a single crystal film or a polycrystalline film, a crystal structure of crystal in the portion in the vicinity of the interface with the conductive film 305 is disordered. Thus, crystallinity of the portion is lowered, and in some cases, the portion becomes amorphous.

In this embodiment, since the oxide semiconductor film 311a is an amorphous film, a large number of dangling bonds, distortions between lattices, voids, and oxygen vacancies might be included in the oxide semiconductor film 311a. Also in the case where the oxide semiconductor film 311a is an amorphous film, in forming the conductive film 305, dangling bonds, distortions between lattices, voids, and oxygen vacancies might be formed in the oxide semiconductor film 311a.

Therefore, hydrogen is moved to the dangling bonds, distortions between lattices, voids, and oxygen vacancies in the oxide semiconductor film 311a. By performing heat treatment on the oxide semiconductor film 303a and the oxide semiconductor film 311a, hydrogen contained in the oxide semiconductor film 303a is drawn to the oxide semiconductor film 311a.

The heat treatment for moving hydrogen to the oxide semiconductor film 311a is performed at a temperature, for example, higher than or equal to 100° C. and lower than or equal to the strain point of the substrate, preferably higher than or equal to 200° C. and lower than or equal to 400° C.

By performing the heat treatment, hydrogen contained in the oxide semiconductor film 303a is drawn to the oxide semiconductor film 311a, whereby the hydrogen concentration of the oxide semiconductor film 303a can be reduced. Hydrogen moved to the oxide semiconductor film 311a is fixed; therefore, hydrogen is hardly diffused again into the oxide semiconductor film 303a. Thus, the hydrogen concentration of the oxide semiconductor film 311a is increased by hydrogen which is drawn, whereby the oxide semiconductor film 311a can have higher conductivity than the region 304a in the oxide semiconductor film 303a. Therefore, the oxide semiconductor film 311a can serve as a low-resistance region.

Note that the heat treatment for moving hydrogen to the oxide semiconductor film 311a may be performed after formation of the source electrode layer and the drain electrode layer or may be performed before and after formation of the source electrode layer and the drain electrode layer. The heat treatment for moving hydrogen from the oxide semiconductor film 303a to the oxide semiconductor film 311a may be performed more than once, and may also serve as another heat treatment.

Figure 7A:
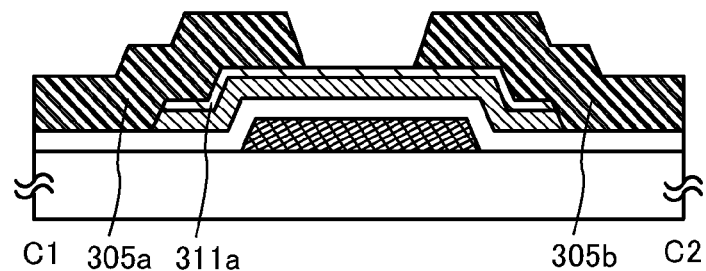
FIGS. 7A to 7D are cross-sectional views which illustrate one embodiment of a method for manufacturing a semiconductor device.

Next, in a photolithography process, a resist mask is formed over the conductive film 305 and selective etching is performed, whereby the source electrode layer 305a and the drain electrode layer 305b are formed (see FIG. 7A). At this time, the oxide semiconductor film 311a is exposed. After the source electrode layer 305a and the drain electrode layer 305b are formed, the resist mask is removed.

Since hydrogen is drawn to the oxide semiconductor film 311a, the hydrogen concentration of the oxide semiconductor film 311a is higher than that in the oxide semiconductor film 303a. Therefore, if a transistor including the oxide semiconductor film 311a having high hydrogen concentration is manufactured, the oxide semiconductor film 311a may adversely affect the transistor in some cases. For example, if a region having high hydrogen concentration is provided over the oxide semiconductor film 303a, e.g., in a portion where a back channel is formed, carriers generated by oxygen vacancies or hydrogen are stored, whereby a parasitic channel is formed; thus, leakage current is easily generated and threshold voltage might vary.

Alternatively, plasma treatment using an etching gas containing halogen is favorably employed to etch the conductive film 305 formed over the oxide semiconductor film 311a. However, if the oxide semiconductor film is exposed to the etching gas containing halogen, the halogen (e.g., chlorine or fluorine) contained in the etching gas extracts oxygen in the oxide semiconductor film 311a in some cases, which might cause oxygen vacancies to be formed in the vicinity of a surface of the oxide semiconductor film 311a where plasma treatment is employed. Further, if the halogen contained in the etching gas remains on a surface of the oxide semiconductor film 311a and in the vicinity thereof after the etching, oxygen vacancies might be formed in the oxide semiconductor film 311a. Such oxygen vacancies in the oxide semiconductor film 311a might cause a top surface (back channel) side and a side edge portion of the oxide semiconductor film 311a to have lower resistance (n-type conductivity), resulting in formation of a parasitic channel.

Alternatively, in forming the conductive film 305, an element contained in the conductive film 305 is added to the oxide semiconductor film 311a in some cases.

Figure 7B:
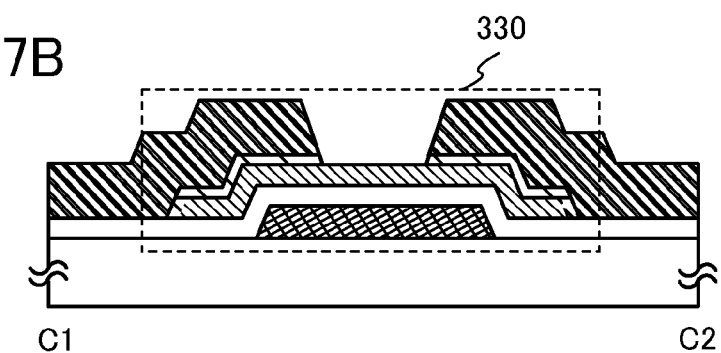

Therefore, to prevent a parasitic channel from being formed by decrease in resistance of the back channel side and the side edge portion of the oxide semiconductor film, a part of the oxide semiconductor film 311a which is exposed by the formation of the source electrode layer 305a and the drain electrode layer 305b is removed (see FIG. 7B). In a step of removing the part of the oxide semiconductor film 311a, it is preferable that the etching condition for the oxide semiconductor film 303a be optimized in order to prevent the oxide semiconductor film 303a from being etched to be removed or divided.

The step of removing the oxide semiconductor film 311a may be performed in a manner similar to the step of removing the region 304b of the oxide semiconductor film 303a which is described in the step of FIG. 3B; thus, detailed description thereof is omitted.

The part of the oxide semiconductor film 311a in which a crystal part or crystal is destroyed and hydrogen concentration is higher than that of the oxide semiconductor film 303a is removed in the portion where a back channel is formed or the side edge portion of the oxide semiconductor film 303a, whereby the oxide semiconductor film 303a having low hydrogen concentration can be exposed. Thus, formation of a parasitic channel can be prevented, and generation of leakage current or variation in threshold voltage can be inhibited. Further, the portion in the vicinity of the interface between the oxide semiconductor film 303a and the source layer 305a or the drain electrode layer 305b can serve as a low-resistance region even if hydrogen concentration is high and a halogen remains in the portion.

The removal of the part of the oxide semiconductor film 311a in the portion where a back channel is formed or the side edge portion of the oxide semiconductor film 303a can also lead to removal of contaminants generated when the source electrode layer 305a and the drain electrode layer 305b are processed and contaminants generated when the resist mask is removed.

Through the above-described process, the transistor 330 can be manufactured (see FIG. 7B).

Figure 7C:
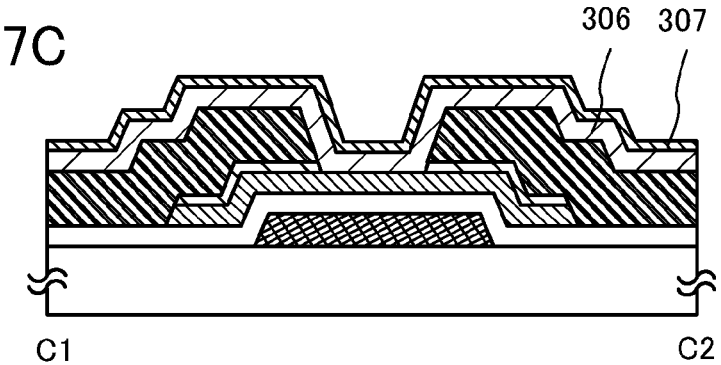

Next, in a manner similar to the step of FIG. 3C, the insulating film 306 is formed over the oxide semiconductor film 303a, the source electrode layer 305a, and the drain electrode layer 305b (see FIG. 7C). Next, the insulating film 306 is subjected to oxygen doping treatment. An aluminum film is then formed, and oxygen doping treatment is further performed, whereby an aluminum oxide film which is an oxide of the aluminum film is formed. The aluminum oxide film is used for the insulating film 307.

Figure 3D:
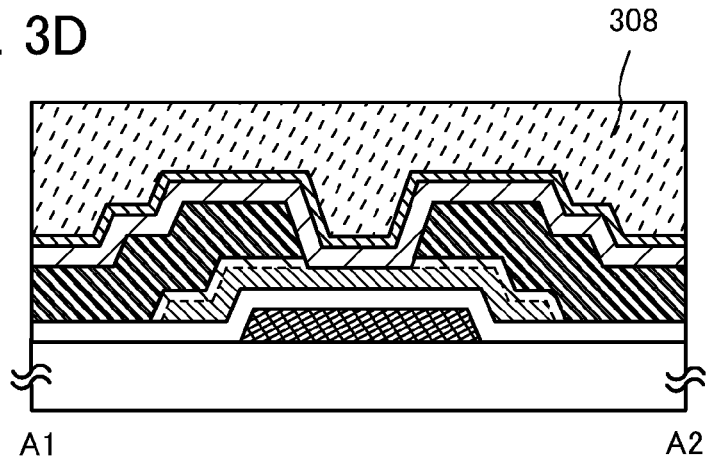

Next, in a manner similar to the step of FIG. 3D, the planarization insulating film 308 is formed over the insulating film 307.

Figure 7D:
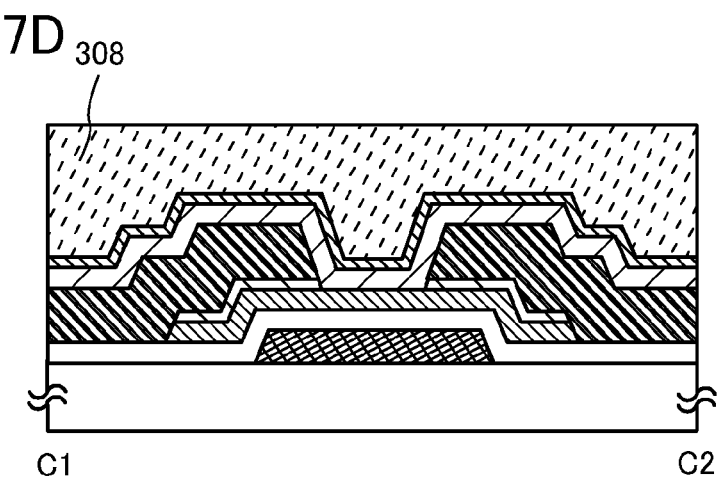

Through the above-described process, a semiconductor device including the transistor 330 can be manufactured (see FIG. 7D).

In the method for manufacturing a semiconductor device according to one embodiment of the present invention, the oxide semiconductor film is formed with a two-layer structure including the oxide semiconductor film 303a and the oxide semiconductor film 311a. The oxide semiconductor film 311a is an amorphous film.

By heat treatment performed later, hydrogen in the oxide semiconductor film 303a (particularly in a portion overlapping with the gate electrode layer 301) is drawn to the oxide semiconductor film 311a which is the amorphous film, whereby the concentration of hydrogen contained in the oxide semiconductor film 303a can be reduced. Note that the oxide semiconductor film 311a having increased hydrogen concentration due to hydrogen which is drawn can serve as a low-resistance region.

Further, the oxide semiconductor film 303a is provided in contact with the oxide insulating film (at least the insulating film 306) including an oxygen-excess region. By heat treatment, oxygen can be released from the oxide insulating film, and oxygen which is released can be supplied to the oxide semiconductor film 303a. Thus, oxygen vacancies in the oxide semiconductor film 303a can be reduced.

Reduction of hydrogen concentration or oxygen vacancies in the oxide semiconductor film 303a can inhibit generation of carriers, whereby formation of a parasitic channel can be inhibited; thus, a shift in the negative direction of the threshold voltage can be inhibited.

In accordance with one embodiment of the present invention, it is possible to provide a highly reliable semiconductor device by giving stable electrical characteristics to the transistor 330 including an oxide semiconductor film.

The structures, methods, and the like described in this embodiment can be combined as appropriate with any of the other structures, methods, and the like described in the other embodiments.

(Embodiment 5)

In this embodiment, another embodiment of a semiconductor device will be described with reference to FIGS. 8A to 8C, FIGS. 9A to 9C, FIGS. 10A to 10C, FIGS. 11A to 11C, and FIG. 22. In this embodiment, a transistor including an oxide semiconductor film is described as an example of the semiconductor device.

The transistor may have a single-gate structure in which one channel formation region is formed, a double-gate structure in which two channel formation regions are formed, or a triple-gate structure in which three channel formation regions are formed. Further, a transistor may have a dual-gate structure including two gate electrode layers positioned above and below a channel formation region with gate insulating films interposed therebetween.

Figure 8A:
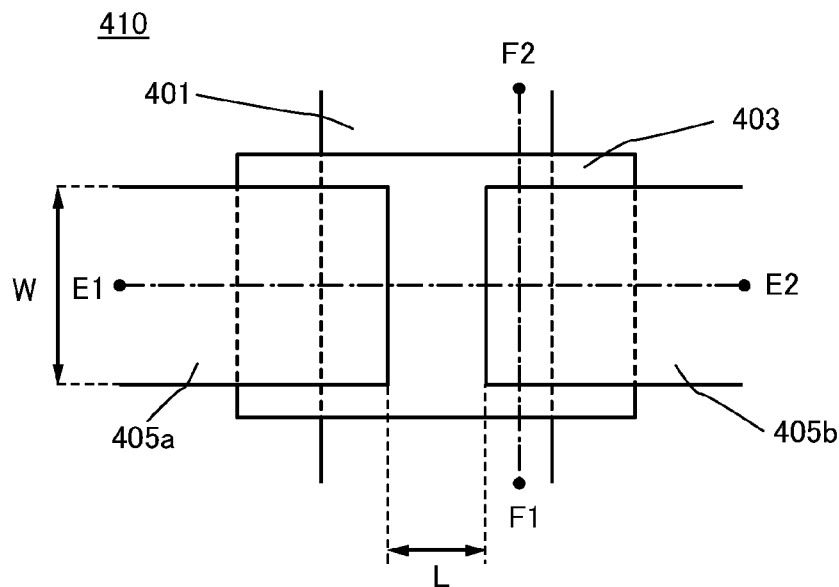
FIGS. 8A to 8C are a plan view and cross-sectional views which illustrate one embodiment of a semiconductor device.
Figure 8B:
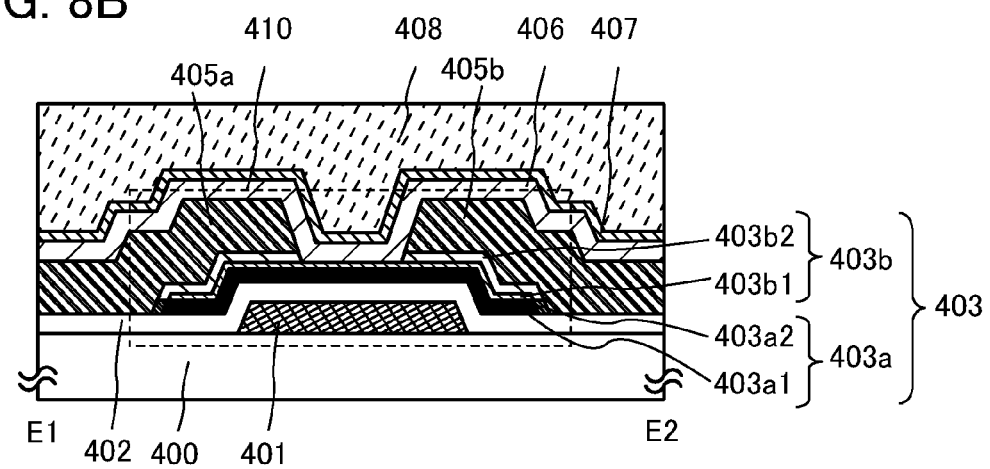
Figure 8C:
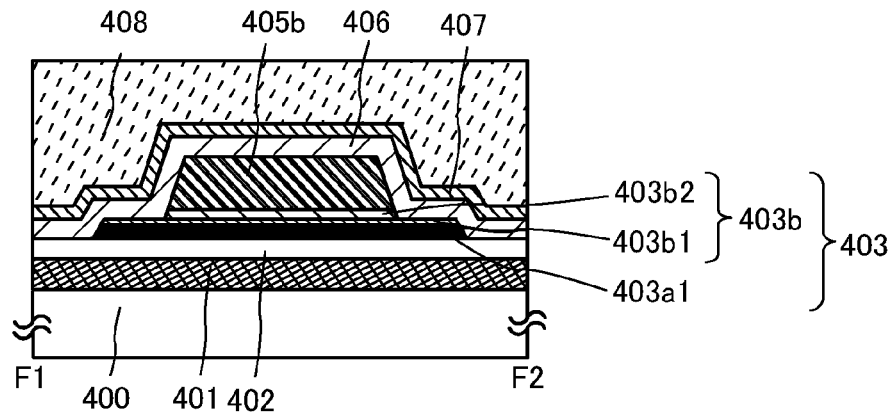

A transistor 410 shown in FIGS. 8A to 8C is an example of a transistor which is one of bottom-gate transistors (also referred to as an inverted-staggered transistors). FIG. 8A is a plan view of the transistor 410. FIG. 8B is a cross-sectional view along line E1-E2 in FIG. 8A (cross-sectional view in the channel length L direction). FIG. 8C is a cross-sectional view along line F1-F2 in FIG. 8A (cross-sectional view in the channel width W direction). Further, in FIG. 8A, some components of the transistor 410 (e.g., a gate insulating film 402) are not illustrated to avoid complexity.

The transistor 410 shown in FIGS. 8A to 8C includes a gate electrode layer 401 over a substrate 400 having an insulating surface, the gate insulating film 402 over the gate electrode layer 401, an oxide semiconductor film 403 provided in a region overlapping with the gate electrode layer 401 over the gate insulating film 402, and a source electrode layer 405a and a drain electrode layer 405b which are in contact with the oxide semiconductor film 403. Further, an insulating film 406, an insulating film 407, and a planarization insulating film 408 are provided to cover the transistor 410.

The oxide semiconductor film 403 contains at least indium. In particular, indium and zinc are preferably contained. In addition, as a stabilizer for reducing variation in electrical characteristics of a transistor including the oxide semiconductor, one or more selected from gallium (Ga), tin (Sn), hafnium (Hf), aluminum (Al), and zirconium (Zr) is/are contained.

Note that here, for example, an In—Ga—Zn-based oxide means an oxide containing In, Ga, and Zn as main components, and there is no limitation on the ratio of In:Ga:Zn. The In—Ga—Zn-based oxide may contain a metal element other than In, Ga, and Zn.

In the transistor 410 shown in FIGS. 8A to 8C, the oxide semiconductor film 403 includes a first layer 403a and a second layer 403b.

The first layer 403a and the second layer 403b are formed using oxide semiconductors with different compositions. For example, elements contained in oxide semiconductors of the first layer 403a and the second layer 403b may be different. Further, constituent elements of the first layer 403a and the second layer 403b may be the same, and the compositions of the constituent elements of the first layer 403a and the second layer 403b may be different.

At this time, the second layer 403b which is farther from the gate electrode layer (on the back channel side) contains many stabilizers of gallium (Ga) or the like. Here, in Ga, the formation energy of oxygen vacancies is higher and thus oxygen vacancies are easily generated, than in In. Thus, in a transistor including the oxide semiconductor film, carriers derived from oxygen vacancies are less contained; therefore, the off-state current of the transistor can be small. Further, a highly reliable transistor with less variation in electrical characteristics can be manufactured.

For example, in the case of using an In—Ga—Zn-based oxide, the percentage of the Ga content in the second layer 403b of the oxide semiconductor film is preferably higher than that in the first layer 403a. Alternatively, it is preferable that the percentage of the Ga content in the second layer 403b be approximately the same or be higher than that of the In content in the second layer 403b. For example, the second layer 403b can have a composition of In:Ga:Zn=1:1:1 or in the neighborhood of the composition, or a composition of In:Ga:Zn=1:3:2 or in the neighborhood of the composition.

Further, the first layer 403a which is closer to the gate electrode layer (on the channel side) contains much indium (In). In an oxide semiconductor, the s orbitals of heavy metal mainly contribute to carrier transfer, and when the percentage of the In content in the oxide semiconductor is increased, overlaps of the s orbitals are likely to be increased. Therefore, an oxide semiconductor containing much In can have high carrier mobility.

For example, in the case of using an In—Ga—Zn-based oxide, the percentage of the In content in the first layer 403a of the oxide semiconductor film is preferably higher than that in the second layer 403b. Alternatively, it is preferable that the percentage of the In content in the first layer 403a be higher than the percentage of the Ga content in the first layer 403a. For example, the first layer 403a can have a composition of In:Ga:Zn=3:1:2 or in the neighborhood of the composition, or a composition of In:Ga:Zn=2:1:3 or in the neighborhood of the composition.

As described above, an oxide semiconductor containing many stabilizers of Ga or the like is provided on the back channel side, and an oxide semiconductor containing much In is provided on the channel side. Thus, the field-effect mobility of a highly reliable transistor with small off-state current can be further improved.

Note that in this specification and the like, for example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \le r^2$. For example, r may be 0.05. The same applies to other oxides.

Further, the oxide semiconductor film 403 is preferably a CAAC-OS (c-axis aligned crystalline oxide semiconductor) film.

The CAAC-OS film is not completely single crystal nor completely amorphous. The CAAC-OS film is an oxide semiconductor film which is non-single-crystal and has a crystal-amorphous mixed phase structure where a crystal part and an amorphous part are included. Note that in most cases, the crystal part fits inside a cube whose one side is less than 100 nm From an observation image obtained with a transmission electron microscope (TEM), the boundary between an amorphous part and a crystal part in the CAAC-OS film is not clear. Further, even in the case where a crystal part and another crystal part are close to each other, the boundary is not clear. Furthermore, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With the use of the CAAC-OS film in a transistor, change in electrical characteristics of the transistor due to irradiation with visible light or ultraviolet light is small. Thus, the transistor has high reliability.

In this embodiment, description is given on the assumption that the oxide semiconductor film 403 is a CAAC-OS film; however, the oxide semiconductor film 403 may be in a single crystal state or a polycrystalline (also referred to as polycrystal) state.

In the transistor 410 shown in FIGS. 8A to 8C, the first layer 403a includes a region 403a1 and a region 403a2, and the second layer 403b includes a region 403b1 and a region 403b2. Further, in the oxide semiconductor film 403, regions in the vicinity of the interface with the source electrode layer 405a or the drain electrode layer 405b correspond to the region 403a2 and the region 403b2, and remaining portions of the oxide semiconductor film 403 except the region 403a2 and 403b2 correspond to the region 403a1 and the region 403b1. For example, the region 403a2 and the region 403b2 in the vicinity of the interface with the source electrode layer 405a or the drain electrode layer 405b can be collectively referred to as a first region, while the region 403a1 and the region 403b1 that are remaining portions of the oxide semiconductor film 403 except the first region can be collectively referred to as a second region.

The proportion of a crystal part to an amorphous part in the region 403a1 and the region 403b1 of the oxide semiconductor film 403 can be higher than the proportion of a crystal part to an amorphous part in the region 403a2 and the region 403b2. The proportion of a crystal part to an amorphous part in the region 403a2 and the region 403b2 can be lower than the proportion of a crystal part to an amorphous part in the region 403a1 and the region 403b1.

The region 403a1 and the region 403b1 can be a CAAC-OS film, a single crystal film, or a polycrystalline (also referred to as polycrystal) film. The region 403a2 and the region 403b2 are regions having higher proportion of an amorphous part than the region 403a1 and the region 403b1; the region 403a2 and the region 403b2 may entirely be occupied by an amorphous part.

In FIGS. 8A to 8C, the region 403a1 and the region 403b1 serve as channel formation regions. The region 403a2 and the region 403b2 do not serve as channel formation regions because the region 403a2 and the region 403b2 overlap with the source electrode layer 405a or the drain electrode layer 405b. As described above, with the use of a CAAC-OS film, a single crystal film, or a polycrystalline film for a channel formation region, generation of leakage current or variation in threshold voltage can be inhibited.

In the case where at least one of the region 403a2 and the region 403b2 is an amorphous oxide semiconductor, internal stress or external stress of the oxide semiconductor film 403 is relieved, variation in characteristics of a transistor is reduced, and reliability of the transistor can be further improved.

The region 403a1 and the region 403b1 can be purified by reduction of impurities such as water and hydrogen and by reduction of oxygen vacancies. Further, the region 403a2 and the region 403b2 can be low-resistance regions.

Parts of the region 403a1 and the region 403b1 which do not overlap with the source electrode layer or the drain electrode layer but overlap with the gate electrode layer 401 serve as the channel formation regions. The region 403a1 and the region 403b1 are preferably purified by reduction of impurities such as water or hydrogen and by reduction of oxygen vacancies. A purified oxide semiconductor (purified OS) is an intrinsic (i-type) semiconductor or a substantially i-type semiconductor. Thus, a transistor including the oxide semiconductor in a portion where a channel is formed has characteristics of very small off-state current.

Specifically, the hydrogen concentration of the region 403a1 and the region 403b1 that is measured by secondary ion mass spectrometry (SIMS) can be less than $5 \times 10^{18}/cm^3$, preferably less than or equal to $5 \times 10^{17}/cm^3$, more preferably less than or equal to $1 \times 10^{16}/cm^3$. In addition, the carrier density of the oxide semiconductor film that can be measured by Hall effect measurement can be less than $1 \times 10^{14}/cm^3$, preferably less than $1 \times 10^{12}/cm^3$, more preferably less than $1 \times 10^{11}/cm^3$. Furthermore, the band gap of the oxide semiconductor is 2 eV or more, preferably 2.5 eV or more, more preferably 3 eV or more. With the use of, for the portion where a channel is formed, an oxide semiconductor which is purified by sufficient reduction of the concentration of impurities such as water and hydrogen and by reduction of oxygen vacancies, the off-state current of the transistor can be decreased.

Further, in the region 403a2 and the region 403b2 in the vicinity of the interface at which the oxide semiconductor film 403 is in contact with the source electrode layer 405a or the drain electrode layer 405b, the hydrogen concentration that is measured by secondary ion mass spectrometry (SIMS) is preferably greater than or equal to $5 \times 10^{18}/cm^3$. The region 403a2 and the region 403b2 of the oxide semiconductor film 403 can serve as low-resistance regions.

Further, the region 403a2 and the region 403b2 in the vicinity of the interface at which the oxide semiconductor film 403 is in contact with the source electrode layer 405a or the drain electrode layer 405b may include, in addition to hydrogen, one or more of elements of Group 15 in the periodic table (e.g., nitrogen, phosphorus, and arsenic), elements of Group 13 in the periodic table (e.g., boron, aluminum, gallium, and indium), tungsten, molybdenum, and rare gas elements (e.g., helium, neon, argon, and xenon), for example.

When the region 403a2 and the region 403b2 of the oxide semiconductor film 403 include any of the above-described elements, the region 403a2 and the region 403b2 can have higher conductivity than the region 403a1 and the region 403b1. Therefore, the region 403a2 and the region 403b2 of the oxide semiconductor film 403 can serve as low-resistance regions.

In the region 403a1 and the region 403b1 of the oxide semiconductor film 403, oxygen vacancies and hydrogen are reduced in the channel formation regions, whereby generation of carriers can be inhibited. Thus, formation of a parasitic channel can be inhibited, and therefore, a shift in the negative direction of the threshold voltage can be inhibited.

Note that in FIGS. 8A to 8C, the oxide semiconductor film 403 is divided into the region 403a1, the region 403a2, the region 403b1, and the region 403b2, which means that the oxide semiconductor film is functionally divided into four regions in terms of electrical characteristics. That is, the oxide semiconductor film 403 formed of one layer is acceptable as long as the layer includes functionally divided four regions; the boundary between the four regions is not necessarily clear.

Although the oxide semiconductor film has a two-layer structure including a stack of the first layer 403a and the second layer 403b in FIGS. 8A to 8C, the oxide semiconductor film may have a three-layer structure including a stack of three or more layers. For example, three or more oxide semiconductor films having different compositions may be stacked. Further, three or more oxide semiconductor films, in which the constituent elements of the oxide semiconductor films are the same and the compositions of the constituent elements of the oxide semiconductor films are different, may be stacked.

Further, FIGS. 8A to 8C show the structure in which the first layer 403a includes the region 403a1 and the region 403a2, the second layer 403b includes the region 403b1 and the region 403b2, and the region 403a2 is provided only in a side edge portion of the oxide semiconductor film 403 which overlaps with the source electrode layer 405a or the drain electrode layer 405b. However, the present invention is not limited thereto.

Figure 9A:
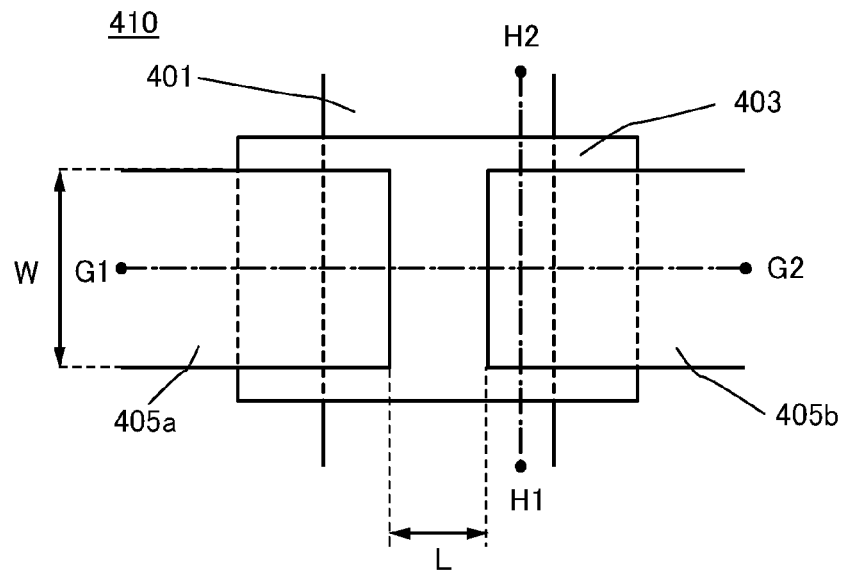
FIGS. 9A to 9C are a plan view and cross-sectional views which illustrate one embodiment of a semiconductor device.
Figure 9B:
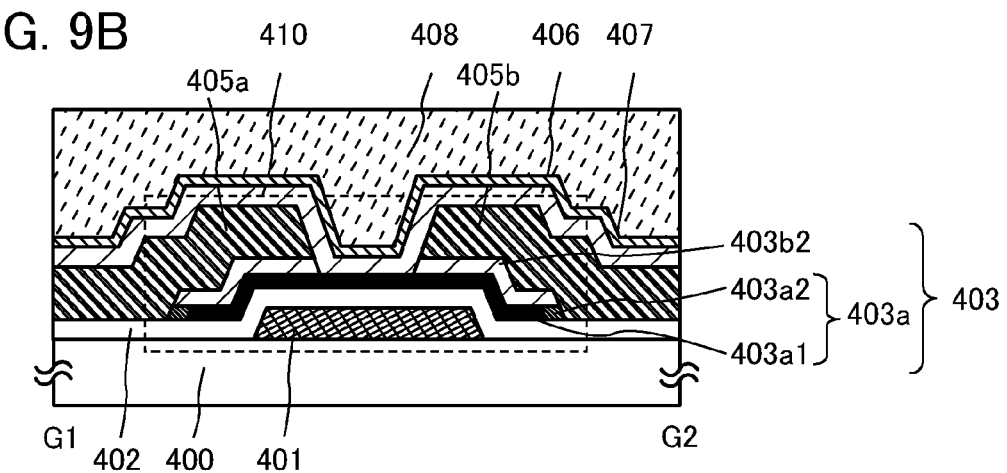
Figure 9C:
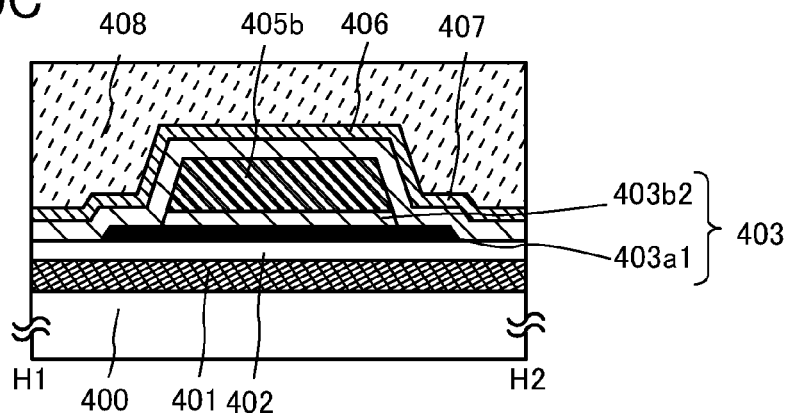

For example, as shown in FIGS. 9A to 9C, the whole of a second layer 403b may be a region where the proportion of an amorphous part is higher than the proportion of a crystal part or a region which is entirely occupied by an amorphous part (a region 403b2). Further, the whole of the second layer 403b may be a low-resistance region (the region 403b2).

Figure 10A:
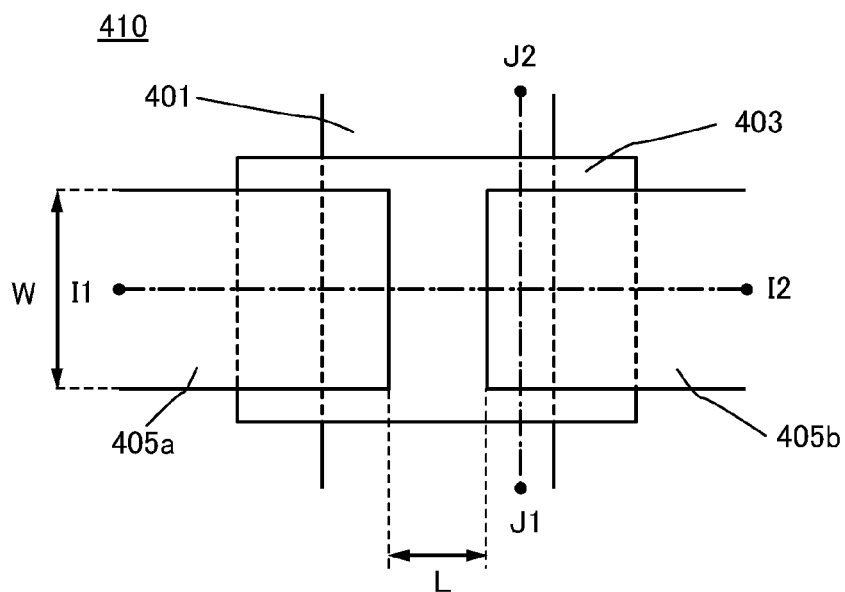
FIGS. 10A to 10C are a plan view and cross-sectional views which illustrate one embodiment of a semiconductor device.
Figure 10B:
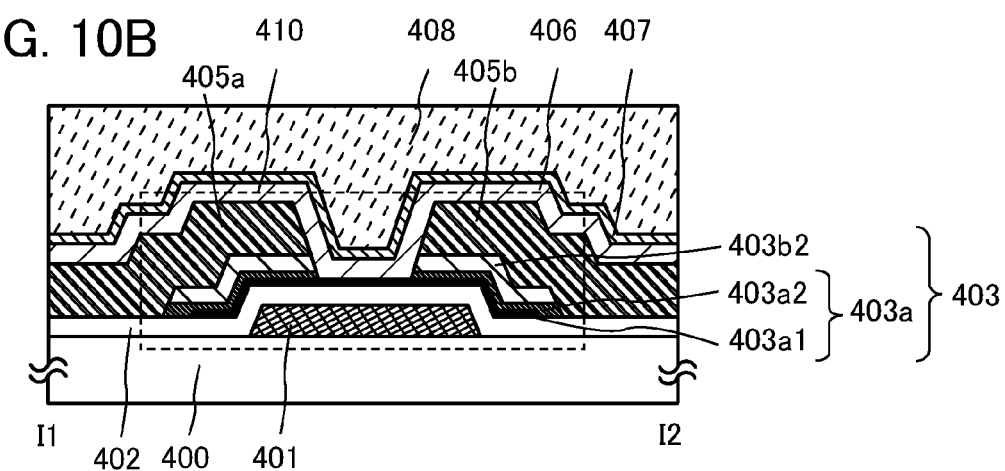
Figure 10C:
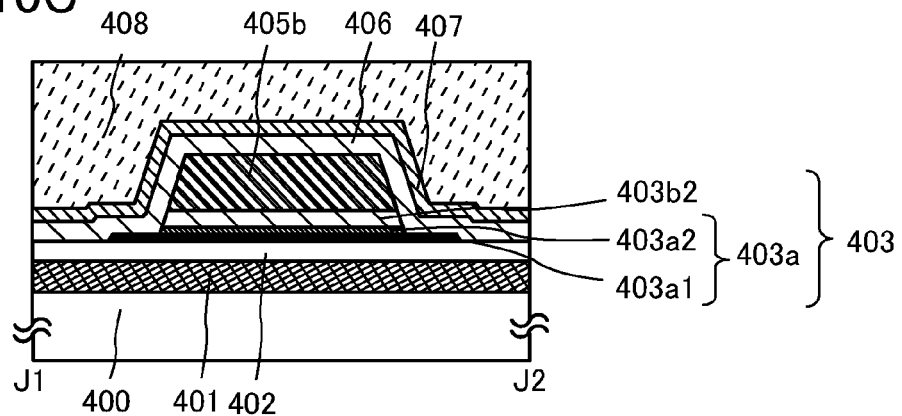

Further, as shown in FIGS. 10A to 10C, the whole of a second layer 403b may be a second region 403b2, and a region 403a2 may be present not only in a side edge portion of an oxide semiconductor film 403 but also in a region overlapping with the source electrode layer 405a or the drain electrode layer 405b.

Figure 11A:
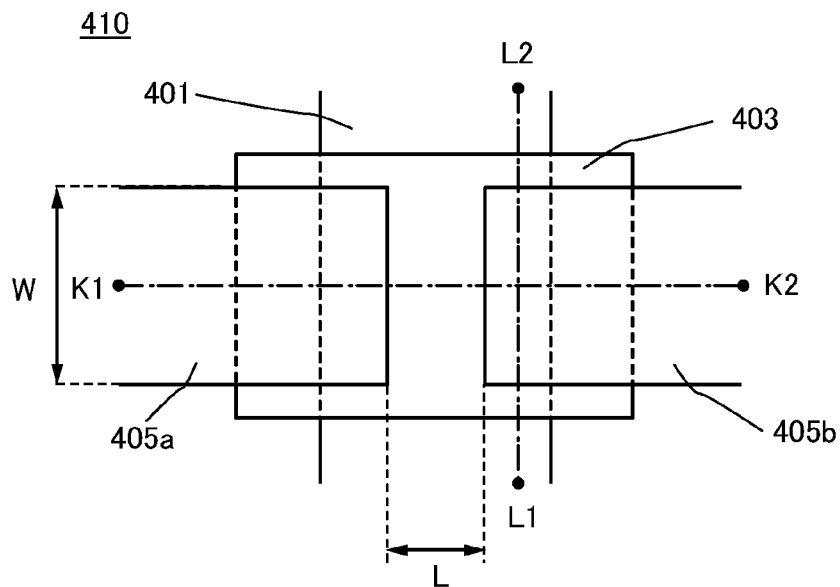
FIGS. 11A to 11C are a plan view and cross-sectional views which illustrate one embodiment of a semiconductor device.
Figure 11B:
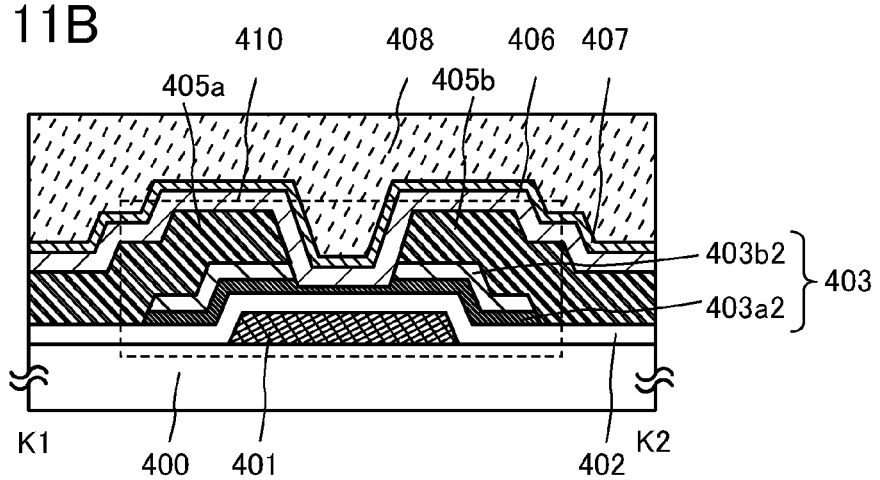
Figure 11C:
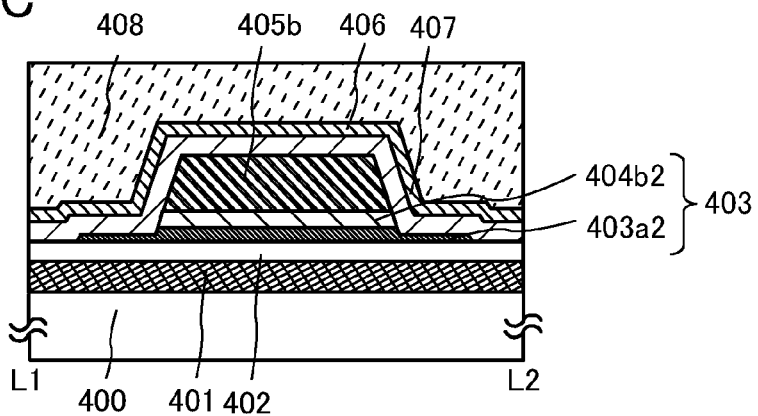

Furthermore, as shown in FIGS. 11A to 11C, a first layer 403a and a second layer 403b may be formed of a region 403a2 and a region 403b2, respectively.

A region with low crystallinity may be sandwiched between a plurality of regions with high crystallinity, or a region with high crystallinity and a region with low crystallinity may be stacked alternately. Similarly, a low-resistance region may be sandwiched between purified regions, or a purified region and a low-resistance region may be stacked alternately.

The insulating film 406 provided in contact with the oxide semiconductor film 403 is preferably an oxide insulating film of silicon oxide, gallium oxide, aluminum oxide, silicon oxynitride, aluminum oxynitride, or the like. Since the insulating film 406 is in contact with the oxide semiconductor film 403, the insulating film 406 preferably includes an oxygen-excess region.

The insulating film 407 provided in contact with the insulating film 406 is preferably a film having a low oxygen-transmitting property. For example, the insulating film 407 is preferably formed using aluminum oxide, silicon nitride, or the like. With the use of the film having a low oxygen-transmitting property for the insulating film 407, release of oxygen contained in the insulating film 406 to the outside can be inhibited. Further, the insulating film 407 is preferably a film having a low hydrogen-transmitting property. With the use of the film having a low hydrogen-transmitting property for the insulating film 407, even if hydrogen is mixed from the outside, hydrogen can be prevented from diffusing into the oxide semiconductor film 403.

In the case where an aluminum oxide film is used for the insulating film 407, the resistivity of the aluminum oxide film is preferably greater than or equal to $1 \times 10^{10}$ Ωm and less than or equal to $1 \times 10^{19}$ Ωm (more preferably greater than or equal to $1 \times 10^{10}$ Ωm and less than or equal to $1 \times 10^{18}$ Ωm, much more preferably greater than or equal to $1 \times 10^{11}$ Ωm and less than or equal to $1 \times 10^{15}$ Ωm). Further, a titanium oxide film or a magnesium oxide film is stacked over an aluminum oxide film, in which case the resistivity of the titanium oxide film or the magnesium oxide film is preferably greater than or equal to $1 \times 10^{10}$ Ωm and less than or equal to $1 \times 10^{19}$ Ωm (more preferably greater than or equal to $1 \times 10^{10}$ Ωm and less than or equal to $1 \times 10^{18}$ Ωm, much more preferably greater than or equal to $1 \times 10^{11}$ Ωm and less than or equal to $1 \times 10^{15}$ Ωm). When a film having resistivity in the above-described range is used for the insulating film 407, electrostatic breakdown of a semiconductor device can be prevented.

Note that the aluminum oxide film preferably has high density (film density higher than or equal to 3.2 g/cm$^3$, preferably higher than or equal to 3.6 g/cm$^3$), in which case the transistor 410 can have stable electrical characteristics. The film density can be measured by Rutherford backscattering spectrometry (RBS) or X-ray reflection (XRR).

Supposing that the composition of an aluminum oxide film is expressed by Al$_2$O$_x$, an aluminum oxide film Al$_2$O$_x$ where x is greater than or equal to 1 and less than or equal to 3.5 is preferably used.

An insulating film serving as an interlayer insulating film (a protective insulating film, a planarization insulating film) may be formed over the insulating film 407. The interlayer insulating film (the protective insulating film, the planarization insulating film) can relieve stress on the insulating film 407 that is a thin film. Accordingly, the insulating film 407 can be prevented from being damaged.

FIGS. 8A to 8C illustrate the case where the planarization insulating film 408 is provided over the insulating film 407. An organic material such as a polyimide resin, an acrylic resin, or a benzocyclobutene resin can be used for the planarization insulating film 408. The planarization insulating film 408 can reduce surface unevenness due to the transistor 410.

In the case where the insulating film 407 is formed using an insulating film having a low hydrogen-transmitting property, hydrogen or water can be prevented from reaching the oxide semiconductor film 403 from the planarization insulating film 408.

Next, a semiconductor device having a structure which is partly different from the semiconductor device shown in FIGS. 8A to 8C will be described with reference to FIG. 22. Note that repetitive description of portions which are the same or portions having functions which are the same as those in portions in FIGS. 8A to 8C is omitted.

Figure 22:
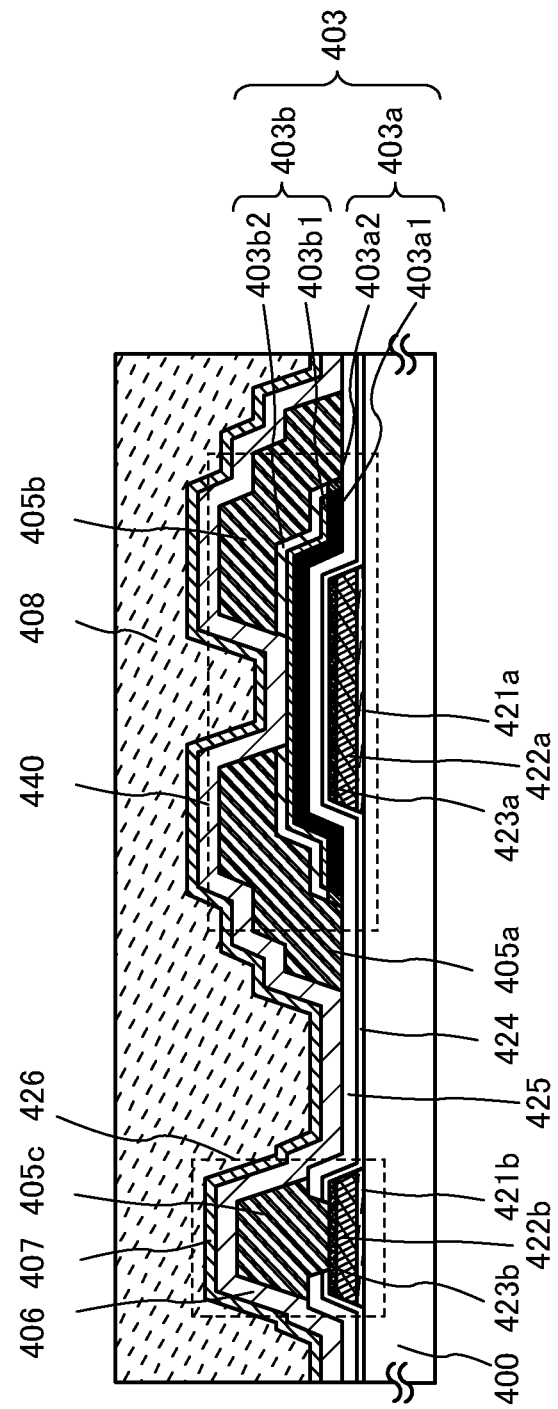
FIG. 22 is a cross-sectional view which illustrates one embodiment of a semiconductor device.

A semiconductor device shown in FIG. 22 includes a transistor 440 and a terminal 426.

The transistor 440 shown in FIG. 22 is a bottom-gate transistor having an oxide semiconductor film which is similar to that of the transistor 410 shown in FIGS. 8A to 8C.

In the transistor 440 shown in FIG. 22, a gate electrode layer has a three-layer structure including a tantalum nitride film 421a, a copper film 422a, and a molybdenum film 423a. Further, a gate wiring in the terminal 426 also has a three-layer structure including a tantalum nitride film 421b, a copper film 422b, and a molybdenum film 423b.

With the use of the copper films 422a and 422b for the gate electrode layer and the gate wiring, wiring resistance can be reduced. Further, the molybdenum films 423a and 423b which are stacked over the copper films 422a and 422b can suppress diffusion of copper into a gate insulating film and an oxide semiconductor film 403. Furthermore, since the work function of the molybdenum film is higher than that of an oxide semiconductor, the molybdenum film is preferably used for the gate electrode layer, in which case the threshold voltage of the transistor 440 can be shifted in the positive direction.

Further, in the transistor 440 shown in FIG. 22, the gate insulating film has a two-layer structure including a silicon nitride film 424 and a silicon oxynitride film 425.

With the use of the silicon nitride film 424 for the gate insulating film, entry of metal, water, or the like from the substrate 400, the gate electrode layer, or the gate wiring into the oxide semiconductor film 403 can be inhibited.

In the terminal 426 shown in FIG. 22, an opening is provided in the gate insulating film. Through the opening, the gate wiring is connected to an electrode layer 405c.

As in the semiconductor device shown in FIGS. 8A to 8C, the semiconductor device shown in FIG. 22 includes an insulating film 406, an insulating film 407, and a planarization insulating film 408 which are provided to cover the transistor 440 and the terminal 426. The insulating film 406 is preferably formed using, for example, a silicon oxynitride film including an oxygen-excess region. The insulating film 407 is preferably formed using, for example, an aluminum oxide film. The planarization insulating film 408 is preferably formed using, for example, an acrylic resin.

The structures, methods, and the like described in this embodiment can be combined as appropriate with any of the other structures, methods, and the like described in the other embodiments.

(Embodiment 6)

In this embodiment, an example of a method for manufacturing a semiconductor device including the transistor 410 shown in FIGS. 8A to 8C will be described with reference to FIGS. 12A to 12D and FIGS. 13A to 13D.

First, the substrate 400 having an insulating surface is prepared.

There is no particular limitation on a substrate that can be used as the substrate 400 as long as it has heat resistance to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400. Alternatively, any of these substrates provided with a semiconductor element may be used as the substrate 400.

The semiconductor device may be manufactured using a flexible substrate as the substrate 400. To manufacture a flexible semiconductor device, the transistor 410 including the oxide semiconductor film 403 may be directly formed over a flexible substrate; or alternatively, the transistor 410 including the oxide semiconductor film 403 may be formed over a manufacturing substrate, and then may be separated from the manufacturing substrate and transferred to a flexible substrate. Note that in order to separate the transistor from the manufacturing substrate and transfer it to the flexible substrate, a separation layer (e.g., tungsten) may be provided between the manufacturing substrate and the transistor 410 including the oxide semiconductor film 403.

Next, an insulating film functioning as a base film may be formed over the substrate 400. The insulating film can be formed by a plasma CVD method or a sputtering method with a single-layer structure or a stacked-layer structure using an oxide insulating material such as silicon oxide, silicon oxynitride, aluminum oxide, aluminum oxynitride, hafnium oxide, or gallium oxide; a nitride insulating material such as silicon nitride, silicon nitride oxide, aluminum nitride, or aluminum nitride oxide; or a mixed material of any of the above materials.

The insulating film preferably has a stacked-layer structure including a silicon nitride film and a silicon oxynitride film, for example. The use of a silicon nitride film can inhibit the entry of metal, hydrogen, or the like from the substrate to the oxide semiconductor film formed later. Further, the use of a silicon oxynitride film can inhibit the entry of a component of the substrate 400 to the oxide semiconductor film formed later which is caused by removal of a part of the substrate 400 due to etching when the gate electrode layer is formed later.

Next, a conductive film which is to be the gate electrode layer (including a wiring formed using the same layer as the gate electrode layer) is formed over the substrate 400.

The conductive film can be formed by a sputtering method or a plasma CVD method. The conductive film can be formed by using a metal material such as molybdenum, titanium, tantalum, tungsten, aluminum, copper, chromium, neodymium, or scandium, or an alloy material containing any of these materials as a main component. The conductive film can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. In addition, the conductive film is formed with a single-layer structure or a stacked-layer structure using any of the above conductive materials.

In the case of forming the conductive film with a single-layer structure, a 100 nm thick tungsten film can be formed, for example. In the case of forming the conductive film with a stacked-layer structure, a 30 nm thick tungsten nitride film, a 200 nm thick copper film, and a 30 nm thick tungsten film may be formed, for example. Further, a 30 nm thick molybdenum film may be formed instead of the 30 nm thick tungsten film. The use of the copper film can reduce wiring resistance. Further, the tungsten film or the molybdenum film that is stacked over the copper film can prevent diffusion of copper. Furthermore, the work function of the tungsten film or the molybdenum film is higher than that of an oxide semiconductor; therefore, the tungsten film or the molybdenum film is preferably used for the gate electrode layer, because the threshold voltage of the transistor can be shifted in the positive direction. Note that the tungsten film and the molybdenum film are not necessarily formed when the gate insulating film which is formed later can prevent diffusion of copper.

Next, in a photolithography process, a resist mask is formed over the conductive film and selective etching is performed, whereby the gate electrode layer 401 is formed. After the gate electrode layer 401 is formed, the resist mask is removed. Note that the conductive film may be etched using either dry etching or wet etching, or using both dry etching and wet etching.

Here, treatment for removing a contaminant generated when the resist mask is removed (this treatment is also referred to as impurity removal treatment) may be performed. For the impurity removal treatment, plasma treatment using oxygen, dinitrogen monoxide, or a rare gas (typically argon); solution treatment using dilute hydrofluoric acid, water, a developer, or a TMAH solution; or the like can be favorably employed.

Next, heat treatment may be performed on the substrate 400 and the gate electrode layer 401. For example, the heat treatment may be performed with an electric furnace at a temperature higher than or equal to 350° C. and lower than or equal to 500° C. for 30 minutes to 1 hour. By performing the heat treatment, hydrogen, water, and the like contained in the substrate 400 or the gate electrode layer 401 can be removed.

Further, a heat treatment apparatus used is not limited to an electric furnace, and an apparatus for heating an object to be processed by heat conduction or heat radiation from a heating element such as a resistance heating element may be alternatively used. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used. For example, in the case of performing the heat treatment using a GRTA apparatus, the heat treatment may be performed at a temperature of 650° C. for 1 minute to 5 minutes.

Figure 12A:
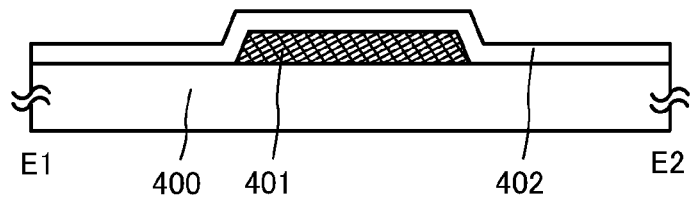
FIGS. 12A to 12D are cross-sectional views which illustrate one embodiment of a method for manufacturing a semiconductor device.

Next, the gate insulating film 402 is formed over the gate electrode layer 401 (see FIG. 12A).

To improve the coverage by the gate insulating film 402, planarization treatment may be performed on a surface of the gate electrode layer 401. It is preferable that the flatness of the surface of the gate electrode layer 401 be good particularly when the thickness of the gate insulating film 402 is small.

The gate insulating film 402 has a thickness greater than or equal to 1 nm and less than or equal to 300 nm and can be formed by a sputtering method, a molecular beam epitaxy (MBE) method, a chemical vapor deposition (CVD) method, a plasma-enhanced chemical vapor deposition (PECVD)

method, a pulsed laser deposition method, an atomic layer deposition (ALD) method, or the like as appropriate.

The gate insulating film 402 can be formed using silicon oxide, gallium oxide, aluminum oxide, silicon nitride, silicon oxynitride, aluminum oxynitride, or silicon nitride oxide. When the gate insulating film 402 is formed using a high-k material such as hafnium oxide, yttrium oxide, hafnium silicate (HfSi$_x$O$_y$ (x>0, y>0)), hafnium silicate to which nitrogen is added (HfSiO$_x$N$_y$ (x>0, y>0)), hafnium aluminate (HfAl$_x$O$_y$ (x>0, y>0)), or lanthanum oxide, gate leakage current can be reduced. The gate insulating film 402 can be formed with a single-layer structure or a stacked-layer structure using any of the above materials.

In the case of forming the gate insulating film 402 with a single-layer structure, a 200 nm thick silicon oxynitride film may be formed. In the case of forming the gate insulating film 402 with a stacked-layer structure, a 50 nm thick silicon nitride film and a 200 nm thick silicon oxynitride film may be formed. The use of a silicon nitride film can inhibit the entry of metal, water, or the like from the substrate or the gate electrode layer 401 to the oxide semiconductor film which is formed later.

Next, heat treatment may be performed on the substrate 400, the gate electrode layer 401, and the gate insulating film 402. For example, the heat treatment can be performed with a GRTA apparatus at 650° C. for 1 minute to 5 minutes. Alternatively, the heat treatment can be performed with an electric furnace at a temperature higher than or equal to 350° C. and lower than or equal to 500° C. for 30 minutes to 1 hour. By performing the heat treatment, hydrogen, water, and the like contained in the gate insulating film 402 can be removed.

Next, treatment for introducing oxygen (also referred to as oxygen doping treatment or oxygen implantation treatment) may be performed on the gate insulating film 402. By performing the treatment for introducing oxygen, the gate insulating film 402 including an oxygen-excess region is formed.

The oxygen contains at least any of an oxygen radical, ozone, an oxygen atom, and an oxygen ion (including an oxygen molecular ion, an oxygen cluster ion). By performing the oxygen doping treatment on the dehydrated or dehydrogenated gate insulating film 402, the oxygen can be contained in the gate insulating film 402 to compensate for oxygen which has been potentially released by the above heat treatment, and the oxygen-excess region can be formed.

Introducing the oxygen into the gate insulating film 402 can be performed by, for example, an ion implantation method, an ion doping method, a plasma immersion ion implantation method, plasma treatment, or the like. Note that for the ion implantation method, a gas cluster ion beam may be used. The oxygen may be introduced to the entire area of the gate insulating film 402 at a time. For example, a linear ion beam may be used for introducing the oxygen. In the case of using the linear ion beam, the substrate or the ion beam is relatively moved (scanned), whereby the oxygen can be introduced into the entire area of the gate insulating film 402. Further, ashing treatment may be employed as the plasma treatment.

As a gas for supplying the oxygen, a gas containing oxygen (O) may be used. For example, an O$_2$ gas, an N$_2$O gas, a CO$_2$ gas, a CO gas, a NO$_2$ gas, or the like can be used. Note that a rare gas (e.g., Ar) may be contained in a gas for supplying the oxygen.

Further, in the case where an ion implantation method is used for introducing the oxygen, the dose of the oxygen is preferably greater than or equal to $1 \times 10^{13}$ ions/cm$^2$ and less than or equal to $5 \times 10^{16}$ ions/cm$^2$. The oxygen content in the gate insulating film 402 after the oxygen doping treatment preferably exceeds that of the stoichiometric composition of the gate insulating film 402. Note that such a region containing oxygen in excess of the stoichiometric composition may exist in at least a part of the gate insulating film 402. The depth at which the oxygen is implanted may be adjusted as appropriate by implantation conditions.

The gate insulating film 402 containing excess oxygen, which serves as an oxygen supply source, is provided to be in contact with the oxide semiconductor film 403 which is formed later, and further, heat treatment is performed later. Thus, oxygen can be released from the gate insulating film 402 and oxygen can be supplied to the oxide semiconductor film 403, whereby oxygen vacancies in the oxide semiconductor film 403 can be reduced.

Note that the treatment for introducing oxygen to the gate insulating film 402 may be performed before the heat treatment of the gate insulating film 402 or may be performed before and after the heat treatment of the gate insulating film 402.

Figure 12B:
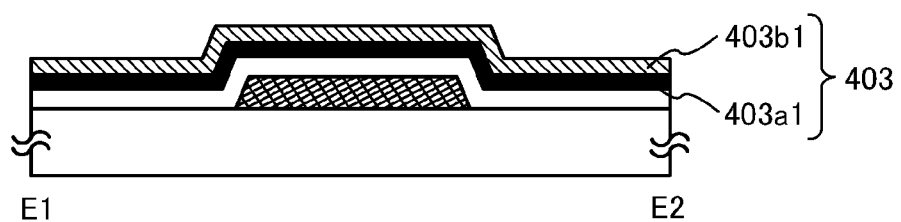

Next, the oxide semiconductor film 403 is formed over the gate insulating film 402 (see FIG. 12B).

The oxide semiconductor film 403 can be formed by a sputtering method, an MBE method, a CVD method, a PECVD method, a mist CVD method, a pulse laser deposition method, an ALD method, or the like as appropriate.

An oxide semiconductor used for the oxide semiconductor film 403 preferably contains at least indium (In). In particular, indium and zinc (Zn) are preferably contained. In addition, as a stabilizer for reducing the variation in electrical characteristics of a transistor using the oxide semiconductor, the oxide semiconductor preferably contains gallium (Ga) in addition to indium and zinc. It is preferable that one or more elements selected from tin (Sn), hafnium (Hf), aluminum (Al), and zirconium (Zr) be contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

The first layer 403a which is closer to the gate electrode layer (on the channel side) can be formed using a material containing much In. For example, in the case of using an In—Ga—Zn-based oxide, in a material for the first layer 403a, the percentage of the In content is preferably higher than the percentage of the Ga content. For example, the material for the first layer 403a can have a composition of In:Ga:Zn=3:1:2 or in the neighborhood of the composition.

In the case of forming the first layer 403a by a sputtering method, for example, a sputtering target having a composition of In:Ga:Zn=3:1:2 can be used. The sputtering target has a bulk resistance of approximately $3.2 \times 10^{-3}$ Ω·cm, and the target exhibits gray color.

The second layer 403b which is farther from the gate electrode layer (on the back channel side) can be formed using a material containing much Ga. For example, in the case of using an In—Ga—Zn-based oxide, in a material for the second layer 403b, the percentage of the Ga content is preferably approximately the same as or higher than that of the In content. For example, the material for the second layer 403b can have a composition of In:Ga:Zn=1:1:1 or in the neighborhood of the composition.

In the case of forming the second layer 403b by a sputtering method, for example, a sputtering target having a composition of In:Ga:Zn=1:1:1 can be used. The sputtering target has a bulk resistance of approximately $3.9 \times 10^{-2}$ Ω·cm, and the target exhibits light gray color.

When oxide semiconductor films are formed using different materials, e.g., sputtering targets having different compositions, the oxide semiconductor films having different compositions may be stacked.

Further, the oxide semiconductor film 403 is preferably a CAAC-OS (c-axis aligned crystalline oxide semiconductor) film. The oxide semiconductor film 403 may be in a single crystal state or a polycrystalline (also referred to as polycrystal) state.

In an oxide semiconductor film having a crystal part as the CAAC-OS film, defects in the bulk can be further reduced and when a surface flatness is improved, mobility higher than that of an oxide semiconductor in an amorphous state can be obtained. In order to improve the surface flatness, the oxide semiconductor film 403 is preferably formed on a flat surface. Specifically, the oxide semiconductor film is preferably formed on a surface with an average surface roughness (Ra) of less than or equal to 1 nm, preferably less than or equal to 0.3 nm, more preferably less than or equal to 0.1 nm.

Note that, Ra is obtained by expanding, into three-dimensions, arithmetic mean surface roughness that is defined by JIS B 0601: 2001 (ISO4287:1997) so as to be able to apply it to a curved surface. The Ra can be expressed as an "average value of the absolute values of deviations from a reference surface to a designated surface" and is defined by the formula below.

$$Ra = \frac{1}{S_0} \int_{y_1}^{y_2} \int_{x_1}^{x_2} |f(x, y) - Z_0| \, dx \, dy$$

Here, the designated surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the designated surface on the xy plane, and $Z_0$ represents the height of the reference surface (the average height of the designated surface). Ra can be measured using an atomic force microscope (AFM).

In order to improve the planarity of the surface of the oxide semiconductor film 403, planarization treatment is preferably performed on a region which is in the gate insulating film 402 and which is in contact with the oxide semiconductor film 403. The planarization treatment may be, but not particularly limited to, polishing treatment (such as chemical mechanical polishing (CMP)), dry etching treatment, or plasma treatment.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the gate insulating film 402.

As the planarization treatment, polishing treatment, dry etching treatment, or plasma treatment may be performed more than once, or these treatments may be performed in combination. In the case where the treatments are performed in combination, the order of steps is not particularly limited and may be set as appropriate depending on the roughness of the surface of the gate insulating film 402.

The thickness of the oxide semiconductor film 403 is preferably greater than or equal to 1 nm and less than or equal to 200 nm, more preferably greater than or equal to 5 nm and less than or equal to 50 nm. The oxide semiconductor film 403 can be formed by a sputtering method, a molecular beam epitaxy (MBE) method, a CVD method, a pulsed laser deposition method, an atomic layer deposition (ALD) method, or the like as appropriate.

Further, the concentration of hydrogen or water contained in the oxide semiconductor film 403 is preferably as low as possible. This is because if the concentration of hydrogen is high, by a bond of hydrogen and an element contained in an oxide semiconductor, part of hydrogen serves as a donor and generates electrons as carriers.

Therefore, in order that the oxide semiconductor film 403 contain hydrogen or water as little as possible in a step of forming the oxide semiconductor film 403, it is preferable to preheat the substrate provided with the gate insulating film 402 in a preheating chamber of a sputtering apparatus as pretreatment for formation of the oxide semiconductor film 403 so that impurities such as hydrogen or water adsorbed onto the substrate and the gate insulating film 402 are eliminated and removed. Note that as an evacuation unit, a cryopump is preferably provided in the preheating chamber.

Note that it is preferable that the oxide semiconductor film 403 be formed under a condition that much oxygen is contained during film formation (e.g., formed by a sputtering method in a 30% to 100% oxygen atmosphere), so that a film containing much oxygen (preferably including a region where the oxygen content is higher than that in the stoichiometric composition of the oxide semiconductor in a crystalline state) is formed.

A high-purity gas from which impurities such as hydrogen, water, hydroxyl, and hydride are removed is preferably used as a sputtering gas for forming the oxide semiconductor film 403.

The substrate is held in a deposition chamber kept under reduced pressure. Then, a sputtering gas from which hydrogen and water are removed is introduced into the deposition chamber from which remaining moisture is being removed, and the oxide semiconductor film 403 is formed over the gate insulating film 402 at a temperature higher than or equal to 130° C. and lower than or equal to 700° C. with the use of the above target. In order to remove moisture remaining in the deposition chamber, an entrapment vacuum pump such as a cryopump, an ion pump, or a titanium sublimation pump is preferably used. As an evacuation unit, a turbo molecular pump to which a cold trap is added may be used. From the deposition chamber which is evacuated with a cryopump, a hydrogen atom, a compound containing a hydrogen atom, such as water ($H_2O$), (preferably also a compound containing a carbon atom), and the like are removed, whereby the concentration of impurities such as hydrogen, water, hydroxyl, and hydride in the oxide semiconductor film 403 formed in the deposition chamber can be reduced.

The oxide semiconductor film 403 has a stacked-layer structure including a plurality of layers, i.e., the first layer 403a and the second layer 403b. Therefore, oxygen may be introduced after the formation of the first layer 403a and after the formation of the second layer 403b. Oxygen may be introduced by heat treatment in an oxygen atmosphere, an ion implantation method, an ion doping method, a plasma immersion ion implantation method, plasma treatment performed in an atmosphere containing oxygen, or the like.

Oxygen is introduced after the formation of the first layer and after the formation of the second layer, whereby the effect of reducing oxygen vacancies in the oxide semiconductor film 403 can be enhanced.

In this embodiment, an In—Ga—Zn-based oxide film (also referred to as an IGZO film) having a thickness of 35 nm is formed as the oxide semiconductor film 403 by a sputtering method using a sputtering apparatus including an AC power supply device. In this embodiment, an In—Ga—Zn-based oxide target having an atomic ratio of In:Ga:Zn=3:1:2 is used. The deposition conditions are as follows: the atmosphere is oxygen and argon (the flow rate of oxygen is 50%), the pressure is 0.4 Pa, the electric power is 0.5 kW, and the substrate temperature is 200° C.

It is preferable to form the gate insulating film 402 and the oxide semiconductor film 403 in succession so as not to expose the gate insulating film 402 to the air after the formation of the gate insulating film 402. Forming the gate insulating film 402 and the oxide semiconductor film 403 in succession so as not to expose the gate insulating film 402 to the air can prevent impurities such as hydrogen and moisture from being adsorbed onto the surface of the gate insulating film 402.

Here, heat treatment may be performed on the oxide semiconductor film 403 in order to remove hydrogen (including water and hydroxyl) (to perform dehydration or dehydrogenation treatment). The temperature of the heat treatment is higher than or equal to 300° C. and lower than or equal to 700° C., or lower than the strain point of the substrate. The heat treatment can be performed in reduced pressure, a nitrogen atmosphere, or the like.

In this embodiment, the substrate is introduced into an electric furnace, which is one of heat treatment apparatuses, and the oxide semiconductor film 403 is subjected to heat treatment at 450° C. in a nitrogen atmosphere for 1 hour and further at 450° C. in an atmosphere of nitrogen and oxygen for 1 hour.

Further, a heat treatment apparatus used is not limited to an electric furnace, and a device for heating an object to be processed by heat conduction or heat radiation from a heating element such as a resistance heating element may be alternatively used. For example, an RTA apparatus such as an LRTA apparatus or a GRTA apparatus can be used. For example, as the heat treatment, GRTA may be performed as follows. The substrate is put in an inert gas heated at high temperature of 650° C. to 700° C., is heated for several minutes, and is taken out of the inert gas.

Note that in the heat treatment, it is preferable that water, hydrogen, and the like be not contained in nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (that is, the concentration of impurities is 1 ppm or lower, preferably 0.1 ppm or lower).

In addition, after the oxide semiconductor film 403 is heated by the heat treatment, a high-purity oxygen gas, a high-purity dinitrogen monoxide gas, or ultra dry air (air with a moisture amount is less than or equal to 20 ppm (−55° C. by conversion into a dew point), preferably less than or equal to 1 ppm, or more preferably less than or equal to 10 ppb, in the case where measurement is performed with use of a dew point meter of a cavity ring down laser spectroscopy (CRDS) system) may be introduced into the same furnace. It is preferable that water, hydrogen, or the like be not contained in the oxygen gas or the dinitrogen monoxide gas. Alternatively, the purity of the oxygen gas or the dinitrogen monoxide gas which is introduced into the heat treatment apparatus is preferably 6N or higher, more preferably 7N or higher (i.e., the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main component of the oxide semiconductor and that is reduced by the step of removing impurities for dehydration or dehydrogenation, so that the oxygen vacancies in the oxide semiconductor film 403 can be reduced.

The heat treatment for dehydration or dehydrogenation may be performed before or after the oxide semiconductor film is processed into an island shape. The heat treatment for dehydration or dehydrogenation may be performed more than once, and may also serve as another heat treatment. By performing the heat treatment on the oxide semiconductor film 403, the crystallinity of the oxide semiconductor film 403 can be increased.

When the heat treatment for dehydration or dehydrogenation is performed before the oxide semiconductor film 403 is processed into an island shape, i.e., when the heat treatment for dehydration or dehydrogenation is performed in the state where the gate insulating film 402 is covered with the oxide semiconductor film, oxygen contained in the gate insulating film 402 can be prevented from being released to the outside by the heat treatment.

Figure 12C:
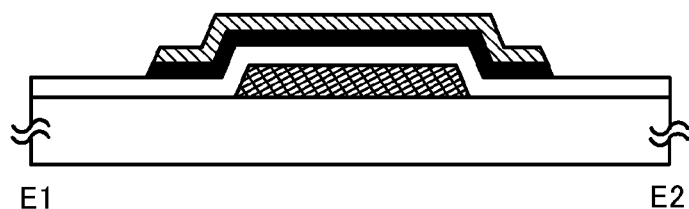

Next, in a photolithography process, a resist mask is formed over the oxide semiconductor film 403 and selective etching is performed on the oxide semiconductor film 403, whereby the island-shaped oxide semiconductor film 403 is formed (see FIG. 12C). After the island-shaped oxide semiconductor film 403 is formed, the resist mask is removed. The resist mask for forming the island-shaped oxide semiconductor film 403 may be formed by an ink-jet method. When the resist mask is formed by an ink-jet method, photo masks are not used, so that the production cost can be reduced.

Note that the oxide semiconductor film 403 may be etched using either dry etching or wet etching, or using both dry etching and wet etching. As an etchant used for wet etching of the oxide semiconductor film 403, a mixed solution of phosphoric acid, acetic acid, and nitric acid, or the like can be used, for example. Alternatively, ITO-07N (produced by KANTO CHEMICAL CO., INC.) may be used. Further alternatively, the oxide semiconductor film may be etched by a dry etching method using an inductively coupled plasma (ICP) etching method.

Figure 12D:
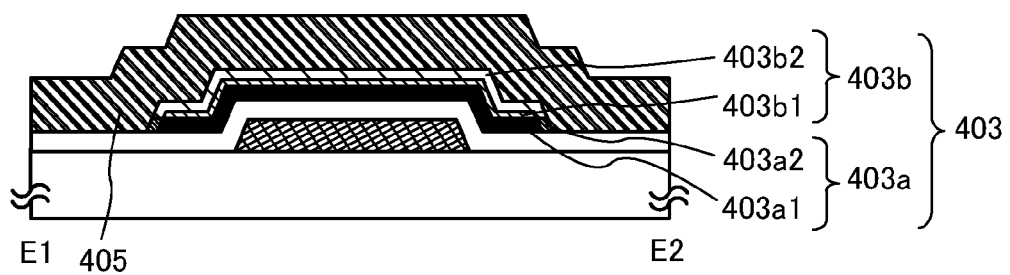

Next, a conductive film 405 which is to be a source electrode layer and a drain electrode layer (including a wiring formed using the same layer as the source electrode layer and the drain electrode layer) is formed over the gate insulating film 402 and the oxide semiconductor film 403 (see FIG. 12D).

The conductive film 405 can be formed by a sputtering method or a plasma CVD method. The conductive film 405 can be formed by using a metal material such as molybdenum, titanium, tantalum, tungsten, aluminum, copper, chromium, neodymium, or scandium, or an alloy material containing any of these materials as a main component. The conductive film 405 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. In addition, the conductive film 405 is formed with a single-layer structure or a stacked-layer structure.

In this embodiment, the conductive film 405 is formed with a three-layer structure including a 50 nm thick tungsten film, a 400 nm thick aluminum film, and a 100 nm thick titanium film.

In the case where the oxide semiconductor film 403 is the CAAC-OS film, in forming the conductive film 405, a crystal structure of the region 403a2 and the region 403b2 which are in contact with the conductive film 405 is disordered. Thus, the proportion of a crystal part to an amorphous part in the region 403a2 and the region 403b2 is lower than the proportion of a crystal part to an amorphous part in the region 403a1 and the region 403b1. Alternatively, a crystal part in the region 403a2 and the region 403b2 might be destroyed and the region 403a2 and the region 403b2 might become amorphous. In the case where the oxide semiconductor film 403 is a film having crystallinity such as a single crystal film or a polycrystalline film, a crystal structure of crystal in the region 403a2 and the region 403b2 which are in contact with the conductive film 405 is disordered. Thus, crystallinity of the region 403a2 and the region 403b2 is lowered, and in some cases, the region 403a2 and the region 403b2 become amorphous.

In the oxide semiconductor film 403, the region 403a2 and the region 403b2 in each of which a crystal structure of a crystal part or crystal is disordered are formed in a surface of the oxide semiconductor film 403 to a thickness of several nanometers. The disorder in the crystal structure of a crystal part or crystal in the region 403b2 leads to increase in dangling bonds, distortions between lattices, voids, and oxygen vacancies.

Therefore, hydrogen is moved to the dangling bonds, distortions between lattices, voids, and oxygen vacancies in the region 403a2 and the region 403b2. By performing heat treatment on the oxide semiconductor film 403, hydrogen contained in the region 403a1 of the oxide semiconductor film 403 moves by heat. Hydrogen is drawn to the region 403a2 and the region 403b2.

The heat treatment for moving hydrogen to the region 403a2 and the region 403b2 in the oxide semiconductor film 403 is performed at a temperature, for example, higher than or equal to 100° C. and lower than or equal to the strain point of the substrate, preferably higher than or equal to 200° C. and lower than or equal to 400° C.

By performing the heat treatment, hydrogen contained in the region 403a1 of the oxide semiconductor film 403 is drawn to the region 403a2 and the region 403b2, whereby the hydrogen concentration of the region 403a1 can be reduced. Hydrogen moved to the region 403a2 and the region 403b2 in the oxide semiconductor film 403 is stable; therefore, hydrogen is hardly diffused again into the region 403a1. Thus, the hydrogen concentration of the region 403a2 and the region 403b2 of the oxide semiconductor film 403 is increased, whereby the region 403a2 and the region 403b2 can have higher conductivity than the region 403a1 and the region 403b1. Therefore, the region 403a2 and the region 403b2 in the oxide semiconductor film 403 can serve as low-resistance regions.

Note that the heat treatment for moving hydrogen from the region 403a1 to the region 403a2 and the region 403b2 may be performed after formation of the source electrode layer and the drain electrode layer or may be performed before and after formation of the source electrode layer and the drain electrode layer. The heat treatment for moving hydrogen from the region 403a1 to the region 403a2 and the region 403b2 may be performed more than once, and may also serve as another heat treatment.

Figure 13A:
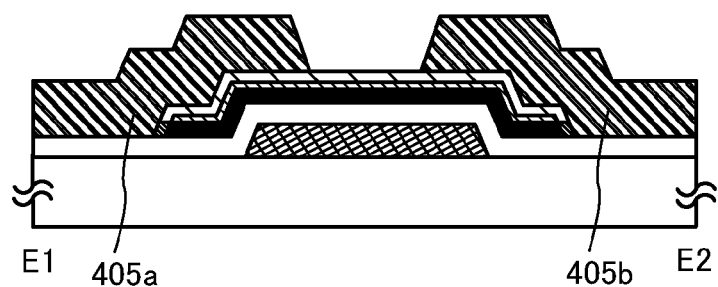
FIGS. 13A to 13D are cross-sectional views which illustrate one embodiment of a method for manufacturing a semiconductor device.

Next, in a photolithography process, a resist mask is formed over the conductive film 405 and selective etching is performed on the conductive film 405, whereby the source electrode layer 405a and the drain electrode layer 405b are formed (see FIG. 13A). At this time, the region 403a2 and the region 403b2 in the oxide semiconductor film 403 are exposed. After the source electrode layer 405a and the drain electrode layer 405b are formed, the resist mask is removed. Note that the conductive film 405 may be etched using either dry etching or wet etching, or using both dry etching and wet etching.

A crystal part or crystal in the region 403a2 and the region 403b2 of the oxide semiconductor film 403 is destroyed, whereby dangling bonds, distortions between lattices, voids, and oxygen vacancies in the region 403a2 and the region 403b2 increase. In addition, hydrogen is moved to the region 403a2 and the region 403b2, whereby the hydrogen concentration of the region 403a2 and the region 403b2 is increased as compared to that of the region 403a1. Therefore, if a transistor including the region 403a2 and the region 403b2 each having high hydrogen concentration is manufactured, the region 403a2 and the region 403b2 may adversely affect the transistor in some cases. For example, if the region having high hydrogen concentration is provided in a portion where a back channel is formed or a side edge portion of the oxide semiconductor film 403, carriers generated by oxygen vacancies or hydrogen are stored, whereby a parasitic channel is formed; thus, leakage current is easily generated and threshold voltage might vary.

Alternatively, plasma treatment using an etching gas containing halogen is favorably employed for etching the conductive film 405 formed over the oxide semiconductor film 403. However, if the oxide semiconductor film is exposed to the etching gas containing halogen, halogen (e.g., chlorine or fluorine) contained in the etching gas extracts oxygen in the oxide semiconductor film 403 in some cases, which might cause oxygen vacancies to be formed in the vicinity of a surface of the oxide semiconductor film 403 where plasma treatment is employed. Further, if the halogen contained in the etching gas remains on a surface of the oxide semiconductor film 403 and in the vicinity thereof after the etching, oxygen vacancies might be formed in the oxide semiconductor film 403. Such oxygen vacancies in the oxide semiconductor film 403 might cause a top surface (back channel) side and a side edge portion of the oxide semiconductor film 403 to have lower resistance (n-type conductivity), resulting in formation of a parasitic channel.

Alternatively, in forming the conductive film 405, an element contained in the conductive film 405 is added to the oxide semiconductor film 403 in some cases.

Figure 13B:
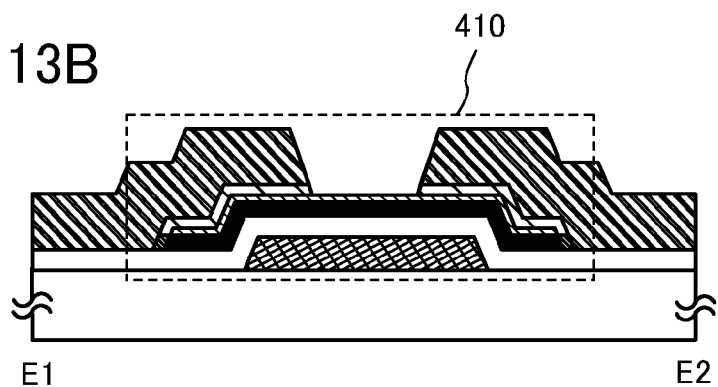

Therefore, to prevent a parasitic channel from being formed by decrease in resistance of the back channel side and the side edge portion of the oxide semiconductor film, parts of the region 403a2 and the region 403b2 which are exposed by the formation of the source electrode layer 405a and the drain electrode layer 405b are removed (see FIG. 13B). In a step of removing the parts of the region 403a2 and the region 403b2, it is preferable that the etching condition for the oxide semiconductor film 403 be optimized in order to prevent the oxide semiconductor film 403 from being etched to be removed or divided.

For the step of removing the parts of the region 403a2 and the region 403b2, plasma treatment using oxygen, dinitrogen monoxide, or a rare gas (typically argon); solution treatment using hydrofluoric acid (also referred to as dilute hydrofluoric acid), water, a developer, or a TMAH solution; or the like can be favorably employed. When an IGZO film is subjected to treatment using dilute hydrofluoric acid, for example, $1/10^3$ dilute hydrofluoric acid (hydrofluoric acid: 0.05%), the thickness decreases by 1 nm to 3 nm per second. When the IGZO film is subjected to treatment using $2/10^5$ dilute hydrofluoric acid (hydrofluoric acid: 0.0025%), the thickness decreases by approximately 0.1 nm per second. In this embodiment, as the step of removing the parts of the region 403a2 and the region 403b2 with disordered crystal structure, solution treatment using dilute hydrofluoric acid (wet etching) is performed.

The parts of the region 403a2 and the region 403b2 in each of which a crystal part or crystal is destroyed and hydrogen concentration is higher than that of the region 403a1 are removed in the portion where a back channel is formed or the side edge portion of the oxide semiconductor film 403, whereby the region 403a1 having low hydrogen concentration can be exposed. Thus, formation of a parasitic channel can be prevented, and generation of leakage current or variation in threshold voltage can be inhibited. Further, the region 403a2 and the region 403b2 can serve as low-resistance regions even if hydrogen concentration is high and a halogen remains in the region 403a2 and the region 403b2 in the vicinity of the interface between the oxide semiconductor film 403 and the source electrode layer 405a or the drain electrode layer 405b.

The parts of the region 403a2 and the region 403b2 in the oxide semiconductor film 403 are thus removed, whereby the thickness of a region in the oxide semiconductor film 403 which overlaps with the source electrode layer 405a or the drain electrode layer 405b is larger than that of a region in the oxide semiconductor film 403 which overlaps with neither the source electrode layer 405a nor the drain electrode layer 405b.

The removal of the parts of the region 403a2 and the region 403b2 with disordered crystal structure in the portion where a back channel is formed or the side edge portion of the oxide semiconductor film 403 can also lead to removal of contaminants generated when the source electrode layer 405a and the drain electrode layer 405b are processed and contaminants generated when the resist mask is removed.

Through the above-described process, the transistor 410 can be manufactured (see FIG. 13B).

Figure 13C:
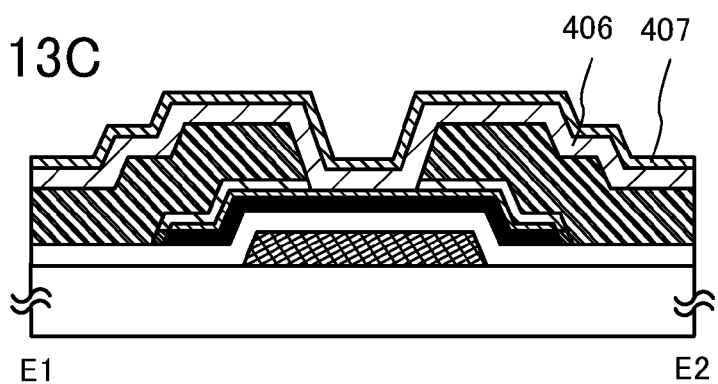
Figure 13D:
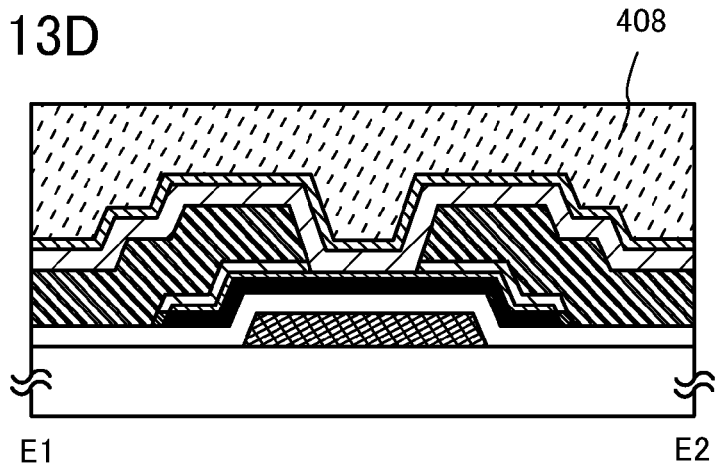

Next, the insulating film 406 is formed over the oxide semiconductor film 403, the source electrode layer 405a, and the drain electrode layer 405b (see FIG. 13C).

The insulating film 406 can be formed by a plasma CVD method or a sputtering method. The insulating film 406 can be formed using silicon oxide, gallium oxide, aluminum oxide, silicon nitride, silicon oxynitride, aluminum oxynitride, or the like, for example.

Note that as the insulating film 406, an oxide insulating film containing nitrogen (e.g., a silicon oxide film containing nitrogen or an aluminum oxide film containing nitrogen) or the like can be used. The concentration of nitrogen contained in the oxide insulating film may be higher than or equal to 0.01 atomic %, preferably higher than or equal to 0.1 atomic % and lower than or equal to 50 atomic %, more preferably higher than or equal to 0.5 atomic % and lower than or equal to 15 atomic %. Such a silicon oxide film containing nitrogen with the above concentration may be referred to as a silicon oxynitride film. By containing an adequate amount of nitrogen, the oxide insulating film can contain oxygen more than that in the stoichiometric composition.

In this embodiment, as the insulating film 406, a silicon oxynitride film is formed by a plasma CVD method. The conditions for forming the insulating film 406 can be as follows: the gas flow rate of $SiH_4$ and $N_2O$ is 30:4000; the pressure is 200 Pa, the RF power supply (power supply output) is 150 W, and the substrate temperature is 220° C.±15° C. The preferable thickness of the insulating film 406 is greater than or equal to 50 nm and less than or equal to 100 nm.

It is preferable that heat treatment for dehydration or dehydrogenation be performed on the insulating film 406. In this embodiment, a gas containing hydrogen is used for depositing the insulating film 406. However, since the insulating film 406 is subjected to dehydration or dehydrogenation treatment, hydrogen in the insulating film 406 can be removed. Thus, a plasma CVD method can be preferably used. By a plasma CVD method, particles and the like do not easily enter and attach to a film in deposition, and in addition, a thick film can be deposited with relatively high deposition speed; a plasma CVD method is advantageous in productivity.

The temperature of the heat treatment is higher than or equal to 300° C. and lower than or equal to 700° C., or lower than the strain point of the substrate. It is preferable that the temperature of the heat treatment be higher than the deposition temperature of the insulating film 406, because effect of dehydration or dehydrogenation is high. For example, the substrate is introduced into an electric furnace which is one of heat treatment apparatuses, and the heat treatment is performed on the insulating film 406 at 450° C. in a nitrogen atmosphere for 1 hour.

By the heat treatment, the insulating film 406 can be dehydrated or dehydrogenated, and thus an insulating film from which impurities such as hydrogen or water are removed can be used.

By performing the heat treatment for dehydration or dehydrogenation, impurities contained in the insulating film 406, such as water or hydrogen, can be removed from the insulating film 406 and reduced. When the insulating film 406 contains hydrogen as little as possible, the entry of hydrogen into the oxide semiconductor film 403 can be inhibited. Therefore, the transistor 410 can be less varied in electrical characteristics and thus have stable electrical characteristics.

Note that the insulating film 407 formed later preferably has a blocking function of preventing penetration of hydrogen, water, or the like. Thus, the heat treatment for dehydration or dehydrogenation of the insulating film 406 is preferably performed after formation of the insulating film 406 before formation of the insulating film 407.

Next, treatment for introducing oxygen (also referred to as oxygen doping treatment or oxygen implantation treatment) is performed on the insulating film 406. By the treatment, the insulating film 406 including an oxygen-excess region is formed.

The oxygen contains at least any of an oxygen radical, ozone, an oxygen atom, and an oxygen ion (an oxygen molecular ion and/or an oxygen cluster ion). By the oxygen doping treatment performed on the dehydrated or dehydrogenated insulating film 406, oxygen can be contained in the insulating film 406 to compensate for oxygen which has been potentially released by the above heat treatment, and the oxygen-excess region can be formed.

Introducing the oxygen into the insulating film 406 can be performed by, for example, an ion implantation method, an ion doping method, a plasma immersion ion implantation method, plasma treatment, or the like. Note that for the ion implantation method, a gas cluster ion beam may be used. The oxygen may be introduced to the entire area of the insulating film 406 at a time. For example, a linear ion beam is used for introducing the oxygen. In the case of using the linear ion beam, the substrate or the ion beam is relatively moved (scanned), whereby the oxygen can be introduced into the entire area of the insulating film 406.

As a gas for supplying the oxygen, a gas containing oxygen (O) may be used. For example, an $O_2$ gas, an $N_2O$ gas, a $CO_2$ gas, a CO gas, a $NO_2$ gas, or the like can be used. Note that a rare gas (e.g., Ar) may be contained in a gas for supplying the oxygen.

Further, in the case where an ion implantation method is used for introducing the oxygen, the dose of the oxygen is preferably greater than or equal to $1 \times 10^{13}$ ions/cm$^2$ and less than or equal to $5 \times 10^{16}$ ions/cm$^2$. The oxygen content in the insulating film 406 after the oxygen doping treatment preferably exceeds that of the stoichiometric composition of the insulating film 406. Note that such a region containing oxygen in excess of the stoichiometric composition may exist in at least a part of the insulating film 406. The depth at which the oxygen is implanted may be adjusted as appropriate by implantation conditions.

Next, in this embodiment, an aluminum film is formed over the insulating film 406.

The aluminum film is preferably formed by a sputtering method, an evaporation method, a CVD method, or the like. In addition, the thickness of the aluminum film is preferably greater than or equal to 3 nm and less than or equal to 20 nm (more preferably greater than or equal to 3 nm and less than or equal to 10 nm, much more preferably greater than or equal to 4 nm and less than or equal to 5 nm).

Note that as the aluminum film, an aluminum film to which titanium or magnesium is added may be used. Alternatively, as the aluminum film, a stacked layer of an aluminum film and any of a titanium film and a magnesium film may be used.

Next, the aluminum film is subjected to oxygen doping treatment. The detailed description of the oxygen doping treatment is omitted because the oxygen doping treatment performed on the insulating film 406 may be referred to. By performing the oxygen doping treatment on the aluminum film, an aluminum oxide film which is an oxide of the aluminum film is formed. The aluminum oxide film is used for the insulating film 407.

Heat treatment may be performed after the oxygen is added to the insulating film 406 and the aluminum film. The temperature of the heat treatment may be higher than or equal to 250° C. and lower than or equal to 600° C., for example, 300° C. By performing the heat treatment, oxygen contained in the insulating film 406 diffuses (solid-phase diffusion) toward the oxide semiconductor film 403; thus, oxygen can be supplied to the oxide semiconductor film 403. When oxygen is supplied from the insulating film 406 to the oxide semiconductor film 403 by solid-phase diffusion in this manner, the oxide semiconductor film 403 is less damaged by plasma as compared with the case of performing plasma treatment in which oxygen is directly added to the exposed oxide semiconductor film 403, or the like.

If the region 403a2 and the region 403b2 with disordered crystal structure are formed in a portion where a back channel is formed and a side edge portion of the oxide semiconductor film 403, hydrogen is drawn to the 403a2 and the region 403b2 with disordered crystal structure, whereby the resistance of the 403a2 and the region 403b2 is lowered, leading to formation of a parasitic channel. Even when the heat treatment is performed in a state where the region 403a2 and the region 403b2 in the oxide semiconductor film 403 is in contact with the insulating film 406, oxygen released from the insulating film 406 is captured by oxygen vacancies and the like in the region 403a2 and the region 403b2, in which case it is difficult to supply oxygen from the insulating film 406 to the region 403a1 and the region 403b1 (channel formation regions) of the oxide semiconductor film 403.

Therefore, to prevent a parasitic channel from being formed in the portion where a back channel is formed or the side edge portion of the oxide semiconductor film, it is preferable to remove the parts of the region 403a2 and the region 403b2 which are formed in the portion where a back channel is formed or the side edge portion of the oxide semiconductor film 403 and to perform heat treatment in a state where the region 403a1 and the region 403b1 of the oxide semiconductor film 403 is in contact with the insulating film 406, whereby oxygen is supplied to the region 403a1 and the region 403b1 of the oxide semiconductor film 403.

In the case where the oxide semiconductor film 403 is a CAAC-OS film (In—Ga—Zn-based oxide semiconductor), oxygen vacancies are concentrated in a Ga—Zn—O layer. Further, oxygen is likely to pass through the Ga—Zn—O layer. When the insulating film 406 is in contact with the oxide semiconductor film 403, oxygen contained in the insulating film 406 is supplied more in a direction parallel to an a-b plane, particularly through the Ga—Zn—O layer, than in a c-axis direction.

In this embodiment, the part of the region 403b2 having high hydrogen concentration and including oxygen vacancies or the like is removed in the portion where a back channel is formed or the side edge portion of the oxide semiconductor film 403. Therefore, it is possible to prevent the oxygen vacancies from being filled with oxygen supplied from the insulating film 406 to the side edge portion of the oxide semiconductor film 403. Therefore, oxygen contained in the insulating film 406 can be efficiently supplied to the region 403a1 and the region 403b1 (channel formation regions) of the oxide semiconductor film 403. Thus, oxygen vacancies contained in the region 403a1 and the region 403b1 of the oxide semiconductor film 403 can be reduced.

In the case of a transistor including an oxide semiconductor, supply of oxygen from the insulating film to the oxide semiconductor film can reduce interface state density between the oxide semiconductor film and the insulating film. As a result, carrier trapping at the interface between the oxide semiconductor film and the insulating film due to the operation of a transistor, or the like can be suppressed, and thus, a highly reliable transistor can be obtained.

The insulating film 406 and the insulating film 407 may be subjected to dehydration or dehydrogenation treatment and/or oxygen doping treatment more than once.

Further, for example, aluminum oxide can be used for the insulating film 407 provided over and in contact with the insulating film 406. In the case of using aluminum oxide for the insulating film 407, aluminum oxide may be formed by oxidation of an aluminum film. When an aluminum oxide film is formed by oxidation of an aluminum film, productivity can be increased as compared to the case where an aluminum oxide film is formed by a sputtering method. Further, the oxidation of an aluminum film and the oxygen doping treatment of the insulating film 406 can be performed in the same step; thus, a process can be simplified. Therefore, the production cost of a semiconductor device can be reduced.

In the case of using an oxide insulating film (e.g., silicon oxide, silicon oxynitride) for the insulating film 406, it is difficult to estimate the oxygen concentration of the oxide insulating film accurately with secondary ion mass spectrometry (SIMS) or the like because oxygen is one of main components of the oxide insulating film. That is, it is difficult to judge whether oxygen is intentionally added to the oxide insulating film or not. The same applies to the case where excess oxygen contained in the insulating film 406 is supplied to the oxide semiconductor film 403 in a later step.

It is known that there are isotopes of oxygen, such as $^{17}O$ and $^{18}O$, and that the proportions of $^{17}O$ and $^{18}O$ in all of the oxygen atoms in nature are approximately 0.038% and approximately 0.2%, respectively. That is to say, it is possible to measure the concentrations of these isotopes in the oxide semiconductor film or the insulating film in contact with the oxide semiconductor film by a method such as SIMS; therefore, the oxygen concentration of the oxide semiconductor film or the insulating film in contact with the oxide semiconductor film may be able to be estimated more accurately by measuring the concentrations of these isotopes. Thus, the concentration of the isotope may be measured to determine whether or not oxygen is intentionally added to the insulating film in contact with the oxide semiconductor film.

An insulating film serving as an interlayer insulating film (a protective insulating film, a planarization insulating film) may be formed over the insulating film 407. The interlayer insulating film (the protective insulating film, the planarization insulating film) can relieve stress on the insulating film 407 that is a thin film. Accordingly, the insulating film 407 can be prevented from being damaged.

The interlayer insulating film can be formed using a material and a method similar to those of the insulating film 406. For example, a 400 nm thick silicon oxide film is formed by a sputtering method. Heat treatment may be performed after formation of the protective insulating film. For example, heat treatment is performed at 300° C. in a nitrogen atmosphere for 1 hour.

In this embodiment, the planarization insulating film 408 is formed over the insulating film 407. The planarization insulating film 408 can reduce surface roughness due to the transistor 410. An organic material such as a polyimide resin, an acrylic resin, or a benzocyclobutene resin can be used for the planarization insulating film 408. Other than such organic materials, it is also possible to use a low-dielectric constant material (a low-k material) or the like. Note that the planarization insulating film 408 may be formed by stacking a plurality of insulating films formed from these materials.

For example, a 1500 nm thick acrylic resin film may be formed as the planarization insulating film 408. The acrylic resin film can be formed in such a manner that an acrylic resin is applied by a coating method and then baked (e.g., at 250° C. in a nitrogen atmosphere for 1 hour).

Heat treatment may be performed after formation of the planarization insulating film 408. For example, heat treatment is performed at 250° C. in a nitrogen atmosphere for 1 hour.

As described above, heat treatment may be performed after formation of the transistor 410. The heat treatment may be performed more than once.

Through the above-described process, a semiconductor device including the transistor 410 can be manufactured.

Next, a method for manufacturing a semiconductor device, which is different from the method for manufacturing a semiconductor device in FIGS. 12A to 12D and FIGS. 13A to 13D, will be described with reference to FIGS. 14A to 14D.

First, in accordance with FIG. 12A, the gate electrode layer 401 is formed over the substrate 400; then, the gate insulating film 402 is formed over the gate electrode layer 401. Next, in accordance with the step of FIG. 12B, the oxide semiconductor film 403 is formed over the gate insulating film 402. Then, in accordance with the step of FIG. 12C, in a photolithography process, a resist mask is formed over the oxide semiconductor film 403 and selective etching is performed on the oxide semiconductor film 403, whereby the island-shaped oxide semiconductor film 403 is formed.

Figure 14A:
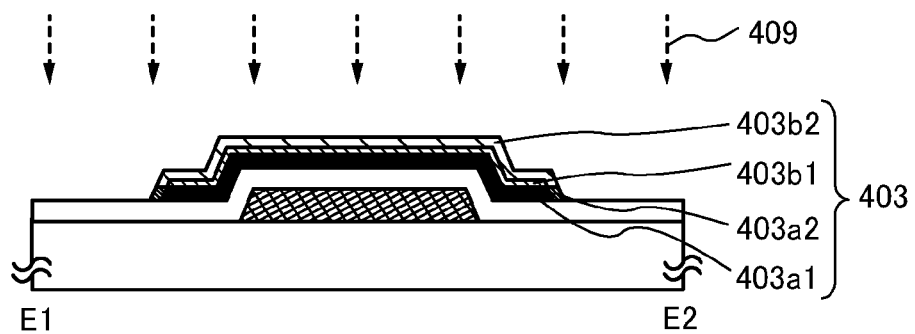
FIGS. 14A to 14D are cross-sectional views which illustrate one embodiment of a method for manufacturing a semiconductor device.

Next, as indicated by arrows 409, one or more of elements of Group 15 in the periodic table (e.g., nitrogen, phosphorus, and arsenic), elements of Group 13 in the periodic table (e.g., boron, aluminum, gallium, and indium) and rare gas elements (e.g., helium, neon, argon, and xenon) is/are added to a surface of the island-shaped oxide semiconductor film 403 by an ion implantation method, an ion doping method, or plasma treatment (FIG. 14A).

The above-described element is preferably added to the surface of the oxide semiconductor film 403 in the range of several nanometers. By the addition of the above-described element to the oxide semiconductor film 403, the region 403a2 and the region 403b2 in each of which the crystal structure of a crystal part or crystal is disordered is formed in the surface of the oxide semiconductor film 403. The disorder in the crystal structure of a crystal part or crystal in the region 403a2 and the region 403b2 leads to increase in dangling bonds, distortions between lattices, voids, and oxygen vacancies.

Therefore, hydrogen is moved to the dangling bonds, distortions between lattices, voids, and oxygen vacancies in the region 403a2 and the region 403b2. By performing heat treatment on the oxide semiconductor film 403, hydrogen contained in the region 403a1 in the oxide semiconductor film 403 is drawn to the region 403a2 and the region 403b2.

The heat treatment for moving hydrogen to the region 403a2 and the region 403b2 in the oxide semiconductor film 403 is performed at a temperature, for example, higher than or equal to 100° C. and lower than or equal to the strain point of the substrate, preferably higher than or equal to 200° C. and lower than or equal to 400° C.

By performing the heat treatment, hydrogen contained in the region 403a1 of the oxide semiconductor film 403 is drawn to the region 403a2 and the region 403b2, whereby the hydrogen concentration of the region 403a1 can be reduced. Further, movement of hydrogen to the region 403a2 and the region 403b2 of the oxide semiconductor film 403 increases the hydrogen concentration of the region 403a2 and the region 403b2.

Note that the heat treatment for moving hydrogen to the region 403a2 and the region 403b2 may be performed after formation of the source electrode layer and the drain electrode layer or may be performed before and after formation of the source electrode layer and the drain electrode layer. The heat treatment for moving hydrogen from the region 403a1 to the region 403a2 and the region 403b2 may be performed more than once, and may also serve as another heat treatment.

Figure 14B:
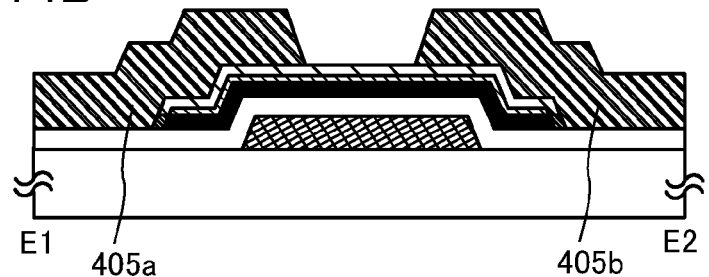

Next, a conductive film is formed over the gate insulating film 402 and the oxide semiconductor film 403; then, in accordance with the step of FIG. 13A, in a photolithography process, a resist mask is formed over the conductive film and selective etching is performed on the conductive film, whereby the source electrode layer 405a and the drain electrode layer 405b are formed. At this time, the region 403b2 of the oxide semiconductor film 403 is exposed (FIG. 14B).

Figure 14C:
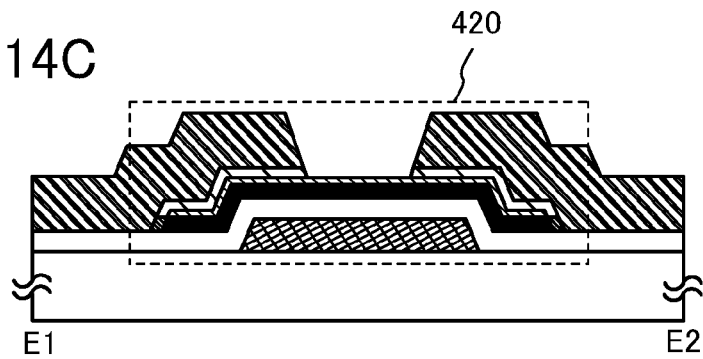

Next, in accordance with the step of FIG. 13B, part of the region 403b2 which is exposed by formation of the source electrode layer 405a and the drain electrode layer 405b is removed (FIG. 14C).

Through the above-described process, a transistor 420 can be manufactured (see FIG. 14C).

Figure 14D:
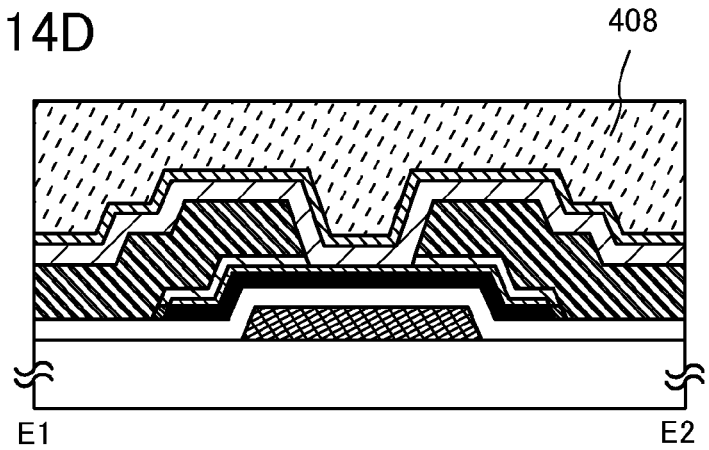

Next, in accordance with the step of FIG. 13C, the insulating film 406 is formed, and the insulating film 407 is formed over the insulating film 406. In accordance with the step of FIG. 13D, the planarization insulating film 408 is formed. Thus, a semiconductor device including the transistor 420 can be manufactured (FIG. 14D).

In the method for manufacturing a semiconductor device according to one embodiment of the present invention, the region 403b2 in the vicinity of the surface of the oxide semiconductor film 403 (or in the vicinity of the interface with the conductive film) is made amorphous in forming the conductive film 405 which is to be the source electrode layer 405a and the drain electrode layer 405b. Alternatively, plasma treatment is performed on the surface of the oxide semiconductor film 403, whereby the region 403a2 and the region 403b2 in the surface of the oxide semiconductor film are made amorphous.

By heat treatment performed later, hydrogen in the region 403a1 (particularly in a region overlapping with the gate electrode layer 401) of the oxide semiconductor film 403 is moved to the region 403a2 and the region 403b2 with disordered crystal structure, whereby the concentration of hydrogen contained in the region 403a1 of the oxide semiconductor film 403 can be reduced. Note that the region 403a2 and the region 403b2 each having increased hydrogen concentration due to movement of hydrogen can serve as low-resistance regions.

Further, the oxide semiconductor film 403 is provided in contact with the oxide insulating film (at least the insulating film 406) including an oxygen-excess region. By heat treatment, oxygen can be released from the oxide insulating film, and oxygen which is released can be supplied to the oxide semiconductor film 403. Thus, oxygen vacancies in the region 403a1 of the oxide semiconductor film 403 can be reduced.

Reduction of hydrogen concentration or oxygen vacancies in the region 403a1 and the region 403b1 of the oxide semiconductor film 403 can inhibit generation of carriers, whereby formation of a parasitic channel can be inhibited; thus, a shift in the negative direction of the threshold voltage can be inhibited.

In accordance with one embodiment of the present invention, it is possible to provide a highly reliable semiconductor device by giving stable electrical characteristics to the transistor 410 and the transistor 420 each including an oxide semiconductor film.

The structures, methods, and the like described in this embodiment can be combined as appropriate with any of the other structures, methods, and the like described in the other embodiments.

(Embodiment 7)

In this embodiment, a semiconductor device having a display function (also referred to as display device) can be manufactured using the transistor described in any of the embodiments. Moreover, part or the whole of a driver circuit including the transistor can be formed over a substrate where a pixel portion is formed, whereby a system-on-panel can be obtained.

Figure 15A:
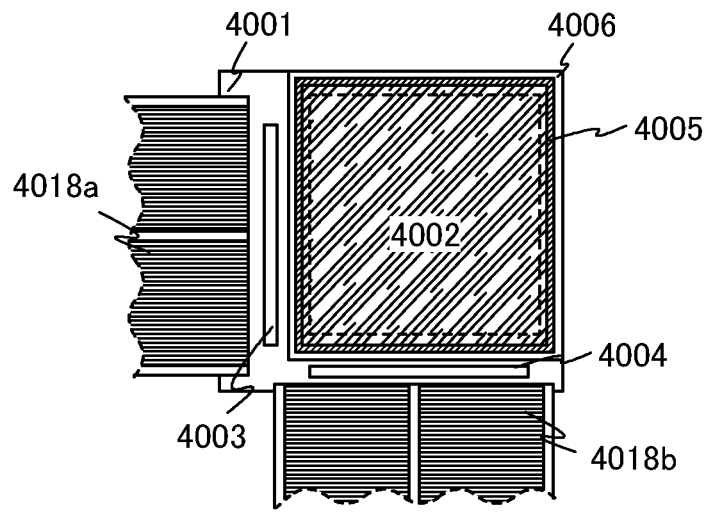
FIGS. 15A to 15C are plan views which illustrate one embodiment of a semiconductor device.

In FIG. 15A, a sealant 4005 is provided so as to surround a pixel portion 4002 provided over a first substrate 4001, and the pixel portion 4002 is sealed by a second substrate 4006. In FIG. 15A, a signal line driver circuit 4003 and a scan line driver circuit 4004 which are each formed using a single crystal semiconductor film or a polycrystalline semiconductor film over a substrate prepared separately are mounted in regions that are different from the region surrounded by the sealant 4005 over the first substrate 4001. Various signals and potentials are supplied to the signal line driver circuit 4003, the scan line driver circuit 4004, and the pixel portion 4002, which are separately formed, from flexible printed circuits (FPCs) 4018a and 4018b.

Figure 15B:
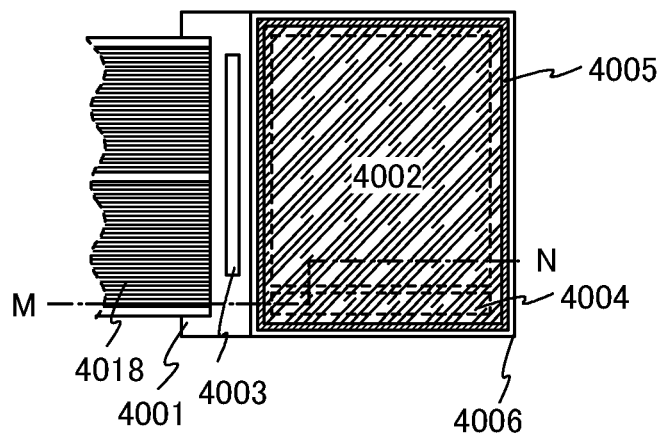
Figure 15C:
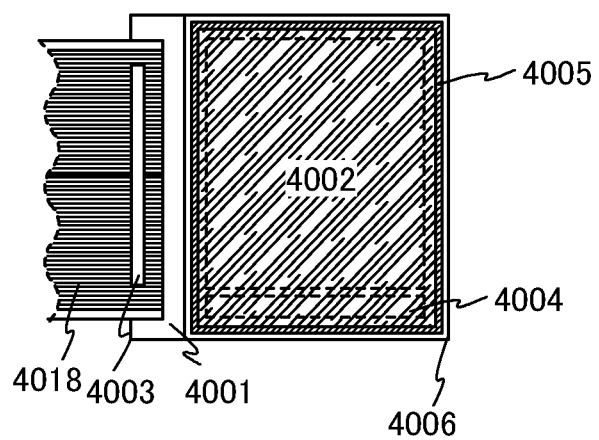

In FIGS. 15B and 15C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element by the first substrate 4001, the sealant 4005, and the second substrate 4006. In FIGS. 15B and 15C, the signal line driver circuit 4003 which is formed using a single crystal semiconductor film or a polycrystalline semiconductor film over a substrate prepared separately is mounted in a region that is different from the region surrounded by the sealant 4005 over the first substrate 4001. In FIGS. 15B and 15C, various signals and potentials are supplied to the signal line driver circuit 4003 which is separately formed, the scan line driver circuit 4004, and the pixel portion 4002 from an FPC 4018.

Although FIGS. 15B and 15C each illustrate an example in which the signal line driver circuit 4003 is formed separately and mounted on the first substrate 4001, one embodiment of the present invention is not limited to this structure. The scan line driver circuit may be formed separately and then mounted, or only a part of the signal line driver circuit or a part of the scan line driver circuit may be formed separately and then mounted.

Note that there is no particular limitation on the method of connecting a separately formed driver circuit, and a chip on glass (COG) method, a wire bonding method, a tape automated bonding (TAB) method, or the like can be used. FIG. 15A illustrates an example in which the signal line driver circuit 4003 and the scan line driver circuit 4004 are mounted by a COG method. FIG. 15B illustrates an example in which the signal line driver circuit 4003 is mounted by a COG method. FIG. 15C illustrates an example in which the signal line driver circuit 4003 is mounted by a TAB method.

In addition, the display device includes a panel in which the display element is sealed, and a module in which an IC or the like including a controller is mounted on the panel.

Note that a display device in this specification means an image display device, a display unit, or a light source (including a lighting device). Furthermore, the display device also includes, in its category, the following modules: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors, and the transistor described in the above embodiments can be applied thereto.

As the display element provided in the display device, a liquid crystal element (also referred to as liquid crystal display element) or a light-emitting element (also referred to as light-emitting display element) can be used. The light-emitting element includes, in its category, an element whose luminance is controlled by current or voltage and specifically includes, in its category, an inorganic electroluminescent (EL) element, an organic EL element, and the like. Furthermore, a display medium whose contrast is changed by an electric effect, such as electronic ink, can be used.

Further, embodiments of the semiconductor device are described with reference to FIGS. 15A to 15C, FIGS. 16A and 16B, and FIGS. 17A and 17B. FIGS. 17A and 17B correspond to cross-sectional views along dashed-dotted line M-N in FIG. 15B.

As shown in FIGS. 15A to 15C and FIGS. 17A and 17B, the semiconductor device includes a connection terminal electrode 4015 and a terminal electrode 4016. The connection terminal electrode 4015 and the terminal electrode 4016 are electrically connected to a terminal included in any of the FPCs 4018, 4018a, and 4018b through an anisotropic conductive film 4019.

The connection terminal electrode 4015 is formed using the same conductive film as a first electrode layer 4030, and the terminal electrode 4016 is formed using the same metal film and the same conductive film as gate electrode layers of transistors 4010 and 4011.

The pixel portion 4002 and the scan line driver circuit 4004 which are provided over the first substrate 4001 include a plurality of transistors. In FIGS. 15A to 15C and FIGS. 17A and 17B, the transistor 4010 included in the pixel portion 4002 and the transistor 4011 included in the scan line driver circuit 4004 are illustrated as an example. In FIG. 17A, an insulating film 4020 is provided over the transistors 4010 and 4011. In FIG. 17B, an insulating film 4021 is further provided.

In this embodiment, the transistor described in the above embodiments can be applied to a transistor 4010 and the transistor 4011. This embodiment shows an example in which a transistor which has a structure similar to that of the transistor 310 described in Embodiment 1 and is obtained by a manufacturing method similar to that of the transistor 310 is used.

The transistors 4010 and 4011 each of which is formed with a structure and using a manufacturing method which are similar to those of the transistor 310 described in Embodiment 1 have stable electrical characteristics. Therefore, with the use of such a transistor for the semiconductor devices shown in FIGS. 15A to 15C and FIGS. 17A and 17B, highly reliable semiconductor devices can be obtained.

A conductive layer may be further provided over the insulating film to overlap with a channel formation region of the oxide semiconductor film of the transistor 4011 for the driver circuit. By providing the conductive layer to overlap with the channel formation region of the oxide semiconductor film, the amount of change in the threshold voltage of the transistor 4011 by a bias-temperature (BT) stress test can be further reduced. The conductive layer may have the same potential as or a potential different from that of a gate electrode layer of the transistor 4011, and can function as a second gate electrode layer. The potential of the conductive layer may be GND or 0 V, or the conductive layer may be in a floating state.

In addition, the conductive layer functions of blocking an external electric field, that is, preventing an external electric field (particularly, preventing static electricity) from affecting the inside (a circuit portion including a transistor). A blocking function of the conductive layer can prevent fluctuation in the electrical characteristics of the transistor due to an influence of an external electric field such as static electricity.

The transistor 4010 provided in the pixel portion 4002 is electrically connected to a display element to form a display panel. A variety of display elements can be used as the display element as long as display can be performed.

An example of a liquid crystal display device using a liquid crystal element as a display element is illustrated in FIG. 17A. In FIG. 17A, a liquid crystal element 4013 which is a display element includes the first electrode layer 4030, a second electrode layer 4031, and a liquid crystal layer 4008. Insulating films 4032 and 4033 functioning as alignment films are provided so that the liquid crystal layer 4008 is interposed therebetween. The second electrode layer 4031 is provided on the second substrate 4006 side, and the first electrode layer 4030 and the second electrode layer 4031 are stacked with the liquid crystal layer 4008 interposed therebetween.

A columnar spacer 4035 is obtained by selective etching of an insulating film and is provided in order to control the thickness (cell gap) of the liquid crystal layer 4008. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. In this case, the liquid crystal layer 4008 is in contact with the first electrode layer 4030 and the second electrode layer 4031. A blue phase is one of liquid crystal phases, which is generated just before a cholesteric phase changes into an isotropic phase while the temperature of a cholesteric liquid crystal is increased. The blue phase can be exhibited using a liquid crystal composition which is a mixture of a liquid crystal and a chiral agent. In order to increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, productivity of the liquid crystal display device can be improved. A transistor formed using an oxide semiconductor film has a possibility that the electrical characteristics of the transistor may fluctuate significantly by the influence of static electricity and deviate from the designed range. Therefore, it is more effective to use a liquid crystal composition exhibiting a blue phase for the liquid crystal display device including the transistor formed using an oxide semiconductor film.

The specific resistivity of the liquid crystal material is higher than or equal to $1 \times 10^9$ $\Omega \cdot cm$, preferably higher than or equal to $1 \times 10^{11}$ $\Omega \cdot cm$, further preferably higher than or equal to $1 \times 10^{12}$ $\Omega \cdot cm$. Note that the specific resistivity in this specification is measured at 20° C.

The capacitance of a storage capacitor formed in the liquid crystal display device is set considering the leakage current of the transistor provided in the pixel portion or the like so that charge can be held for a predetermined period. The capacitance of the storage capacitor may be set considering the off-state current of the transistor or the like. By using a transistor including an oxide semiconductor film disclosed in this specification, it is enough to provide a storage capacitor having a capacitance that is ⅓ or less, preferably ⅕ or less of liquid crystal capacitance of each pixel.

In the transistor including an oxide semiconductor film, which is disclosed in this specification, the current in an off state (off-state current) can be made small. Accordingly, an electric signal such as an image signal can be held for a longer period, and a writing interval can be set longer in an on state. Accordingly, frequency of refresh operation can be reduced, which leads to an effect of suppressing power consumption.

The transistor including an oxide semiconductor film, which is disclosed in this specification, can have relatively high field-effect mobility and thus can operate at high speed. For example, when such a transistor which can operate at high speed is used for a liquid crystal display device, a switching transistor in a pixel portion and a driver transistor in a driver circuit portion can be formed over one substrate. That is, since a semiconductor device formed using a silicon wafer or the like is not additionally needed as a driver circuit, the number of components of the semiconductor device can be reduced. In addition, by using a transistor which can operate at high speed in a pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that one embodiment of the invention disclosed herein is not limited to the application to a display device for color display; one embodiment of the invention disclosed herein can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Owing to such a mechanism, this light-emitting element is referred to as current-excitation light-emitting element. In this embodiment, an example in which an organic EL element is used as the light-emitting element is described.

Inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is interposed between dielectric layers, which are further interposed between electrodes, and its light emission mechanism is localized type light emission that utilizes inner-shell electron transition of metal ions. Note that an example of an organic EL element is described here as a light-emitting element.

In order to extract light emitted from the light-emitting element, at least one of the pair of electrodes has a light-transmitting property. A transistor and a light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side, and a light-emitting element having any of these emission structures can be used.

Figure 16A:
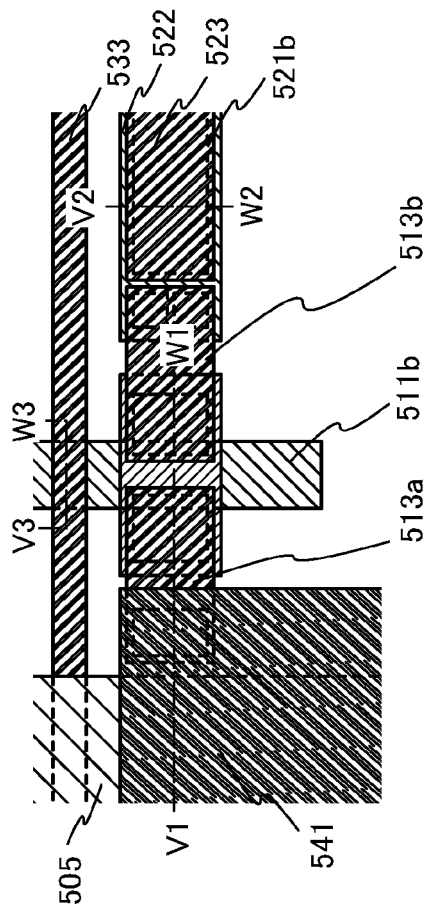
FIGS. 16A and 16B are a plan view and a cross-sectional view which illustrate one embodiment of a semiconductor device.
Figure 16B:
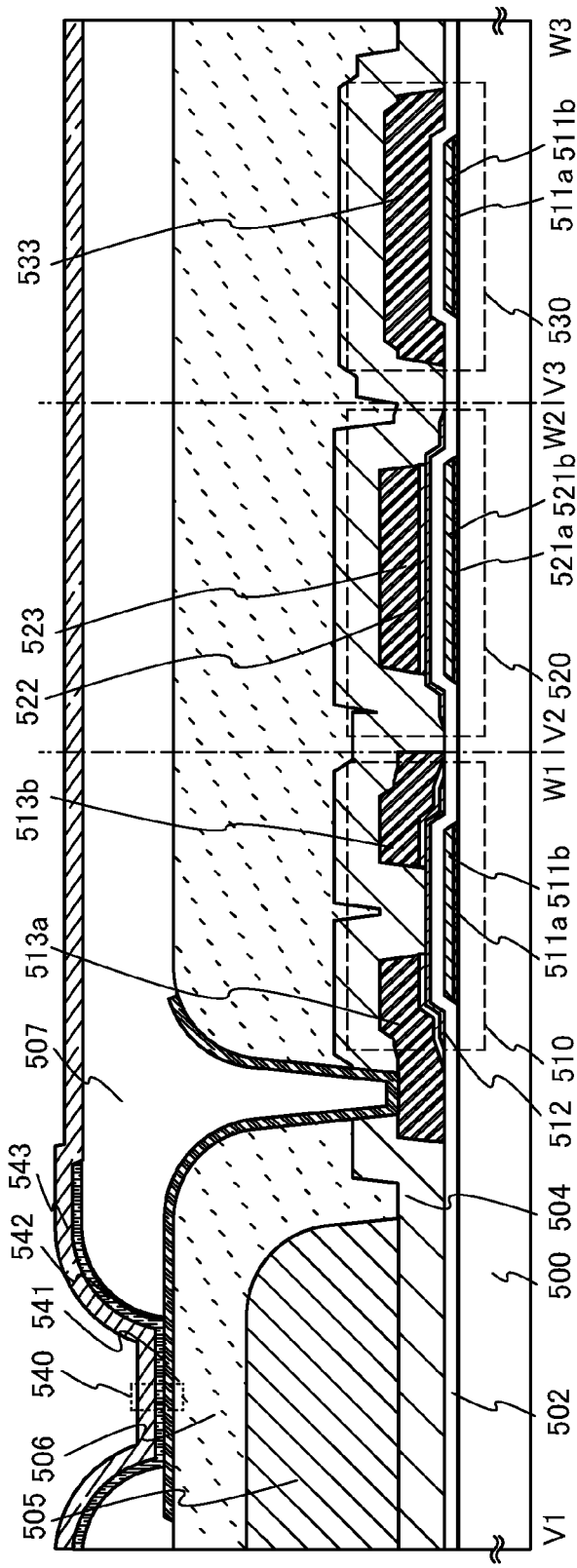

An example of a light-emitting device in which a light-emitting element is used as a display element is illustrated in FIGS. 16A and 16B and FIG. 17B.

FIG. 16A is a plan view of a light-emitting device, and FIG. 16B is a cross-sectional view taken along dashed-dotted lines V1-W1, V2-W2, and V3-W3 in FIG. 16A. Note that an electroluminescent layer 542 and a second electrode layer 543 are not illustrated in the plan view of FIG. 16A.

The light-emitting device shown in FIGS. 16A and 16B includes, over a substrate 500, a transistor 510, a capacitor 520, and a wiring layer intersection 530. The transistor 510 is electrically connected to a light-emitting element 540. Note that FIGS. 16A and 16B illustrate a bottom-emission light-emitting device in which light from the light-emitting element 540 is extracted through the substrate 500.

The transistor described in the above embodiments can be applied to the transistor 510. In this embodiment, as an example, a transistor which has a structure similar to that of the transistor 310 described in Embodiment 1 and is obtained by a manufacturing method similar to that of the transistor 310 is used.

The transistor 510 includes gate electrode layers 511a and 511b, a gate insulating film 502, an oxide semiconductor film 512, and conductive layers 513a and 513b functioning as a source electrode layer and a drain electrode layer.

The transistor 510 formed with a structure and using a manufacturing method which are similar to those of the transistor 310 described in Embodiment 1 has stable electrical characteristics. Therefore, with the use of such a transistor for the semiconductor devices shown in FIGS. 16A and 16B, a highly reliable semiconductor device can be obtained.

The capacitor 520 includes conductive layers 521a and 521b, the gate insulating film 502, an oxide semiconductor film 522, and a conductive layer 523. The gate insulating film 502 and the oxide semiconductor film 522 are sandwiched between the conductive layer 523 and the conductive layers 521a and 521b, so that the capacitor is formed.

The intersection 530 of wiring layers is an intersection of a conductive layer 533 and the gate electrode layers 511a and 511b. The conductive layer 533 and the gate electrode layers 511a and 511b intersect with each other with the gate insulating film 502 provided therebetween.

In this embodiment, a 30-nm-thick titanium film is used as the gate electrode layer 511a and the conductive layer 521a, and a 200-nm-thick copper thin film is used as the gate electrode layer 511b and the conductive layer 521b. Thus, the gate electrode layer is a stack of a titanium film and a copper thin film.

A 25-nm-thick IGZO film is used as the oxide semiconductor films 512 and 522.

An interlayer insulating film 504 is formed over the transistor 510, the capacitor 520, and the intersection 530 of wiring layers. Over the interlayer insulating film 504, a color filter layer 505 is provided in a region overlapping with the light-emitting element 540. An insulating film 506 functioning as a planarization insulating film is provided over the interlayer insulating film 504 and the color filter layer 505.

The light-emitting element 540 having a stacked-layer structure in which a first electrode layer 541, the electroluminescent layer 542, and the second electrode layer 543 are stacked in that order is provided over the insulating film 506. The first electrode layer 541 and the conductive layer 513a are in contact with each other in an opening formed in the insulating film 506 and the interlayer insulating film 504, which reaches the conductive layer 513a; thus the light-emitting element 540 and the transistor 510 are electrically connected to each other. Note that a partition 507 is provided so as to cover a part of the first electrode layer 541 and the opening.

As the interlayer insulating film 504, a silicon oxynitride film having a thickness greater than or equal to 200 nm and less than or equal to 600 nm, which is formed by a plasma CVD method can be used. Further, a photosensitive acrylic film having a thickness of 1500 nm and a photosensitive polyimide film having a thickness of 1500 nm can be used as the insulating film 506 and the partition 507, respectively.

As the color filter layer 505, for example, a chromatic light-transmitting resin can be used. As the chromatic color light-transmitting resin, a photosensitive organic resin or a non-photosensitive organic resin can be used. Use of the photosensitive organic resin layer makes it possible to reduce the number of resist masks; thus, the steps are simplified, which is preferable.

Chromatic colors are all colors except achromatic colors such as black, gray, and white. The color filter layer is formed using a material which transmits only light of the chromatic color. As chromatic color, red, green, blue, or the like can be used. Alternatively, cyan, magenta, yellow, or the like may also be used. "Transmitting only light of a chromatic color" means that light passing through the color filter layer has a peak at a wavelength of the light of the chromatic color. The thickness of the color filter layer may be controlled as appropriate in consideration of the relationship between the concentration of the coloring material to be included and the transmittance of light. For example, the color filter layer 505 may have a thickness greater than or equal to 1500 nm and less than or equal to 2000 nm.

In a light-emitting device shown in FIG. 17B, a light-emitting element 4513 which is a display element is electrically connected to the transistor 4010 provided in the pixel portion 4002. A structure of the light-emitting element 4513 is not limited to the stacked-layer structure including the first electrode layer 4030, an electroluminescent layer 4511, and the second electrode layer 4031, which is shown in FIG. 17B. The structure of the light-emitting element 4513 can be changed as appropriate depending on the direction in which light is extracted from the light-emitting element 4513, or the like.

A partition 4510 and the partition 507 can be formed using an organic insulating material or an inorganic insulating material. It is particularly preferable that the partitions 4510 and 507 be formed using a photosensitive resin material to have an opening over the first electrode layers 4030 and 541 so that a sidewall of the opening is formed as a tilted surface with continuous curvature.

The electroluminescent layers 4511 and 542 may be formed using either a single layer or a plurality of layers stacked.

A protective film may be formed over the second electrode layers 4031 and 543 and the partitions 4510 and 507 in order to prevent entry of oxygen, hydrogen, moisture, carbon dioxide, or the like into the light-emitting elements 4513 and 540. As the protective film, a silicon nitride film, a silicon nitride oxide film, a DLC film, or the like can be formed.

Further, a layer containing an organic compound may be deposited by a deposition method to cover the light-emitting elements 4513 and 540 so that oxygen, hydrogen, moisture, carbon dioxide, and the like do not enter the light-emitting elements 4513 and 540.

In addition, in a space which is formed with the first substrate 4001, the second substrate 4006, and the sealant 4005, a filler 4514 is provided for sealing. In this manner, the light-emitting element 4513 and the like are preferably packaged (sealed) with a protective film (such as a laminate film or an ultraviolet curable resin film) or a cover material with high air-tightness and little degasification so that the light-emitting element 4513 and the like are not exposed to the outside air.

As the filler 4514, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen is used as the filler.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, electronic paper in which electronic ink is driven can be provided as the display device. The electronic paper is also referred to as electrophoretic display device (electrophoretic display) and is advantageous in that it has the same level of readability as plain paper, it has lower power consumption than other display devices, and it can be made thin and lightweight.

An electrophoretic display device can have various modes. An electrophoretic display device contains a plurality of microcapsules dispersed in a solvent or a solute, and each microcapsule contains first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain a pigment and do not move without an electric field. Moreover, the first particles and the second particles have different colors (which may be colorless).

Thus, an electrophoretic display device is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control the orientation of the spherical particles, so that display is performed.

Note that in FIGS. 15A to 15C, FIGS. 16A and 16B, and FIGS. 17A and 17B, a flexible substrate as well as a glass substrate can be used as the first substrates 4001 and 500 and the second substrate 4006. For example, a plastic substrate having a light-transmitting property or the like can be used. As plastic, a fiberglass-reinforced plastics (FRP) plate, a polyvinyl fluoride (PVF) film, a polyester film, or an acrylic resin film can be used. In the case where a light-transmitting property is not needed, a metal substrate (metal film) of aluminum, stainless steel, or the like may be used. For example, a sheet with a structure in which an aluminum foil is interposed between PVF films or polyester films can be used.

In this embodiment, an aluminum oxide film is used as the insulating film 4020. The insulating film 4020 can be formed by a sputtering method or a plasma CVD method.

The aluminum oxide film provided as the insulating film 4020 over the oxide semiconductor film has a high blocking effect and thus is less likely to transmit both oxygen and an impurity such as hydrogen or moisture.

Therefore, during the manufacturing process and after the manufacture, the aluminum oxide film functions as a protective film for preventing entry of an impurity such as hydrogen or moisture, which causes a change, into the oxide semiconductor film and release of oxygen, which is a main constituent material of the oxide semiconductor, from the oxide semiconductor film.

Further, the insulating films 4021 and 506 functioning as a planarization insulating film can be formed using an organic material having heat resistance, such as an acrylic resin, a polyimide resin, a benzocyclobutene resin, a polyamide resin, or an epoxy resin. Other than such organic materials, it is also possible to use a low-dielectric constant material (low-k material), a siloxane-based resin, phosphosilicate glass (PSG), borophosphosilicate glass (BPSG), or the like. Alternatively, the insulating films 4021 and 506 may be formed by stacking a plurality of insulating films formed using any of these materials.

There is no particular limitation on the method of forming the insulating films 4021 and 506, and the following method or tool (equipment) can be used depending on the material: a sputtering method, an SOG method, spin coating, dipping, spray coating, a droplet discharge method (such as an inkjet method), a printing method (such as screen printing or offset printing), a doctor knife, a roll coater, a curtain coater, a knife coater, or the like.

The display device displays an image by transmitting light from a light source or a display element. Therefore, the substrate and the thin films such as the insulating film and the conductive film provided for the pixel portion where light is transmitted have light-transmitting properties with respect to light in the visible light wavelength range.

The first electrode layer and the second electrode layer (each of which may be called pixel electrode layer, common electrode layer, counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layers 4030 and 541 and the second electrode layers 4031 and 543 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (referred to as ITO), indium zinc oxide, indium tin oxide to which silicon oxide is added, or graphene.

The first electrode layers 4030 and 541 and the second electrode layers 4031 and 543 can be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

In this embodiment, since the light-emitting device shown in FIGS. 16A and 16B has a bottom-emission structure, the first electrode layer 541 has a light-transmitting property and the second electrode layer 543 has a light-reflecting property. Accordingly, in the case of using a metal film as the first electrode layer 541, the film is preferably thin enough to secure a light-transmitting property; and in the case of using a light-transmissive conductive film as the second electrode layer 543, a conductive film having a light-reflecting property is preferably stacked therewith.

A conductive composition containing a conductive high molecule (also referred to as conductive polymer) can be used for the first electrode layers 4030 and 541 and the second electrode layers 4031 and 543. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken owing to static electricity or the like, a protection circuit for protecting the driver circuit is preferably provided. The protection circuit is preferably formed using a nonlinear element.

By using the transistor described in any of the above embodiments as described above, the semiconductor device can have a variety of functions.

The structures, methods, and the like described in this embodiment can be combined as appropriate with any of the structures, methods, and the like described in the other embodiments.

(Embodiment 8)

A semiconductor device having an image sensor function of reading information on an object can be formed with the use of the transistor described in any of the above embodiments.

Figure 18A:
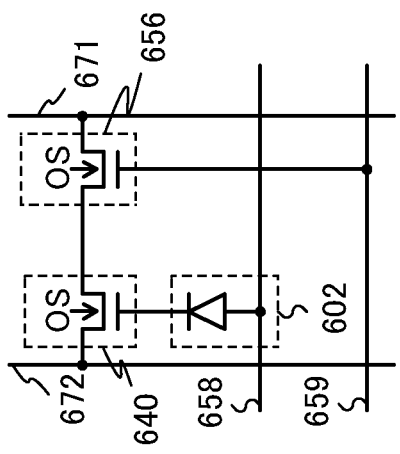
FIGS. 18A and 18B are a circuit diagram and a cross-sectional view which illustrate one embodiment of a semiconductor device.

An example of a semiconductor device having an image sensor function is illustrated in FIG. 18A. FIG. 18A illustrates an equivalent circuit of a photo sensor, and FIG. 18B is a cross-sectional view illustrating a part of the photo sensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photo sensor reference signal line 672, and the other of the source and the drain of the transistor 640 is electrically connected to one of a source and a drain of a transistor 656. A gate of the transistor 656 is electrically connected to a gate signal line 659, and the other of the source and the drain of the transistor 656 is electrically connected to a photo sensor output signal line 671.

Note that in circuit diagrams in this specification, a transistor formed using an oxide semiconductor film is denoted by a symbol "OS" so that it can be identified as a transistor formed using an oxide semiconductor film. In FIG. 18A, the transistor 640 and the transistor 656 are each a transistor formed using an oxide semiconductor film, to which the transistor described in Embodiment 1 or Embodiment 2 can be applied. In this embodiment, as an example, a transistor which has a structure similar to that of the transistor 310 described in Embodiment 1 and is obtained by a manufacturing method similar to that of the transistor 310 is used.

Figure 18B:
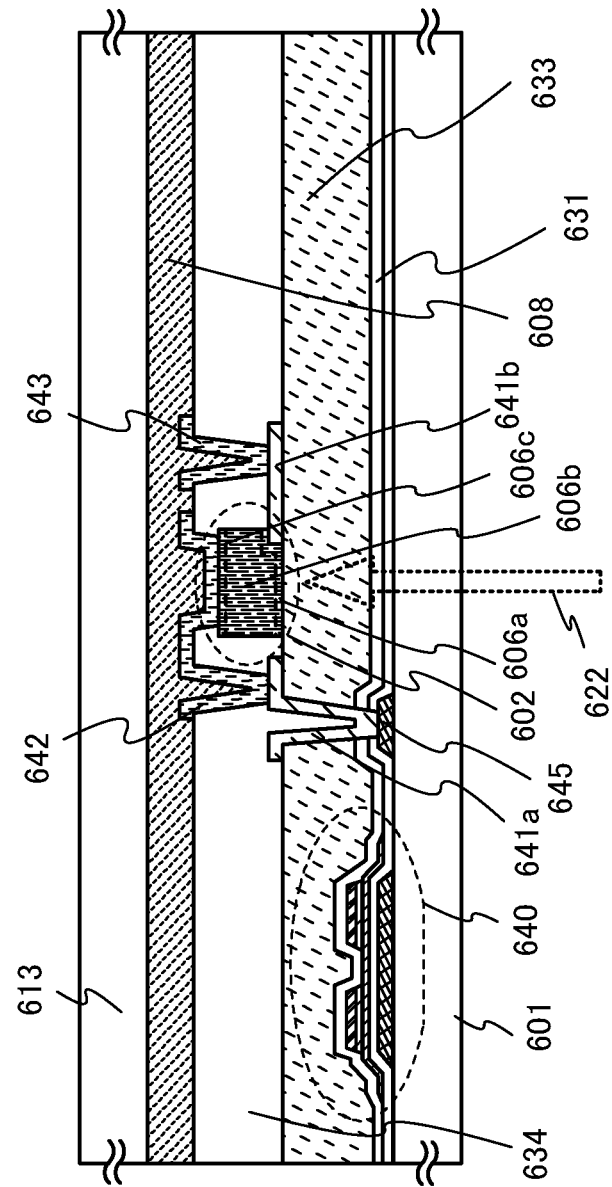

FIG. 18B is a cross-sectional view of the photodiode 602 and the transistor 640 in the photo sensor. The photodiode 602 functioning as a sensor and the transistor 640 are provided over a substrate 601 (TFT substrate) having an insulating surface. A substrate 613 is provided over the photodiode 602 and the transistor 640 with the use of an adhesive layer 608.

An insulating film 631, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are sequentially stacked from the interlayer insulating film 633 side, between an electrode layer 642 formed over the interlayer insulating film 634 and each of electrode layers 641a and 641b formed over the interlayer insulating film 633.

The electrode layer 641b is electrically connected to a conductive layer 643 formed over the interlayer insulating film 634, and the electrode layer 642 is electrically connected to a conductive layer 645 through the electrode layer 641a. The conductive layer 645 is electrically connected to a gate electrode layer of the transistor 640, and the photodiode 602 is electrically connected to the transistor 640.

Here, a pin photodiode in which a semiconductor film having p-type conductivity type as the first semiconductor film 606a, a high-resistance semiconductor film (i-type semiconductor film) as the second semiconductor film 606b, and a semiconductor film having n-type conductivity type as the third semiconductor film 606c are stacked is illustrated as an example.

The first semiconductor film 606a is a p-type semiconductor film and can be formed using an amorphous silicon film containing an impurity element imparting p-type conductivity type. The first semiconductor film 606a is formed by a plasma CVD method with the use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The first semiconductor film 606a is preferably formed to a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to a thickness greater than or equal to 200 nm and less than or equal to 1000 nm.

The third semiconductor film 606c is an n-type semiconductor film and is formed using an amorphous silicon film containing an impurity element imparting n-type conductivity type. The third semiconductor film 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The third semiconductor film 606c is preferably formed to a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

In addition, the mobility of holes generated by a photoelectric effect is lower than the mobility of electrons. Therefore, a pin photodiode has better characteristics when a surface on the p-type semiconductor film side is used as a light-receiving plane. Here, an example in which light 622 received by the photodiode 602 from a surface of the substrate 601, over which the pin photodiode is formed, is converted into electric signals is described. Further, light from the semiconductor film having a conductivity type opposite to that of the semiconductor film on the light-receiving plane is disturbance light; therefore, the electrode layer is preferably formed using a light-blocking conductive film. Note that a surface on the n-type semiconductor film side can alternatively be used as the light-receiving plane.

With the use of an insulating material, the insulating film 631, the interlayer insulating film 633, and the interlayer insulating film 634 can be formed, depending on the material, using a method such as a sputtering method, a plasma CVD method, an SOG method, spin coating, dipping, spray coating, a droplet discharge method (such as an inkjet method), or a printing method (such as screen printing or offset printing).

The insulating film 631 can be formed using an inorganic insulating material and can have a single-layer structure or a stacked-layer structure including any of oxide insulating films such as a silicon oxide layer, a silicon oxynitride layer, an aluminum oxide layer, and an aluminum oxynitride layer; and nitride insulating films such as a silicon nitride layer, a silicon nitride oxide layer, an aluminum nitride layer, and an aluminum nitride oxide layer.

In this embodiment, an aluminum oxide film is used as the insulating film 631. The insulating film 631 can be formed by a sputtering method or a plasma CVD method.

The aluminum oxide film provided as the insulating film 631 over the oxide semiconductor film has a high blocking effect and thus is less likely to transmit both oxygen and an impurity such as hydrogen or moisture.

Therefore, during the manufacturing process and after the manufacture, the aluminum oxide film functions as a protective film for preventing entry of an impurity such as hydrogen or moisture, which causes a change, into the oxide semiconductor film and release of oxygen, which is a main constituent material of the oxide semiconductor, from the oxide semiconductor film.

For a reduction in surface roughness, an insulating film functioning as a planarization insulating film is preferably used as each of the interlayer insulating films 633 and 634. For the interlayer insulating films 633 and 634, for example, an organic insulating material having heat resistance such as a polyimide resin, an acrylic resin, a benzocyclobutene resin, a polyamide resin, or an epoxy resin can be used. Other than such organic insulating materials, it is possible to use a single layer or stacked layers of a low-dielectric constant material (low-k material), a siloxane-based resin, phosphosilicate glass (PSG), borophosphosilicate glass (BPSG), or the like.

With detection of light 622 that enters the photodiode 602, information on an object to be detected can be read. Note that a light source such as a backlight can be used at the time of reading information on the object to be detected.

The transistor 640 is formed with a structure and using a manufacturing method which are similar to those of the transistor 310 described in Embodiment 1 has stable electrical characteristics. Therefore, with the use of such a transistor for the semiconductor device shown in FIGS. 18A and 18B, a highly reliable semiconductor device can be obtained.

The structures, methods, and the like described in this embodiment can be combined as appropriate with any of the structures, methods, and the like described in the other embodiments.

(Embodiment 9)

A semiconductor device disclosed in this specification can be applied to a variety of electronic devices (including an amusement machine). Examples of electronic devices are a television set (also referred to as a television or a television receiver), a monitor of a computer or the like, a camera such as a digital camera or a digital video camera, a digital photo frame, a mobile phone handset, a portable game machine, a portable information terminal, an audio reproducing device, a game machine (e.g., a pachinko machine or a slot machine), a game console, and the like. Specific examples of these electronic devices are illustrated in FIGS. 19A to 19C.

Figure 19A:
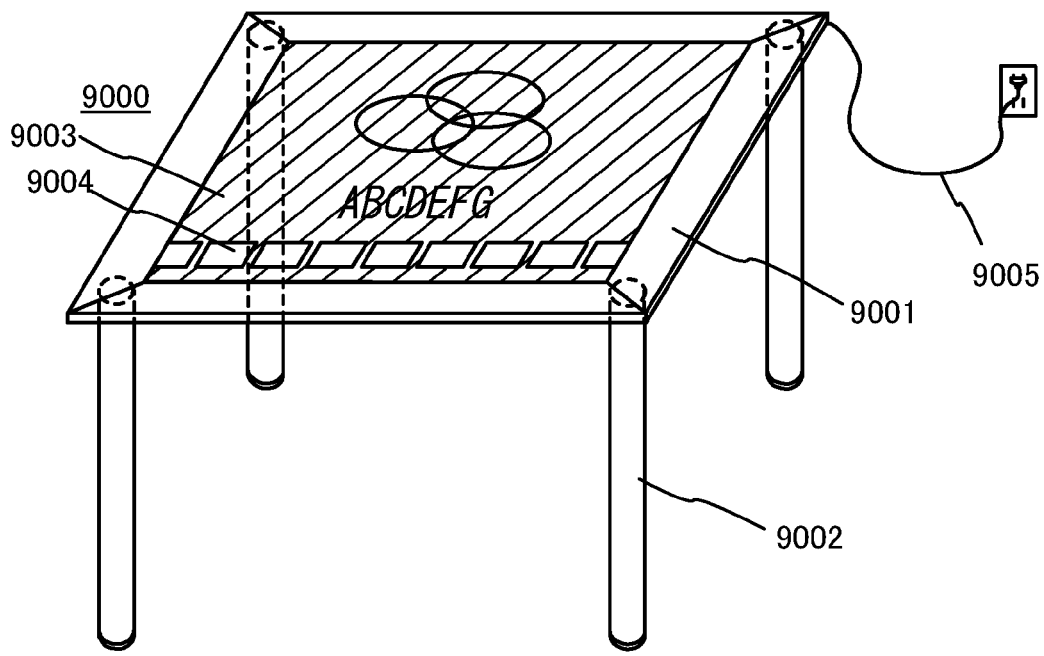
FIGS. 19A to 19C illustrate electronic devices.
Figure 19B:
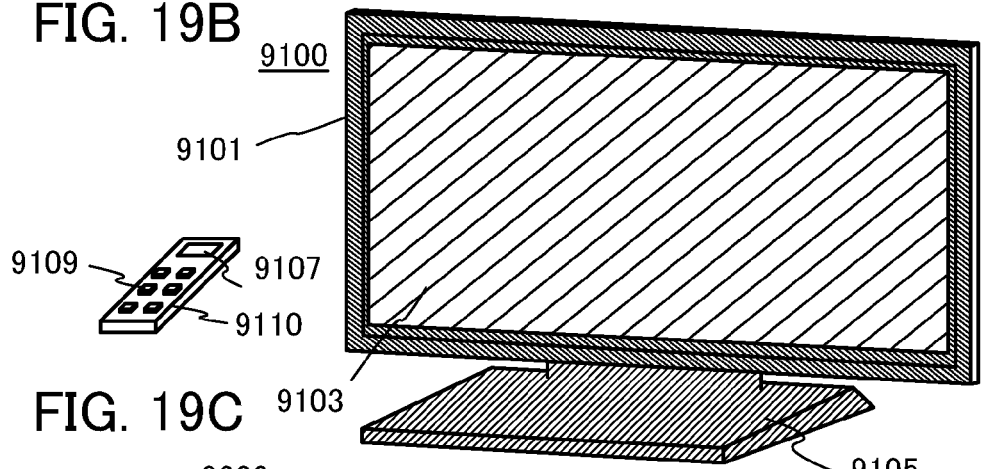
Figure 19C:
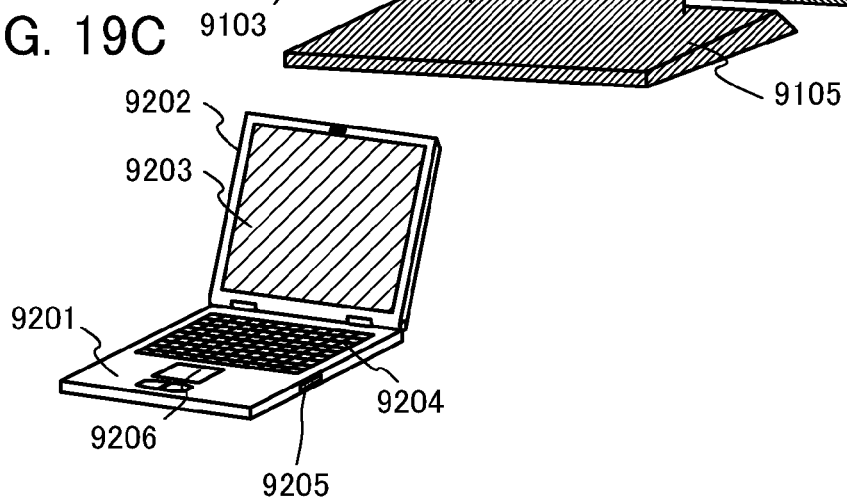

FIG. 19A illustrates a table 9000 having a display portion. In the table 9000, a display portion 9003 is incorporated in a housing 9001 and an image can be displayed on the display portion 9003. Note that the housing 9001 is supported by four leg portions 9002. Further, the housing 9001 is provided with a power cord 9005 for supplying power.

The semiconductor device described in any of the above embodiments can be used in the display portion 9003 so that the electronic device can have high reliability.

The display portion 9003 has a touch-input function. When a user touches displayed buttons 9004 which are displayed on the display portion 9003 of the table 9000 with his/her finger or the like, the user can carry out operation of the screen and input of information. Further, the table 9000 may be made to communicate with home appliances or control the home appliances, so that the table 9000 can function as a control device which controls the home appliances by operation on the screen. For example, with use of the semiconductor device having an image sensing function described in Embodiment 8, the display portion 9003 can have a touch input function.

Further, it is possible to stand the screen of the display portion 9003 so as to be perpendicular to a floor by using a hinge on the housing 9001; thus, the table 9000 can also be used as a television set. When a television set having a large screen is set in a small room, an open space is reduced; however, when a display portion is incorporated in a table, a space in the room can be efficiently used.

FIG. 19B illustrates a television set 9100. In the television set 9100, a display portion 9103 is incorporated in a housing 9101 and an image can be displayed on the display portion 9103. Note that the housing 9101 is supported by a stand 9105 here.

The television set 9100 can be operated with an operation switch of the housing 9101 or a separate remote controller 9110. Channels and volume can be controlled with operation keys 9109 of the remote controller 9110 so that an image displayed on the display portion 9103 can be controlled. Further, the remote controller 9110 may be provided with a display portion 9107 for displaying data output from the remote controller 9110.

The television set 9100 shown in FIG. 19B is provided with a receiver, a modem, and the like. With the receiver, the television set 9100 can receive a general television broadcast. Further, when the television set 9100 is connected to a communication network with or without wires via the modem, one-way (from a transmitter to a receiver) or two-way (between a transmitter and a receiver or between receivers) data communication can be performed.

The semiconductor device described in any of the above embodiments can be used in the display portions 9103 and 9107 so that the television set and the remote controller can have high reliability.

FIG. 19C illustrates a computer which includes a main body 9201, a housing 9202, a display portion 9203, a keyboard 9204, an external connection port 9205, a pointing device 9206, and the like.

The semiconductor device described in any of the above embodiments can be used in the display portion 9203, in which case, the computer can have high reliability.

Figure 20A:
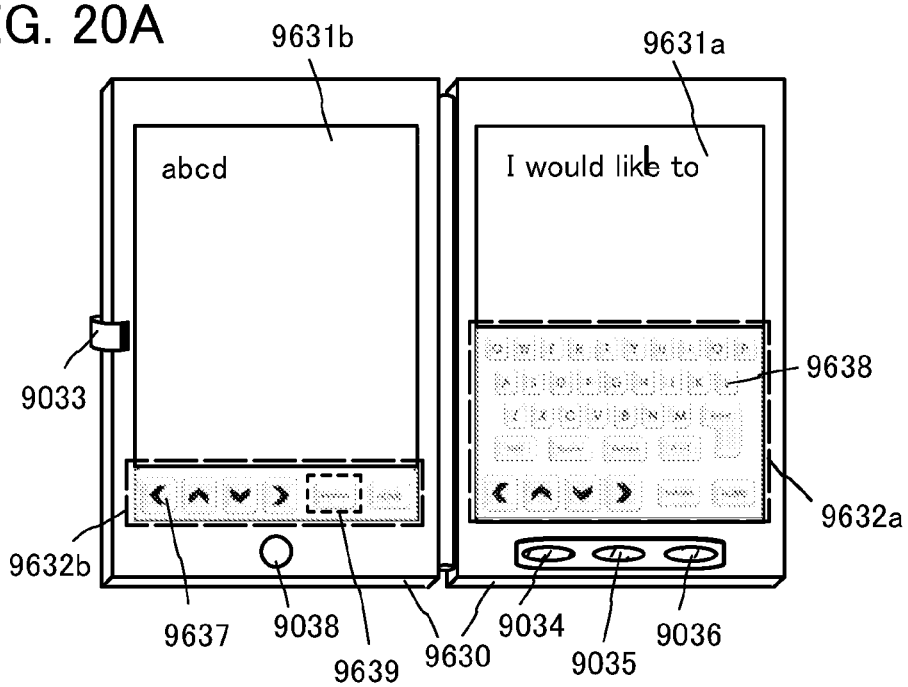
FIGS. 20A to 20C illustrate an electronic device.
Figure 20B:
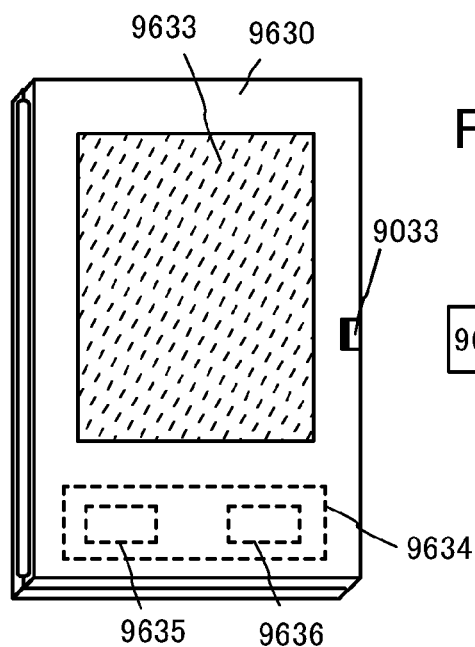

FIGS. 20A and 20B illustrate a tablet terminal that can be folded. In FIG. 20A, the tablet terminal is opened, and includes a housing 9630, a display portion 9631*a*, a display portion 9631*b*, a display-mode switching button 9034, a power button 9035, a power-saving-mode switching button 9036, a clip 9033, and an operation button 9038.

The semiconductor device described in any of the above embodiments can be used in the display portion 9631*a* and the display portion 9631*b*, in which case the tablet terminal can have high reliability.

A touch panel area 9632*a* can be provided in a part of the display portion 9631*a*, in which area, data can be input by touching displayed operation keys 9638. In FIG. 20A, a half of the display portion 9631*a* has only a display function and the other half has a touch panel function. However, one embodiment of the present invention is not limited to this structure, and the whole display portion 9631*a* may have a touch panel function. For example, the display portion 9631*a* can display a keyboard in the whole region to be used as a touch panel, and the display portion 9631*b* can be used as a display screen.

A touch panel area 9632*b* can be provided in a part of the display portion 9631*b* like in the display portion 9631*a*. By touching a keyboard display switching button 9639 displayed on the touch panel with a finger, a stylus, or the like, a keyboard can be displayed on the display portion 9631*b*.

Touch input can be performed concurrently on the touch panel area 9632*a* and the touch panel area 9632*b*.

The display-mode switching button 9034 allows switching between a landscape mode and a portrait mode, color display and black-and-white display, and the like. The power-saving-mode switching button 9036 allows optimizing the display luminance in accordance with the amount of external light in use which is detected by an optical sensor incorporated in the tablet terminal. In addition to the optical sensor, another detecting device such as a sensor for detecting inclination, like a gyroscope or an acceleration sensor, may be incorporated in the tablet terminal.

Although the display portion 9631*a* and the display portion 9631*b* have the same display area in FIG. 20A, one embodiment of the present invention is not limited to this example. The display portion 9631*a* and the display portion 9631*b* may have different areas or different display quality. For example, higher definition images may be displayed on one of the display portions 9631*a* and 9631*b*.

FIG. 20B illustrates the tablet terminal folded, which includes the housing 9630, a solar battery 9633, a charge and discharge control circuit 9634, a battery 9635, and a DC/DC converter 9636. Note that FIG. 20B shows an example in which the charge and discharge control circuit 9634 includes the battery 9635 and the DC/DC converter 9636.

Since the tablet terminal can be folded, the housing 9630 can be closed when not in use. Thus, the display portions 9631*a* and 9631*b* can be protected, which makes it possible to provide a tablet terminal with high durability and improved reliability for long-term use.

The tablet terminal shown in FIGS. 20A and 20B can have other functions such as a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar battery 9633, which is attached on the surface of the tablet terminal, supplies electric power to a touch panel, a display portion, an image signal processor, and the like. Note that the solar battery 9633 can be provided on one or both surfaces of the housing 9630, so that the battery 9635 can be charged efficiently. The use of a lithium ion battery as the battery 9635 is advantageous in downsizing or the like.

Figure 20C:
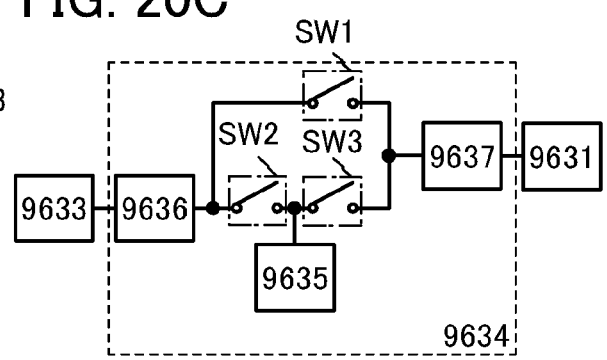

The structure and operation of the charge and discharge control circuit 9634 shown in FIG. 20B are described with reference to a block diagram of FIG. 20C. FIG. 20C illustrates the solar battery 9633, the battery 9635, the DC/DC converter 9636, a converter 9637, switches SW1 to SW3, and the display portion 9631. The battery 9635, the DC/DC converter 9636, the converter 9637, and the switches SW1 to SW3 correspond to the charge and discharge control circuit 9634 in FIG. 20B.

First, description is given of an example of the operation in the case where power is generated by the solar battery 9633 using external light. The voltage of power generated by the solar battery 9633 is raised or lowered by the DC/DC converter 9636 so that a voltage for charging the battery 9635 is obtained. When the power from the solar battery 9633 is used for the operation of the display portion 9631, the switch SW1 is turned on and the voltage of the power is raised or lowered by the converter 9637 to a voltage needed for operating the display portion 9631. When display is not performed on the display portion 9631, the switch SW1 is turned off and the switch SW2 is turned on so that the battery 9635 can be charged.

Although the solar battery 9633 is shown as an example of a charge means, there is no particular limitation on the charge means and the battery 9635 may be charged with another means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

The structures, methods, and the like described in this embodiment can be combined as appropriate with any of the structures, methods, and the like described in the other embodiments.

This application is based on Japanese Patent Application serial no. 2012-014594 filed with Japan Patent Office on Jan. 26, 2012, and Japanese Patent Application serial no. 2012-014609 filed with Japan Patent Office on Jan. 26, 2012, the entire contents of which are hereby incorporated by reference.

What is claimed is:

1. A method for manufacturing a semiconductor device, comprising steps of:
    forming a gate insulating film over a gate electrode;
    forming an oxide semiconductor film over the gate insulating film, the oxide semiconductor film comprising indium, gallium, and zinc;
    forming a conductive film over the oxide semiconductor film so that crystallinity of a first region of the oxide semiconductor film in contact with the conductive film is lowered, wherein the crystallinity of the first region is lower than crystallinity of a second region of the oxide semiconductor film, and wherein the second region is other than the first region and includes a channel region;
    processing the conductive film to form a source electrode and a drain electrode so that a part of the first region is exposed by performing a first treatment;
    removing part of the oxide semiconductor film so that the part of the first region is removed by performing a second treatment which is different from the first treatment; and
    forming an insulating film over the oxide semiconductor film, the source electrode, and the drain electrode after removing the part of the first region, wherein the insulating film is in contact with the oxide semiconductor film at least between the source electrode and the drain electrode,
    wherein the first treatment is performed using a mask,
    wherein the second treatment is performed after removing the mask, and
    wherein an atomic percentage of gallium is greater than or equal to an atomic percentage of indium in the second region.

2. The method according to claim 1, wherein the first region is amorphous.

3. The method according to claim 1, wherein, in the oxide semiconductor film, a proportion of a crystal part to an amorphous part in the first region is lower than a proportion of a crystal part to an amorphous part in the second region.

4. The method according to claim 1,
    wherein the oxide semiconductor film includes a third region, a fourth region, and a fifth region,
    wherein the third region overlaps with the source electrode,
    wherein the fourth region overlaps with the drain electrode,
    wherein the fifth region overlaps with neither the source electrode nor the drain electrode, and
    wherein a thickness of the third region and a thickness of the fourth region are larger than a thickness of the fifth region.

5. The method according to claim 4,
    wherein the fifth region is positioned between the third region and the fourth region in a channel length direction, and
    wherein each of the third region and the fourth region is positioned between parts of the fifth region in a channel width direction.

6. The method according to claim 1, further comprising a step of:
    performing heat treatment to the oxide semiconductor film.

7. The method according to claim 1, wherein the insulating film is in direct contact with the oxide semiconductor film at least between the source electrode and the drain electrode.

8. The method according to claim 1,
    wherein the second treatment is a solution treatment using dilute hydrofluoric acid.

9. The method according to claim 1, wherein the conductive film is formed so that the first region is in direct contact with the conductive film.

10. A method for manufacturing a semiconductor device, comprising steps of:
    forming a gate insulating film over a gate electrode;
    forming an oxide semiconductor film over the gate insulating film, the oxide semiconductor film comprising indium, gallium, and zinc;
    introducing an element to a surface of the oxide semiconductor film by ion implantation method, ion doping method or plasma treatment so that crystallinity of a first region of the oxide semiconductor film including the surface of the oxide semiconductor film is lowered, wherein the crystallinity of the first region is lower than crystallinity of a second region of the oxide semiconductor film, and wherein the second region is other than the first region and includes a channel region;
    forming a source electrode and a drain electrode so that a part of the first region is exposed by performing a first treatment;

removing part of the oxide semiconductor film so that the part of the first region is removed by performing a second treatment which is different from the first treatment; and forming an insulating film over the oxide semiconductor film, the source electrode, and the drain electrode after removing the part of the first region, wherein the insulating film is in contact with the oxide semiconductor film at least between the source electrode and the drain electrode, wherein an atomic percentage of gallium is greater than or equal to an atomic percentage of indium in the second region.

11. The method according to claim 10, wherein the element is at least one selected from the group consisting of elements of Group 15,elements of Group 13 in the periodic table, and rare gas elements.

12. The method according to claim 10, wherein the first region is amorphous.

13. The method according to claim 10, wherein, in the oxide semiconductor film, a proportion of a crystal part to an amorphous part in the first region is lower than a proportion of a crystal part to an amorphous part in the second region.

14. The method according to claim 10,
wherein the oxide semiconductor film includes a third region, a fourth region, and a fifth region,
wherein the third region overlaps with the source electrode,
wherein the fourth region overlaps with the drain electrode,
wherein the fifth region overlaps with neither the source electrode nor the drain electrode, and
wherein a thickness of the third region and a thickness of the fourth region are larger than a thickness of the fifth region.

15. The method according to claim 14,
wherein the fifth region is positioned between the third region and the fourth region in a channel length direction, and
wherein each of the third region and the fourth region is positioned between parts of the fifth region in a channel width direction.

16. The method according to claim 10, further comprising a step of:
performing heat treatment to the oxide semiconductor film.

17. The method according to claim 10, wherein the insulating film is in direct contact with the oxide semiconductor film at least between the source electrode and the drain electrode.

18. The method according to claim 10,
wherein the first treatment is performed using a mask,
wherein the second treatment is performed after removing the mask, and
wherein the second treatment is a solution treatment using dilute hydrofluoric acid.

19. A method for manufacturing a semiconductor device, comprising steps of:

forming an oxide semiconductor film;
forming a conductive film over the oxide semiconductor film so that crystallinity of a first region of the oxide semiconductor film in contact with the conductive film is lowered, wherein the crystallinity of the first region is lower than crystallinity of a second region of the oxide semiconductor film, and wherein the second region is other than the first region and includes a channel region;
processing the conductive film to form a source electrode and a drain electrode so that a part of the first region is exposed by performing a first treatment; and
removing part of the oxide semiconductor film so that the part of the first region is removed by performing a second treatment which is different from the first treatment,
wherein the first treatment is performed using a mask, and
wherein the second treatment is performed after removing the mask.

20. The method according to claim 19, wherein the first region is amorphous.

21. The method according to claim 19, wherein, in the oxide semiconductor film, a proportion of a crystal part to an amorphous part in the first region is lower than a proportion of a crystal part to an amorphous part in the second region.

22. The method according to claim 19,
wherein the oxide semiconductor film includes a third region, a fourth region, and a fifth region,
wherein the third region overlaps with the source electrode,
wherein the fourth region overlaps with the drain electrode,
wherein the fifth region overlaps with neither the source electrode nor the drain electrode, and
wherein a thickness of the third region and a thickness of the fourth region are larger than a thickness of the fifth region.

23. The method according to claim 22,
wherein the fifth region is positioned between the third region and the fourth region in a channel length direction, and
wherein each of the third region and the fourth region is positioned between parts of the fifth region in a channel width direction.

24. The method according to claim 19, further comprising a step of:
performing heat treatment to the oxide semiconductor film.

25. The method according to claim 19, further comprising steps of:
forming a gate insulating film over a gate electrode and under the oxide semiconductor film; and
forming an insulating film over the oxide semiconductor film, the source electrode, and the drain electrode after removing the part of the first region, wherein the insulating film is in contact with the oxide semiconductor film at least between the source electrode and the drain electrode.

* * * * *